US012784650B2

(12) United States Patent
Bok et al.

(10) Patent No.: US 12,784,650 B2
(45) Date of Patent: Nov. 3, 2026

(54) DISPLAY DEVICE AND TILED DISPLAY DEVICE

(71) Applicant: Samsung Display Co., LTD., Yongin-si (KR)

(72) Inventors: Seung Lyong Bok, Hwaseong-si (KR); Hyun Joon Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 945 days.

(21) Appl. No.: 18/060,862

(22) Filed: Dec. 1, 2022

(65) Prior Publication Data

US 2023/0238496 A1 Jul. 27, 2023

(30) Foreign Application Priority Data

Jan. 21, 2022 (KR) ........................ 10-2022-0009316
Mar. 22, 2022 (KR) ........................ 10-2022-0035284

(51) Int. Cl.
*G09G 3/32* (2016.01)
*G09F 9/302* (2006.01)
(Continued)

(52) U.S. Cl.
CPC ............ *G09G 3/32* (2013.01); *G09F 9/3026* (2013.01); *G09G 3/2085* (2013.01);
(Continued)

(58) Field of Classification Search
CPC .. G09G 3/32; G09G 3/2085; G09G 2300/026; G09G 2300/0426;
(Continued)

(56) References Cited

U.S. PATENT DOCUMENTS 8,598,582 B2 12/2013 Choi et al.
10,825,380 B2 11/2020 Kim et al.
(Continued)

FOREIGN PATENT DOCUMENTS

CN 1991537 A 7/2007
KR 10-2021-0012391 2/2021
KR 10-2276372 B1 7/2021

OTHER PUBLICATIONS

Office Action for TW Application No. 112102036, dated Apr. 30, 2026, 10 pages.

*Primary Examiner* — Adam R. Giesy
(74) *Attorney, Agent, or Firm* — Womble Bond Dickinson (US) LLP

(57) ABSTRACT

A display device including a wiring area including a plurality of scan lines extending in a first direction and a plurality of data lines extending in a second direction crossing the first direction, a transmissive area surrounded by the wiring area and configured to transmit light, a plurality of pixel drivers respectively connected to one of the plurality scan lines and one of the plurality of data lines, a first pad electrode and a second pad electrode overlapping a first pixel driver from among the plurality of pixel drivers, a light emitting element on the first pad electrode and the second pad electrode, a first supplement electrode overlapping the first pad electrode, and a second supplement electrode overlapping the second pad electrode.

25 Claims, 30 Drawing Sheets

(51) Int. Cl.
*G09G 3/20* (2006.01)
*H10H 20/857* (2025.01)
*H10W 90/00* (2026.01)

(52) U.S. Cl.
CPC .......... *H10H 20/857* (2025.01); *H10W 90/00* (2026.01); *G09G 2300/026* (2013.01); *G09G 2300/0426* (2013.01)

(58) Field of Classification Search
CPC .............. G09F 9/3026; H10H 20/0364; H10H 20/857; H01L 25/0753; H01L 25/167
See application file for complete search history.

(56) References Cited

U.S. PATENT DOCUMENTS

| | | | | |
|---|---|---|---|---|
| 11,328,629 | B2 | 5/2022 | Lee et al. | |
| 2019/0319079 | A1* | 10/2019 | Xing | H10K 59/351 |
| 2020/0020747 | A1 | 1/2020 | Bok et al. | |
| 2021/0050336 | A1 | 2/2021 | Koo et al. | |
| 2021/0193754 | A1 | 6/2021 | Han et al. | |
| 2021/0257525 | A1 | 8/2021 | Ryu et al. | |
| 2021/0319727 | A1* | 10/2021 | Kim | G09F 9/3026 |
| 2021/0375197 | A1 | 12/2021 | Dai et al. | |
| 2021/0384179 | A1 | 12/2021 | Bok et al. | |
| 2023/0033385 | A1* | 2/2023 | Park | G06F 3/0443 |

* cited by examiner

T16: T161, 162

DISPLAY DEVICE AND TILED DISPLAY DEVICE

CROSS-REFERENCE TO RELATED APPLICATIONS

This application claims priority to and the benefit of Korean Patent Application No. 10-2022-0009316 filed on Jan. 21, 2022 and Korean Patent Application No. 10-2022-0035284 filed on Mar. 22, 2022 in the Korean Intellectual Property Office (KIPO), the entire contents of both of which are incorporated by reference herein.

BACKGROUND

1. Field

The present disclosure relates to a display device and a tiled display device.

2. Description of the Related Art

With the advance of information-oriented society, more and more demands are placed on display devices for displaying images in various ways. The display device may be a flat panel display device such as a liquid crystal display, a field emission display and a light emitting display.

Recently, research on a transparent display device that allows a user to see an object or a background located on the rear surface of the display device has been actively conducted due to its characteristics. The transparent display device may have advantages of space utilization, interior design, and design, and may have various application fields. The transparent display device may solve the spatial and visual constraints of existing electronic devices by implementing the functions of information recognition, information processing, and information display as a transparent electronic device. For example, the transparent display device may be implemented as a smart window that is applied to a window of a building or a vehicle to view a background or display an image.

SUMMARY

Aspects and features of embodiments of the present disclosure provide a display device capable of viewing a background or an object on the rear surface through a plurality of transmission areas when an image is not displayed on the display device by including a plurality of transmission areas that transmit incident light as it is.

Aspects and features of embodiments of the present disclosure provide a tiled display device capable of viewing a background or an object on the rear surface through a plurality of transmission areas when an image is not displayed on the display device by including a plurality of transmission areas that transmit incident light as it is.

However, embodiments of the present disclosure are not limited to those set forth herein. The above and other embodiments of the present disclosure will become more apparent to one of ordinary skill in the art to which the present disclosure pertains by referencing the detailed description of the present disclosure given below.

According to one or more embodiments of the present disclosure, there is provided a display device including a wiring area at which a plurality of scan lines extending in a first direction and a plurality of data lines extending in a second direction crossing the first direction are located, a transmissive area surrounded by the wiring area and configured to transmit light, a plurality of pixel drivers respectively connected to one of the plurality scan lines and one of the plurality of data lines, a first pad electrode and a second pad electrode overlapping a first pixel driver from among the plurality of pixel drivers, a light emitting element on the first pad electrode and the second pad electrode, a first supplement electrode overlapping the first pad electrode, and a second supplement electrode overlapping the second pad electrode.

Each of the first supplement electrode and the second supplement electrode may be electrically floated.

The display device may further include an insulating layer located between the first pad electrode and the first supplement electrode and between the second pad electrode and the second supplement electrode.

The first supplement electrode may contact the first pad electrode, and the second supplement electrode may contact the second pad electrode.

A thickness of the first supplement electrode may be greater than a thickness of the first pad electrode, and a thickness of the second supplement electrode may be greater than a thickness of the second pad electrode.

The display device may further include a touch electrode in the transmission area and configured to transmit the light.

The display device may further include a first contact electrode between the first pad electrode and a first electrode of the light emitting element, and a second contact electrode between the second pad electrode and a second electrode of the light emitting element. The touch electrode may include a same material as that of the first and second contact electrodes.

A first power supply line configured to receive a first power voltage may overlap the plurality of pixel drivers and the wiring area.

A second power supply line configured to receive a second power voltage different from the first power voltage may overlap the plurality of pixel drivers and the wiring area.

The first power supply line and the second power supply line may surround the light transmissive area.

The display device may further include third power supply lines extending in the second direction configured to receive a third power voltage, and a power bridge connecting a third power supply line overlapping the first pixel driver from among the third power supply lines and a third power supply line overlapping a second pixel driver of the plurality of pixel drivers from among the third power supply lines.

The power bridge may overlap a first data line connected to the first pixel driver or a second data line connected to the second pixel driver from among the plurality of data lines.

The light emitting element may be a flip chip type micro light emitting diode element.

According to one or more embodiments of the present disclosure, there is provided a display device including a wiring area at which a plurality of scan lines extending in a first direction and a plurality of data lines extending in a second direction crossing the first direction are located, a transmissive area surrounded by the wiring area and configured to transmit light, a plurality of pixel drivers respectively connected to one of the plurality of scan lines and one of the plurality of data lines, a first pad electrode and a second pad electrode connected to a pixel driver of the plurality of pixel drivers, a light emitting element on the first pad electrode and the second pad electrode, and a touch electrode in the transmission area and configured to transmit the light.

The display device may further include a first contact electrode between the first pad electrode and the first electrode of the light emitting element, and a second contact electrode between the second pad electrode and the second electrode of the light emitting element. The touch electrode may include a same material as that of the first and second contact electrodes.

The display device may further include a touch line in the wiring area and electrically connected to the touch electrode.

The display device may further include a touch connection electrode connected to the touch line through a first touch contact hole penetrating at least one first insulating layer on the touch line. The touch electrode may be connected to the touch connection electrode through a second touch contact hole penetrating at least one second insulating layer on the touch connection electrode.

The first pad electrode and the second pad electrode may overlap the pixel driver.

The display device may further include a first supplement electrode overlapping the first pad electrode, and a second supplement electrode overlapping the second pad electrode.

A thickness of the first supplement electrode may be greater than a thickness of the first pad electrode, and a thickness of the second supplement electrode may be greater than a thickness of the second pad electrode.

Each of the first supplement electrode and the second supplement electrode may be electrically floated.

The light emitting element may be a flip chip type micro light emitting diode element.

According to one or more embodiments of the present disclosure, there is provided a display device including a plurality of display device, and a connection member located between the plurality of display devices. A display device from among the plurality of display devices includes: a wiring area at which scan lines extending in a first direction and data lines extending in a second direction crossing the first direction are located, a transmissive area surrounded by the wiring area and configured to transmit light, a pixel driver connected to one of the scan lines and one of the data lines, a first pad electrode and a second pad electrode overlapping the pixel driver, a light emitting element on the first pad electrode and the second pad electrode, a first supplement electrode overlapping the first pad electrode, and a second supplement electrode overlapping the second pad electrode.

The light emitting element may be a flip chip type micro light emitting diode element.

The display device may further include a substrate, a pad on a first surface of the substrate, and a side line on the first surface of the substrate, a second surface opposite to the first surface, and one side between the first surface and the second surface, and connected to the pad.

The substrate may include glass.

The display device may further include a connection line on the second surface of the substrate, and a flexible film connected to the connection line through a conductive adhesive member. The side line may be connected to the connection line.

The plurality of display devices may be arranged in a matrix in M (M is a positive integer) number of rows and N (N is a positive integer) number of columns.

According to the aforementioned and other embodiments of the present disclosure, an anode pad electrode and a cathode pad electrode may be disposed to overlap the pixel circuit unit, thereby maximally increasing an area of the transmission area.

According to the aforementioned and other embodiments of the present disclosure, a first supplement electrode overlapping the anode pad electrode and a second supplement electrode overlapping the cathode pad electrode are formed. Therefore, the anode pad electrode and the cathode pad electrode may be supported when the light emitting element is pressed to attach to the anode pad electrode and the cathode pad electrode. Further, even if the anode pad electrode is short-circuited with the first supplement electrode and the cathode pad electrode is short-circuited with the second supplement electrode due to pressurization of the light emitting element, light emission of the light emitting element may not be affected. Because the first supplement electrode and the second supplement electrode are electrically floated.

According to the aforementioned and other embodiments of the present disclosure, a user's touch may be sensed without using a separate touch panel by forming a touch electrode with a transparent metal material in a light transmissive area.

BRIEF DESCRIPTION OF THE DRAWINGS

The above and other embodiments and features of the present disclosure will become more apparent by describing embodiments thereof with reference to the attached drawings, in which.

DETAILED DESCRIPTION

Figure 1:
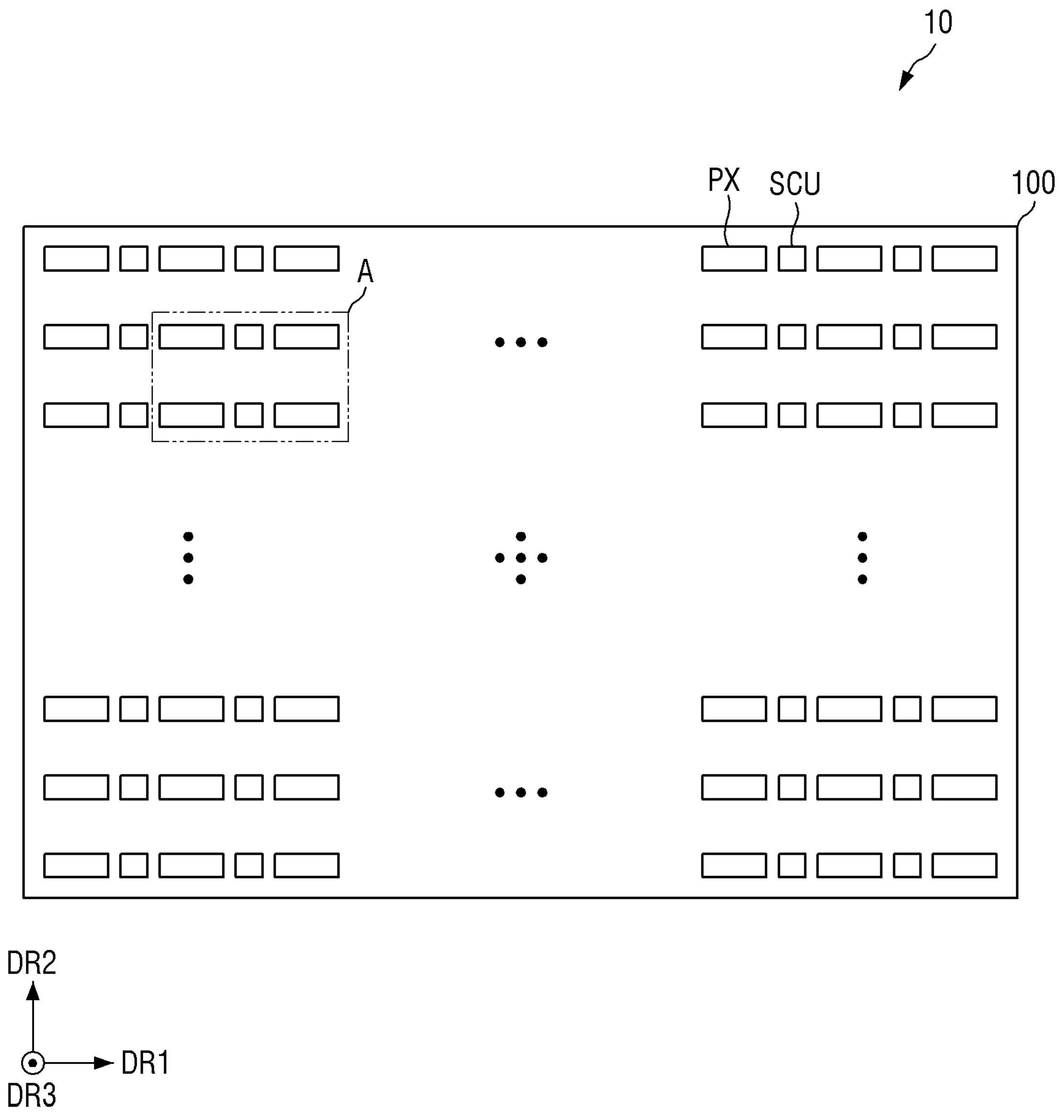
FIG. 1 is a layout diagram illustrating a display device according to one or more embodiments.

Aspects and features of embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure might not be described.

Unless otherwise noted, like reference numerals, characters, or combinations thereof denote like elements throughout the attached drawings and the written description, and thus, descriptions thereof will not be repeated. Further, parts not related to the description of one or more embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer, or section described below could be termed a second element, component, region, layer, or section, without departing from the spirit and scope of the present disclosure.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
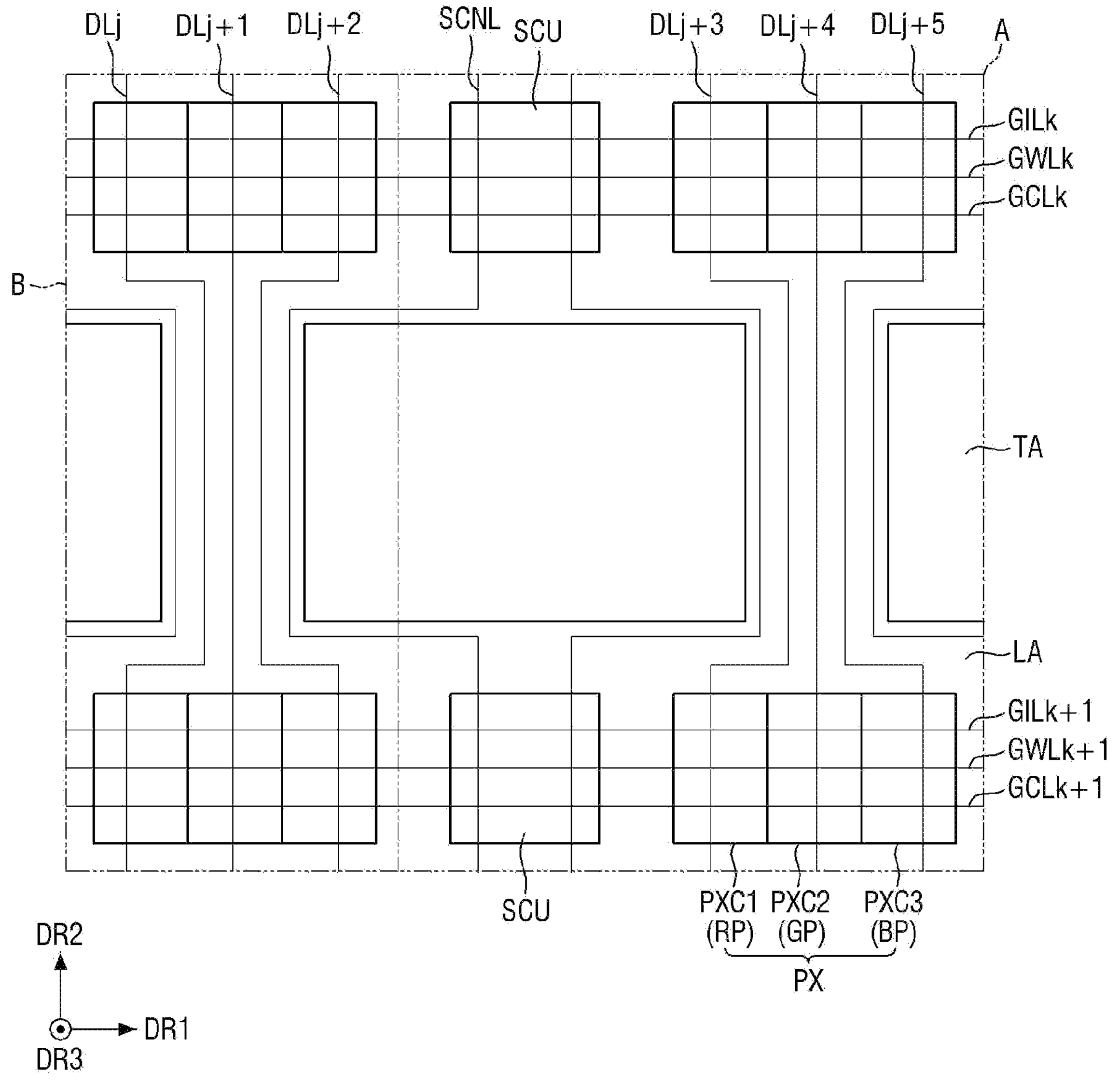
FIGS. 2 to 4 are enlarged layout views illustrating an example of an area A of FIG. 1.
Figure 3:
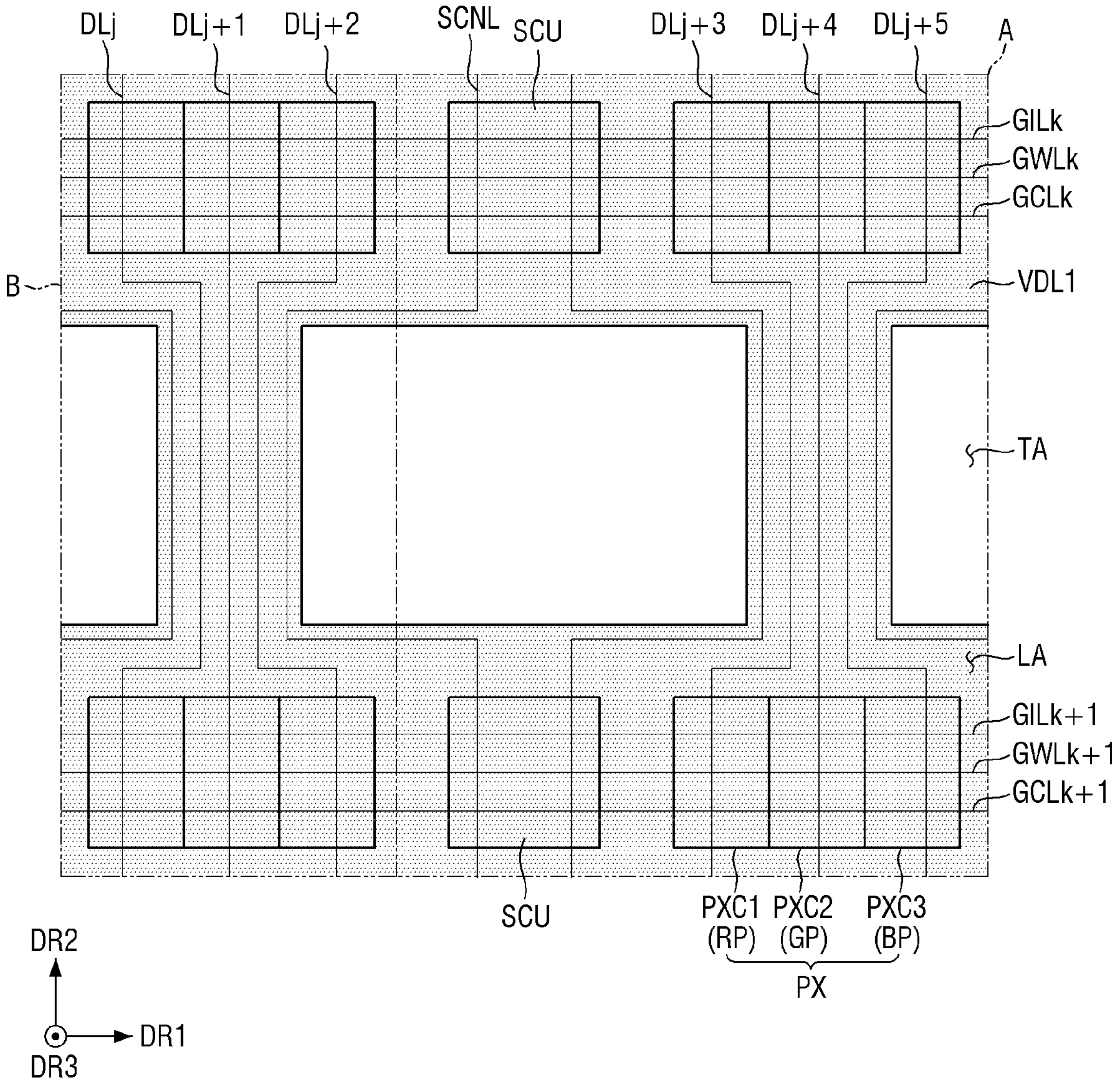
Figure 4:
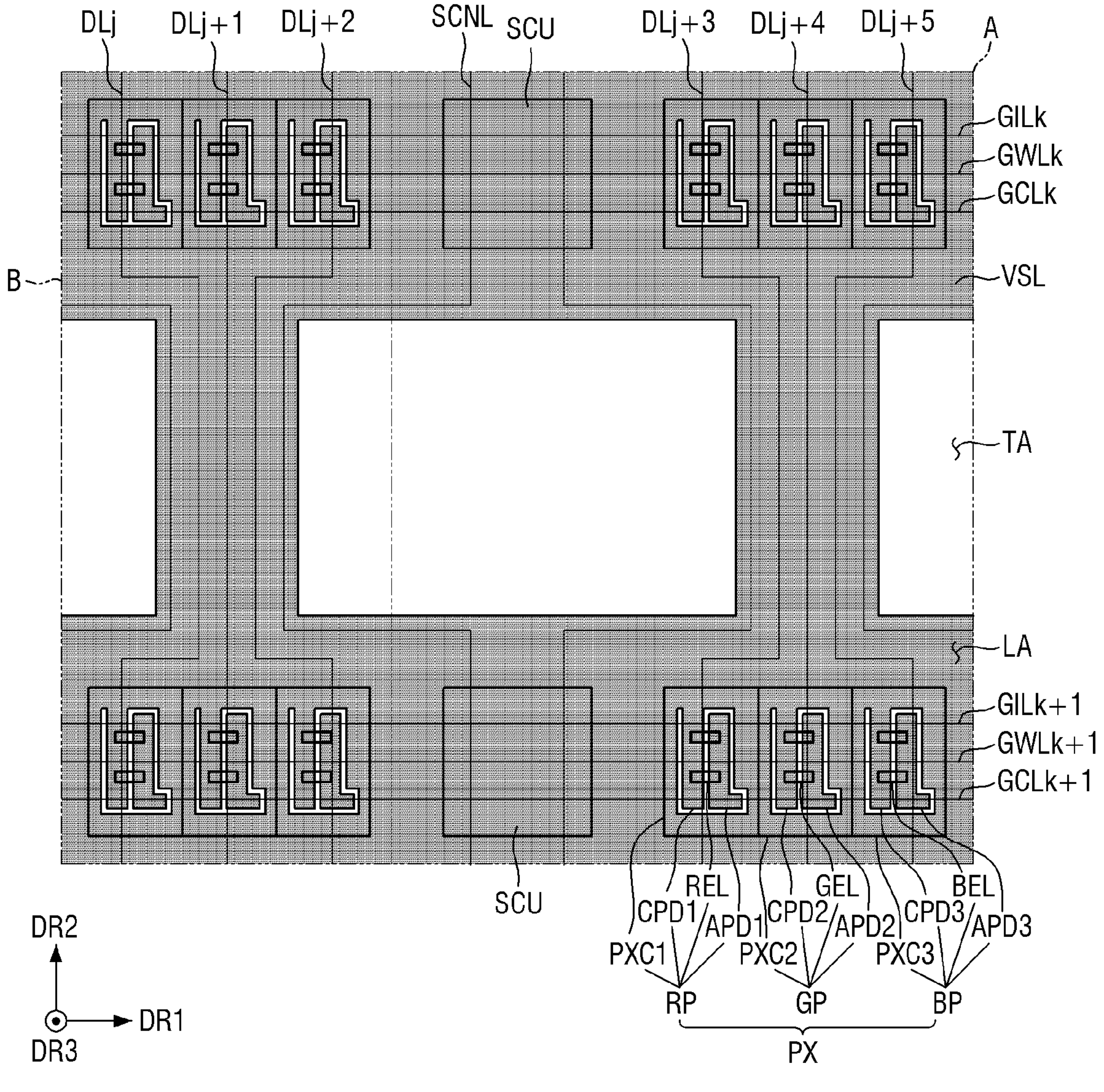
Figure 5:
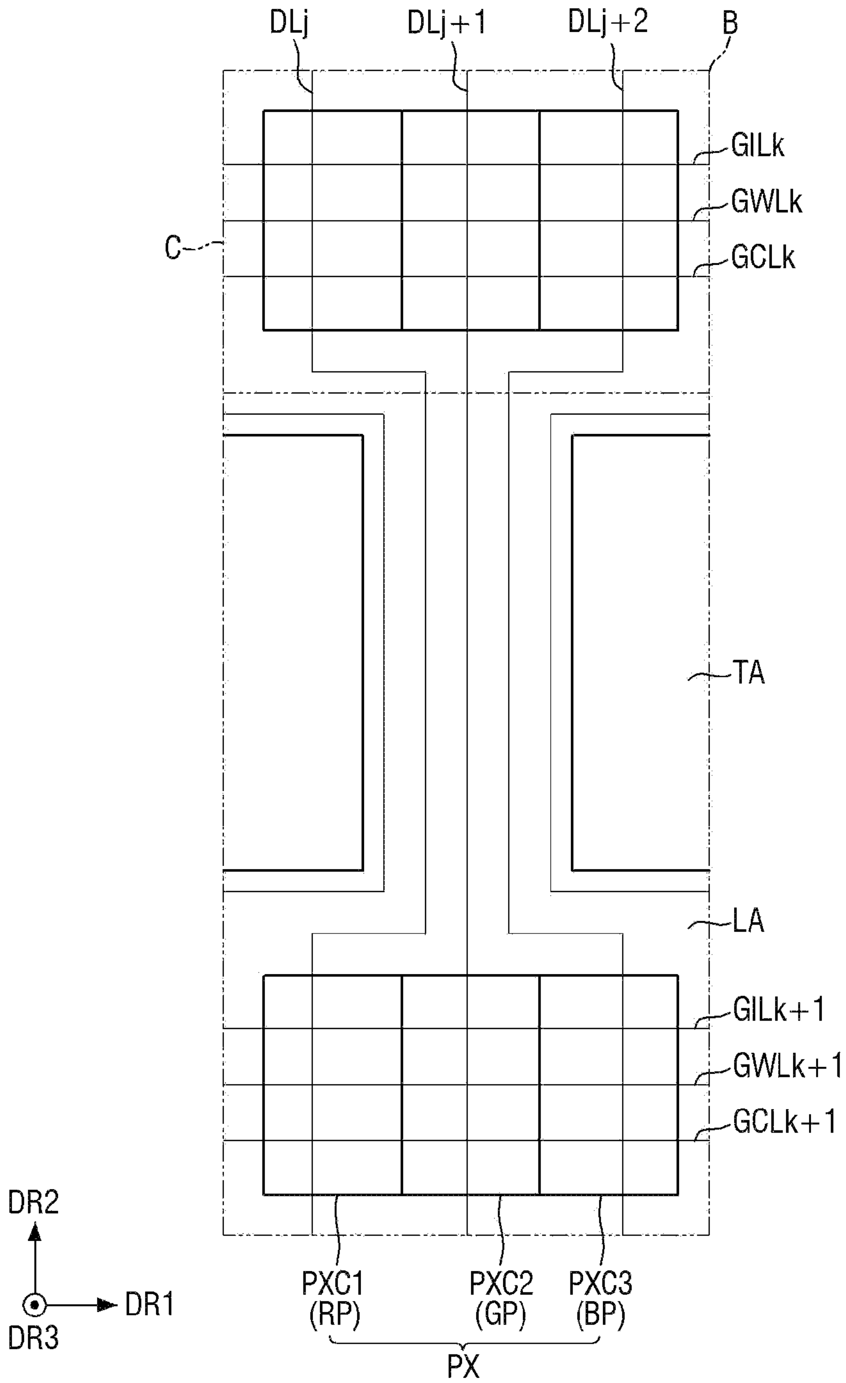
FIG. 5 is an enlarged layout view illustrating an example of an area B of FIG. 2.

FIG. 1 is a layout diagram illustrating a display device according to one or more embodiments. FIGS. 2 to 4 are enlarged layout views illustrating an example of an area A of FIG. 1. FIG. 5 is an enlarged layout view illustrating an example of an area B of FIG. 2.

Referring to FIGS. 1 to 5, a display device 10 is a device for displaying a moving image or a still image. The display device 10 may be used as a display screen of various products such as televisions, laptop computers, monitors, billboards and the Internet of Things (IOT) as well as portable electronic devices such as mobile phones, smart phones, tablet personal computer (tablet PC), smart watches, watch phones, mobile communication terminals, electronic notebooks, electronic books, portable multimedia players (PMPs), navigation systems, and ultra mobile PCs (UMPCs).

A display device 10 according to one or more embodiments includes a display panel 100. The display panel 100 may be formed in a rectangular plane having a long side in a first direction DR1 and a short side in a second direction DR2 intersecting the first direction DR1. A corner where a long side of the first direction DR1 and a short side of the second direction DR2 meet may be rounded to have a suitable curvature (e.g., a predetermined curvature) or may be formed at a right angle. A flat shape of the display panel 100 is not limited to a quadrangle, and may be formed in other polygons, circles, or ovals. The display panel 100 may be formed to be flat but is not limited thereto. For example, the display panel 100 is formed at left and right ends and may include curved portions having a constant curvature or a varying curvature. In addition, the display panel 100 may be flexibly formed to be curved, crooked, bent, folded, or rolled.

The display panel 100 may include a plurality of pixels PX, a plurality of scan circuit units SCUs, a wiring area LA, and a plurality of light transmissive areas or transmission areas TA.

The plurality of transmission areas TA are areas that transmit light, and the wiring area LA is an area in which a plurality of lines are disposed. In order to increase the light transmittance of each of the plurality of transmission areas TA, no wiring may be disposed in each of the plurality of transmission areas TA.

The wiring area LA may be disposed to be around (e.g., surround) each of the plurality of transmission areas TA. The wiring area LA may be disposed to surround each of the plurality of pixels PX and the plurality of scan circuit units SCU.

As shown in FIG. 2, the wiring area LA may include scan lines GILk, GILk+1, GWLk, GWLk+1, GCLk, and GCLk+1, data lines DLj, DLj+1, DLj+2, DLj+3, DLj+4, and DLj+5, and scan connection lines SCNL. The scan lines GILk, GILk+1, GWLk, GWLk+1, GCLk, and GCLk+1 may be extended in the first direction DR1.

In order to increase the transmittance of each of the plurality of transmissive areas TA, a length in the first direction DR1 of the wiring area LA disposed between the adjacent transmission areas TA in the first direction DR1 may be smaller than a length in the first direction DR1 of each of the pixels PXs. Accordingly, each of the plurality of data lines DLj, DLj+1, DLj+2, DLj+3, DLj+4, and DLj+5 and a plurality of scan connection lines SCNL may be bent at least once to detour the transmission area TA.

Further, as shown in FIG. 3, a first power supply line VDL1 to which a first power voltage is applied may overlap the wiring area LA. The first power supply line VDL1 may overlap the scan lines GILk, GILk+1, GWLk, GWLk+1, GCLk, and GCLk+1, the data lines DLj, DLj+1, DLj+2, DLj+3, DLj+4, and DLj+5, and the scan connection lines SCNL of the wiring area LA. The first power supply line VDL1 may be disposed to be around (e.g., surround) each of the plurality of transmission areas TA. Also, the first power supply line VDL1 may overlap the pixel circuit units PXC1, PXC2, and PXC3 of the plurality of pixels PX and the plurality of scan circuit units SCU.

Accordingly, as shown in FIG. 4, a second power supply line VSL to which the second power voltage is applied may overlap the wiring area LA. The second power supply line VSL may overlap the scan lines GILk, GILk+1, GWLk, GWLk+1, GCLk, and GCLk+1, the data lines DLj, DLj+1, DLj+2, DLj+3, DLj+4, and DLj+5, and the scan connection lines SCNL of the wiring area LA. The second power supply line VSL may be disposed to be around (e.g., surround) each of the plurality of transmission areas TA. Further, the second power supply line VSL may overlap the pixel circuit units PXC1, PXC2, and PXC3 of the plurality of pixels PX and the plurality of scan circuit units SCU. Also, the second power supply line VSL may overlap the first power supply line VDL1.

Each of the pixels PX may include a plurality of sub-pixels RP, GP, and BP to display an image as shown in FIGS. 2 to 4. In the FIGS. 2 to 4, it was exemplified that each of the pixels PX includes three sub-pixels RP, GP, and BP, that is, a first sub-pixel RP, a second sub-pixel GP, and a third sub-pixel BP, but the embodiments of the present specification are not limited thereto.

The first sub-pixel RP may include a first pixel circuit unit PXC1, a first anode pad electrode APD1, and a first cathode pad electrode CPD1.

The first pixel circuit unit PXC1 may include a plurality of thin film transistors. The first pixel circuit unit PXC1 may overlap any one of the initialization scan lines GILk, and GILk+1, any one of the write scan lines GWLk, and GWLk+1, and any one of the control scan lines GCLk, and GCLk+1. The first pixel circuit unit PXC1 may be connected to any one of the initialization scan lines GILk, and GILk+1, any one of the write scan lines GWLk, and GWLk+1, and any one of the control scan lines GCLk, and GCLk+1.

A plurality of first light emitting elements REL may be disposed on the first anode pad electrode APD1 and the first cathode pad electrode CPD1. The first electrode of each of the plurality of first light emitting elements REL may be connected to the first anode pad electrode APD1, and a second electrode may be connected to the first cathode pad electrode CPD1.

The first anode pad electrode APD1 and the first cathode pad electrode CPD1 may be disposed to overlap the first pixel circuit unit PXC1 to maximize the area of the transmission area TA, however, the present disclosure is not limited thereto. For example, when the area of the transmission area TA is sufficiently secured due to the small area of the first pixel circuit part PXC1, the first anode pad electrode APD1 and the first cathode pad electrode CPD1 may not overlap the first pixel circuit unit PXC1. That is, whether the first anode pad electrode APD1 and the first cathode pad electrode CPD1, overlap the first pixel circuit unit PXC1 may be determined in consideration of the area of the first pixel circuit unit PXC1 and the area of the transmission area TA.

A second sub-pixel GP may include a second pixel circuit unit PXC2, a second anode pad electrode APD2, and a second cathode pad electrode CPD2.

The second pixel circuit unit PXC2 may include a plurality of thin film transistors. The second pixel circuit unit PXC2 may include any one of the initialization scan lines GILk and GILk+1, any one of the write scan lines GWLk and GWLk+1, and any one of the control scan lines GCLk and GCLk+1. The second pixel circuit unit PXC2 may be connected to any one of the initialization scan lines GILk and GILk+1, any one of the write scan lines GWLk and GWLk+1, and any one of the control scan lines GCLk and GCLk+1.

A plurality of second light emitting elements GEL may be disposed on the second anode pad electrode APD2 and the second cathode pad electrode CPD2. The first electrode of each of the plurality of second light emitting elements GEL may be connected to the second anode pad electrode APD2 and the second electrode may be connected to the second cathode pad electrode CPD2.

The second anode pad electrode APD2 and the second cathode pad electrode CPD2 may overlap the second pixel circuit unit PXC2 to maximize the area of the transmission area TA. Alternatively, when the area of the transmission area TA is sufficiently secured due to the small area of the second pixel circuit part PXC2, the second anode pad electrode APD2 and the second cathode pad electrode CPD2 may not overlap the second pixel circuit part PXC2. That is, whether the second anode pad electrode APD2 and the second cathode pad electrode CPD2 overlap the second pixel circuit unit PXC2 may be determined in consideration of the area of the second pixel circuit unit PXC2 and the area of the transmission area TA.

The third sub-pixel BP may include a third pixel circuit unit PXC3, a third anode pad electrode APD3, and a third cathode pad electrode CPD3.

The third pixel circuit unit PXC3 may include a plurality of thin film transistors. A fourth pixel circuit unit PXC4 may overlap any one of the initialization scan lines GILk and GILk+1, any one of the write scan lines GWLk and GWLk+1, and any one of the control scan lines GCLk and GCLk+1. The fourth pixel circuit unit PXC4 may be connected to any one of the initialization scan lines GILk and GILk+1, any one of the write scan lines GWLk and GWLk+1, and any one of the control scan lines GCLk and GCLk+1.

A third light emitting element BEL may be disposed on the third anode pad electrode APD3 and the third cathode pad electrode CPD3. The first electrode of each of the third light emitting element BEL may be connected to the third anode pad electrode APD3 and the second electrode may be connected to the third cathode pad electrode CPD3.

The third anode pad electrode APD3 and the third cathode pad electrode CPD3 may overlap the third pixel circuit unit PXC3 to maximize the area of the transmission area TA. Alternatively, when the area of the transmission area TA is sufficiently secured due to the small area of the third pixel circuit part PXC3, the third anode pad electrode APD3 and the third cathode pad electrode CPD3 may not overlap the third pixel circuit part PXC3. That is, whether the third anode pad electrode APD3 and the third cathode pad electrode CPD3 overlap the third pixel circuit unit PXC3 may be determined in consideration of the area of the third pixel circuit unit PXC3 and the area of the transmission area TA.

Each of the scan circuit units SCU may be disposed between pixels PX adjacent to each other in the first direction DR1. Each of the scan circuit units SCU may overlap any one of the initialization scan lines GILk and GILk+1, any one of the write scan lines GWLk and GWLk+1, and any one of the control scan lines GCLk and GCLk+1. In one or more embodiments, a fourth pixel circuit unit (e.g., a fourth pixel circuit unit PXC4) may overlap any one of the initialization scan lines GILk and GILk+1, any one of the write scan lines GWLk and GWLk+1, or any one of the control scan lines GCLk and GCLk+1.

Each of the scan circuit units SCU may be connected to an adjacent scan circuit unit SCU in the second direction DR2 through at least one scan connection line SCNL. Further, each of the scan circuit units SCU may be connected to the adjacent scan circuit unit SCU in the first direction DR1 through the scan connection line SCNL.

As shown in FIGS. 1 to 5, the display panel 100 includes the light transmissive areas TA, so that, the background or object on the rear surface of the display panel 100 may be viewed through the light transmissive areas TA when the display panel 100 does not display an image. That is, the display device 10 may be implemented as a transparent display device.

Figure 6:
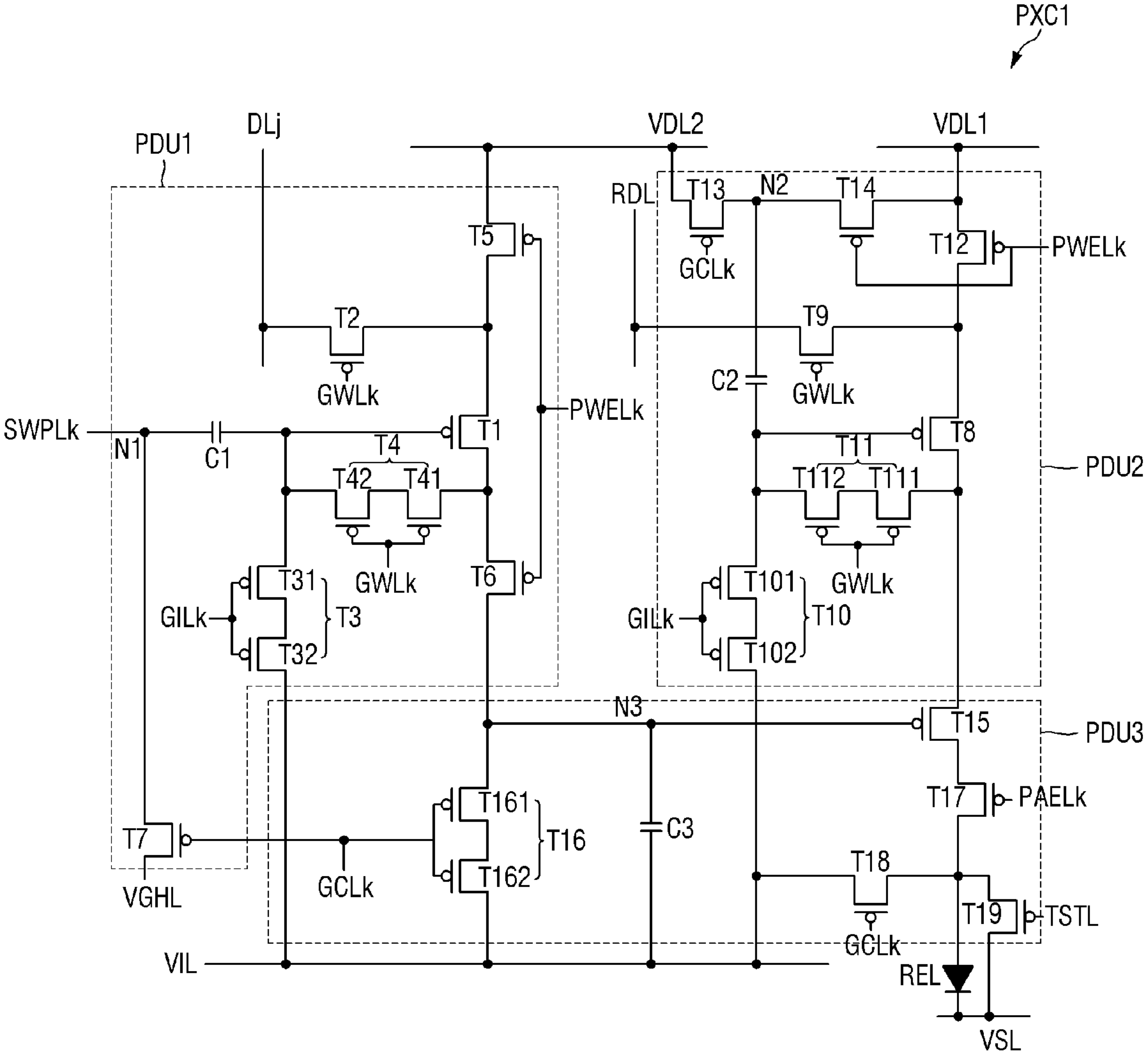
FIG. 6 is a circuit diagram illustrating a first pixel circuit unit and a first light emitting element according to one or more embodiments.

FIG. 6 is a circuit diagram illustrating a first pixel circuit unit and a first light emitting element according to one or more embodiments.

Referring to FIG. 6, a first pixel circuit unit RP according to one or more embodiments may be connected to a $k^{th}$ (k is a positive integer) write scan line GWLk, a $k^{th}$ initialization scan line GILk, a $k^{th}$ control scan line GCLk, a $k^{th}$ sweep signal line SWPLk, a $k^{th}$ PWM light emitting line PWELk, and a $k^{th}$ PAM light emitting line PAELk. Further, the first sub-circuit unit PXC1 may be connected to a $j^{th}$ data line DLj and a first PAM data line RDL. Also, the first sub-circuit unit PXC1 may be connected to the first power supply line VDL1 to which a first power voltage VDD1 is applied, the second power supply line VSL to which the second power voltage VSS is applied, a third power supply line VDL2 to which a third power voltage VDD2 is applied, an initialization voltage line VIL to which an initialization voltage VINT is applied, and a gate-off voltage line VGHL to which a gate-off voltage VGH is applied.

The first sub-circuit unit PXC1 may include a first pixel driver PDU1, a second pixel driver PDU2, and a third pixel driver PDU3.

The first light emitting element REL emits light according to the first driving current generated by the second pixel driver PDU2. The first light emitting element REL may be disposed between the seventeenth transistor T17 and the second power supply line VSL. The first electrode of the first light emitting element REL may be connected to the second electrode of the seventeenth transistor T17 and the second electrode may be connected to the second power supply line VSL. The first electrode of the first light emitting element REL may be an anode electrode, and the second electrode may be a cathode electrode. The first light emitting element REL may be an inorganic light emitting element including the first electrode, the second electrode, and an inorganic semiconductor disposed between the first electrode and the second electrode. For example, the first light emitting element REL may be a micro light emitting diode formed of the inorganic semiconductor but is not limited thereto.

The first pixel driver PDU1 generates a control current in response to a $j^{th}$ data voltage of the $j^{th}$ data line DLj to control the voltage of the third node N3 of the third pixel driver PDU3. Because the pulse width of the first driving current flowing through the first light emitting element REL may be adjusted by the control current of the first pixel driving unit PDU1, the first pixel driver PDU1 may be a pulse width modulation (PWM) unit for performing pulse width modulation of the first driving current flowing through the first light emitting element REL.

The first pixel driver PDU1 may include the first to seventh transistors T1 to T7 and a first capacitor C1.

The first transistor T1 controls a control current flowing between the second electrode and the first electrode in response to the voltage (e.g., data voltage) applied to the gate electrode.

The second transistor T2 is turned-on by the $k^{th}$ write scan signal of the $k^{th}$ write scan line GWLk to supply the data voltage of the $j^{th}$ data line DLj to the first electrode of the first transistor T1.

The third transistor T3 is turned-on by the $k^{th}$ initialization scan signal of the $k^{th}$ initialization scan line GILk to connect the initialization voltage line VIL to the gate electrode of the first transistor T1. Accordingly, during the turn-on period of the third transistor T3, the gate electrode of the first transistor T1 may be discharged to the initialization voltage VINT of the initialization voltage line VIL. The third transistor T3 may include a plurality of transistors connected in series. For example, the third transistor T3 may include a first sub-transistor T31 and a second sub-transistor T32. Because of this, it is possible to reduce or minimize the voltage of the gate electrode of the first transistor T1 from leaking through the third transistor T3.

The fourth transistor T4 is turned-on by the $k^{th}$ write scan signal of the $k^{th}$ write scan line GWLk to connect the gate electrode and the second electrode of the first transistor T1. Because of this, during the turnd-on period of the fourth transistor T4, the first transistor T1 may operate as a diode (e.g., the first transistor T1 may be diode-connected). The fourth transistor T4 may include a plurality of transistors connected in series. For example, the fourth transistor T4 may include a third sub-transistor T41 and a fourth sub-transistor T42. Because of this it is possible to reduce or minimize the voltage of the gate electrode of the first transistor T1 from leaking through the fourth transistor T4.

The fifth transistor T5 is turned-on by the $k^{th}$ PWM emission signal of a $k^{th}$ PWM emission line PWELk to connect the first electrode of the first transistor T1 to the first power supply line VDL1.

The sixth transistor T6 is turned-on by the $k^{th}$ PWM emission signal of the $k^{th}$ PWM emission line PWELk to connect the second electrode of the first transistor T1 to the third node N3 of the third pixel driver PDU3.

The seventh transistor T7 is turned on by a $k^{th}$ control scan signal of a $k^{th}$ control scan line GCLk to supply the gate-off voltage VGH of the gate-off voltage line VGHL to a first node N1 connected to the $k^{th}$ sweep signal line SWPLk. Because of this, it is possible to prevent the change in the voltage of the gate electrode of the first transistor T1 from being reflected in the $k^{th}$ sweep signal of the $k^{th}$ sweep signal line SWPLk by the first capacitor C1 during the period in which the initialization voltage VINT is applied to the gate electrode of the first transistor T1 and the period in which the data voltage of the $j^{th}$ data line DLj and a threshold voltage Vth1 of the first transistor T1 are programmed. The first capacitor C1 may be disposed between the gate electrode of the first transistor T1 and the first node N1.

The first capacitor C1 may be disposed between the gate electrode of the first transistor T1 and the first node N1. One electrode of the first capacitor C1 may be connected to the gate electrode of the first transistor T1, and the other electrode thereof may be connected to the first node N1.

The first node N1 may be the contact point of the $k^{th}$ sweep signal line SWPLk, the second electrode of the seventh transistor T7, and the other electrode of the first capacitor C1.

The second pixel driver PDU2 generates the first driving current applied to the first light emitting element REL in response to the first PAM data voltage of the first PAM data line RDL. The second pixel driver PDU2 may be a pulse amplitude modulation PAM unit for performing pulse amplitude modulation. The second pixel driver PDU2 may be a constant current generator that generates a constant first driving current according to the first PAM data voltage.

Also, the second pixel driver PDU2 of each of the first sub-pixels RP may receive the same first PAM data voltage and generate the same first driving current regardless of the luminance of the first sub-pixel RP. Similarly, the second pixel driver PDU2 of each of the second sub-pixels GP may receive the same second PAM data voltage and generate the same second driving current regardless of the luminance of the second sub-pixel GP. The second pixel driver PDU2 of each of the third sub-pixels BP may receive the same third PAM data voltage and generate the same third driving current regardless of the luminance of the third sub-pixel BP.

The second pixel driver PDU2 may include eighth to fourteenth transistors T8 to T14 and a second capacitor C2.

The eighth transistor T8 controls the first driving current flowing to the light emitting element REL in response to the voltage applied to the gate electrode.

The ninth transistor T9 is turned-on by a $k^{th}$ scan write signal of a $k^{th}$ scan write line GWLk to supply the first PAM data voltage of the first PAM data line RDL to the first electrode of the eighth transistor T8.

The tenth transistor T10 is turned-on by the $k^{th}$ scan initialization signal of a $k^{th}$ scan initialization line GILk to connect the initialization voltage line VIL to the gate electrode of the eighth transistor T8. Accordingly, during the turned-on period of the tenth transistor T10, the gate electrode of the eighth transistor T8 may be discharged to the initialization voltage VINT of the initialization voltage line VIL. The tenth transistor T10 may include a plurality of transistors connected in series. For example, the tenth transistor T10 may include a fifth sub-transistor T101 and a sixth sub-transistor T102. Accordingly, the voltage of the gate electrode of the eighth transistor T8 may reduce or minimize leaking through the tenth transistor T10.

The eleventh transistor T11 is turned-on by a $k^{th}$ scan write signal of the $k^{th}$ scan write line GWLk to connect the gate electrode and the second electrode of the eighth transistor T8. Accordingly, during the turned-on period of the eleventh transistor T11, the eighth transistor T8 may operate as a diode (e.g., the eighth transistor T8 may be diode-connected). The eleventh transistor T11 may include a plurality of transistors connected in series. For example, the eleventh transistor T11 may include a seventh sub-transistor T111 and an eighth sub-transistor T112. Accordingly, it is possible to reduce or minimize the voltage of the gate electrode of the eighth transistor T8 from leaking through the eleventh transistor T11.

The twelfth transistor T12 is turned-on by the $k^{th}$ PWM emission signal of the $k^{th}$ PWM emission line PWELk to connect the first electrode of the eighth transistor T8 to a first power supply line VDL1.

The thirteenth transistor T13 is turned-on by the $k^{th}$ scan control signal of a $k^{th}$ scan control line GCLk to connect the second power supply line VDL2 to a second node N2. Accordingly, when the thirteenth transistor T13 is turned-on, a third power voltage VDD2 of a third power supply line VDL2 may be supplied to the second node N2.

The fourteenth transistor T14 is turned-on by the $k^{th}$ PWM emission signal of the $k^{th}$ PWM emission line PWELk to connect the first power supply line VDL1 to the second node N2. Accordingly, when the fourteenth transistor T14 is turned-on, the first power voltage VDD1 of the first power supply line VDL1 may be supplied to the second node N2.

The second capacitor C2 may be disposed between the gate electrode of the eighth transistor T8 and the second node N2. One electrode of the second capacitor C2 may be connected to the gate electrode of the eighth transistor T8, and the other electrode thereof may be connected to the second node N2.

The second node N2 may be the contact point of the second electrode of the thirteenth transistor T13, the second electrode of the fourteenth transistor T14, and the other electrode of the second capacitor C2.

The third pixel driver PDU3 adjusts the period in which the first driving current is applied to the first light emitting element REL depending on the voltage of the third node N3.

The third pixel driver PDU3 may include fifteenth to nineteenth transistors T15 to T19 and a third capacitor C3.

The fifteenth transistor T15 is turned-on or turned-off depending on a voltage of the third node N3. When the fifteenth transistor T15 is turned-on, the first driving current of the eighth transistor T8 may be supplied to the first light emitting element REL, and when the fifteenth transistor T15 is turned-off, the first driving current of the eighth transistor T8 may not be supplied to the first light emitting element REL. Therefore, the turned-on period of the fifteenth transistor T15 may be substantially the same as the emission period of the first light emitting element REL.

The sixteenth transistor T16 is turned-on by the $k^{th}$ scan control signal of the $k^{th}$ scan control line GCLk to connect the initialization voltage line VIL to the third node N3. Accordingly, during the turned-on period of the sixteenth transistor T16, the third node N3 may be discharged to the initialization voltage of the initialization voltage line VIL. The sixteenth transistor T16 may include a plurality of transistors connected in series. For example, the sixteenth transistor T16 may include a ninth sub-transistor T161 and a tenth sub-transistor T162. Accordingly, it is possible to reduce or minimize the voltage of the third node N3 from leaking through the sixteenth transistor T16.

The seventeenth transistor T17 is turned-on by a $k^{th}$ PAM emission signal of a $k^{th}$ PAM emission line PAELk to connect the second electrode of the fifteenth transistor T15 to the first electrode of the first light emitting element REL.

The eighteenth transistor T18 is turned-on by the $k^{th}$ scan control signal of the $k^{th}$ scan control line GCLk to connect the initialization voltage line VIL to the first electrode of the first light emitting element REL. Accordingly, during the turned-on period of the eighteenth transistor T18, the first electrode of the first light emitting element REL may be discharged to the initialization voltage of the initialization voltage line VIL.

The nineteenth transistor T19 is turned-on by the test signal of a test signal line TSTL to connect the first electrode of the first light emitting element REL to the second power supply line VSL.

The third capacitor C3 may be disposed between the third node N3 and the initialization voltage line VIL. One electrode of the third capacitor C3 may be connected to the third node N3, and the other electrode thereof may be connected to the initialization voltage line VIL.

The third node N3 may be the contact point of the second electrode of the sixth transistor T6, the gate electrode of the fifteenth transistor T15, the first electrode of the ninth sub-transistor T161, and one electrode of the third capacitor C3.

Any one of the first electrode and the second electrode of each of the first to nineteenth transistors T1 to T19 may be a source electrode, and the other may be a drain electrode. An active layer of each of the first to nineteenth transistors T1 to T19 may be formed of any one of polysilicon, amorphous silicon, and an oxide semiconductor. When the active layer of each of the first to nineteenth transistors T1 to T19 is polysilicon, it may be formed by a low temperature poly silicon (LTPS) process.

Further, although FIG. 6 mainly describes the case in which each of the first to nineteenth transistors T1 to T19 is formed as the P-type MOSFET, the embodiment of the present specification is not limited thereto. For example, each of the first to nineteenth transistors T1 to T19 may be formed as the N-type MOSFET.

Alternatively, in order to improve the black display capability of the first light emitting element REL by blocking a leakage current, in the first sub-pixel RP, the first sub-transistor T31 and the second sub-transistor T32 of the third transistor T3, the third sub-transistor T41 and the fourth sub-transistor T42 of the fourth transistor T4, the fifth sub-transistor T101 and the sixth sub-transistor T102 of the tenth transistor T10, and the seventh sub-transistor T111 and the eighth sub-transistor T112 of the eleventh transistor T11 may be formed as the N-type MOSFET. In this case, the gate electrode of the third sub-transistor T41 and the gate electrode of the fourth sub-transistor T42 of the fourth transistor T4, and the gate electrode of the seventh sub-transistor T111 and the gate electrode of the eighth sub-transistor T112 of the eleventh transistor T11 may be connected to a $k^{th}$ control signal line (not shown). The $k^{th}$ initialization scan signal Glk and a $k^{th}$ control signal of the $k^{th}$ control signal line (not shown) may have a pulse generated by the gate-off voltage VGH. Further, the active layers of the first sub-transistor T31 and the second sub-transistor T32 of the third transistor T3, the third sub-transistor T41 and the fourth sub-transistor T42 of the fourth transistor T4, the fifth sub-transistor T101 and the sixth sub-transistor T102 of the tenth transistor T10, and the seventh sub-transistor T111 and the eighth sub-transistor T112 of the eleventh transistor T11 may be formed of an oxide semiconductor, and the active layers of the other transistors may be formed of polysilicon.

Alternatively, any one of the first sub-transistor T31 and the second sub-transistor T32 of the third transistor T3 may be formed as the N-type MOSFET and the other may be formed as the P-type MOSFET. In this case, between the first sub-transistor T31 and the second sub-transistor T32 of the third transistor T3, the transistor formed as the N-type MOSFET may be formed of an oxide semiconductor, and the transistor formed as the P-type MOSFET may be formed of polysilicon.

Alternatively, any one of the third sub-transistor T41 and the fourth sub-transistor T42 of the fourth transistor T4 may be formed as the N-type MOSFET, and the other may be formed as the P-type MOSFET. In this case, between the third sub-transistor T41 and the fourth sub-transistor T42 of the fourth transistor T4, the transistor formed as the N-type MOSFET may be formed of an oxide semiconductor, and the transistor formed as the P-type MOSFET may be formed of polysilicon.

Alternatively, any one of the fifth sub-transistor T101 and the sixth sub-transistor T102 of the tenth transistor T10 may be formed as the N-type MOSFET, and the other may be formed as the P-type MOSFET. In this case, between the fifth sub-transistor T101 and the sixth sub-transistor T102 of the tenth transistor T10, the transistor formed as the N-type MOSFET may be formed of an oxide semiconductor, and the transistor formed as the P-type MOSFET may be formed of polysilicon.

Alternatively, any one of the seventh sub-transistor T111 and the eighth sub-transistor T112 of the eleventh transistor T11 may be formed as the N-type MOSFET, and the other may be formed as the P-type MOSFET. In this case, between the seventh sub-transistor T111 and the eighth sub-transistor T112 of the eleventh transistor T11, the transistor formed as the N-type MOSFET may be formed of an oxide semiconductor, and the transistor formed as the P-type MOSFET may be formed of polysilicon.

A second pixel circuit unit PXC2 and the third pixel circuit unit PXC3 may be substantially the same as the first pixel circuit unit PXC1 described with reference to FIG. 6 according to one or more embodiments. Therefore, descriptions of the second pixel circuit unit PXC2 and a third pixel circuit unit PXC3 according to one or more embodiments will be omitted.

Figure 7:
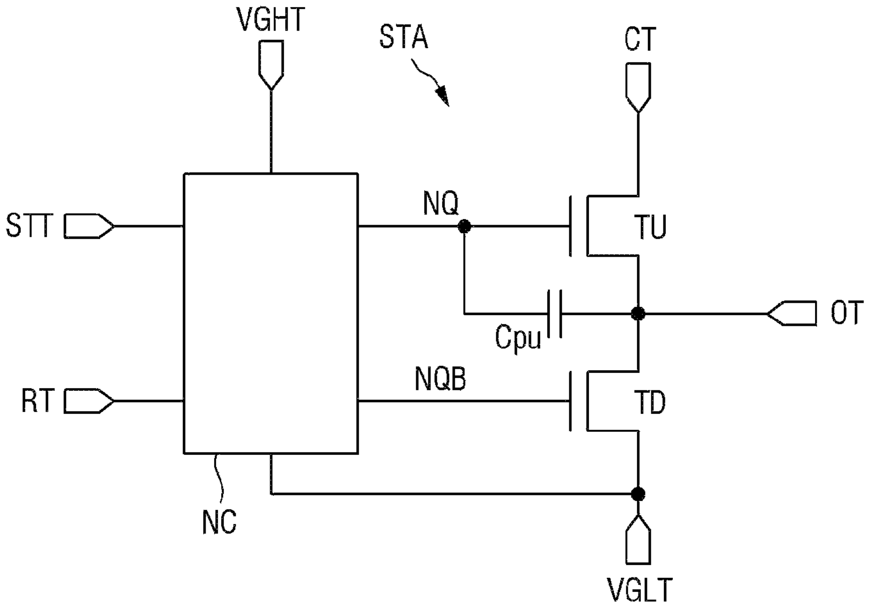
FIG. 7 is a circuit diagram illustrating a scan driver according to one or more embodiments.

FIG. 7 is a circuit diagram illustrating a stage of a scan driver according to one or more embodiments.

Referring to FIG. 7, the scan driver according to one or more embodiments sequentially includes a plurality of stages STAs. The plurality of stages STA may sequentially output write scan signals to the write scan lines GWLk and GWLk+1. Alternatively, the plurality of stages STA may sequentially output initialization scan signals to the initialization scan lines GILk and GILk+1. Alternatively, the plurality of stages STA may sequentially output control scan signals to the control scan lines GCLk and GCLk+1.

Each of the plurality of stages STA may receive a scan timing control signal, a gate-on voltage, and a gate-off voltage. The scan timing control signal may include a start signal or a carry signal and a clock signal.

Each of the plurality of stages STA include a pull-up node NQ, a pull-down node NQB, a pull-up transistor TU that is turned-on when the pull-up node NQ has a gate-on voltage, a pull-down transistor TD that is turned-on when the pull-down node NQB has a gate-on voltage, a node control unit NC for controlling the charging and discharging of the pull-up node NQ and the pull-down node NQB, and a pull-up capacitor Cpu disposed between the pull-up node NQ and an output terminal OT.

The node control unit NC may be connected to a start terminal STT to which a start signal or a carry signal output through the output terminal OT of the previous stage is input, a reset terminal RT to which an output signal of the subsequent stage is input, a gate-on voltage terminal VGHT to which a gate-on voltage is applied, and a gate-off voltage terminal VGLT to which a gate-off voltage is applied. The node control unit NC controls a start signal input to the start terminal STT or charging and discharging of the pull-up node NQ and the pull-down node NQB according to the carry signal of the previous stage. In order to stably control the output of the stage STA, the node control unit NC causes the pull-down node NQB to have a gate-off voltage when the pull-up node NQ has a gate-on voltage and causes the pull-up node NQ to have a gate-off voltage when the pull-down node NQB has a gate-on voltage. To this end, the node control unit NC may include a plurality of transistors.

The pull-up transistor TU is turned-on when the stage STA is pulled up, that is, when the pull-up node NQ has a gate-on voltage, and outputs a clock signal input to the clock terminal CT to the output terminal OT. The pull-down transistor TD is turned-on when the stage STA is pulled down, for example, when the pull-down node NQB has a gate-on voltage, and outputs the gate-off voltage of the gate-off voltage terminal VGLT to the output terminal OT.

The pull-up transistor TU, the pull-down transistor TD, and the plurality of transistors of the node control unit NC of each of the plurality of stages STA may be formed of a thin film transistor (TFT). Further, each of the pull-up transistors TU, the pull-down transistor TD, and the plurality of transistors of the node control unit NC of the plurality of stages STA are formed of an N-type MOSFET as shown in FIG. 7, but the embodiments of the present disclosure are not limited thereto. That is, the pull-up transistor TU, the pull-down transistor TD, and the plurality of transistors of the node control unit NC of each of the plurality of stages STA may be formed of a P-type MOSFET.

Each of the scan circuit units SCU may include at least one of the pull-up transistor TU, the pull-down transistor TD, the plurality of transistors of the node control unit NC, and the pull-up capacitor Cpu. Therefore, the stage STA may be made of a combination of the plurality of scan circuit units SCU. For example, the stage STA may be made of a combination of the scan circuit unit SCU including the pull-up transistor TU, the scan circuit unit SCU including the pull-down transistor TD, the scan circuit unit SCU including some transistors from among the plurality of transistors of the node control unit NC, the scan circuit unit SCU including remaining transistors from among the plurality of transistors of the node control unit NC, and the scan circuit unit SCU including the pull-up capacitor Cpu.

Figure 10:
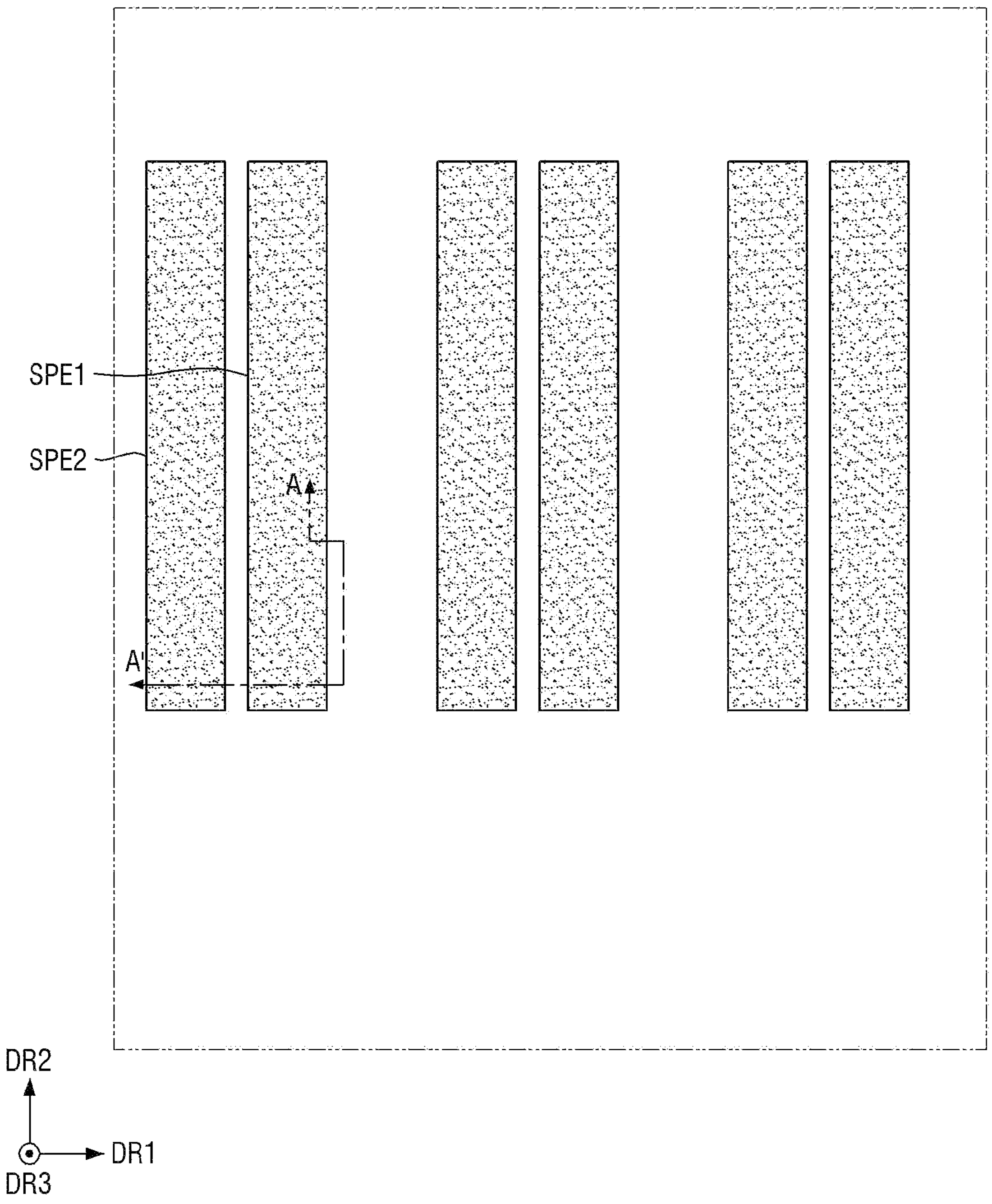
Figure 11:
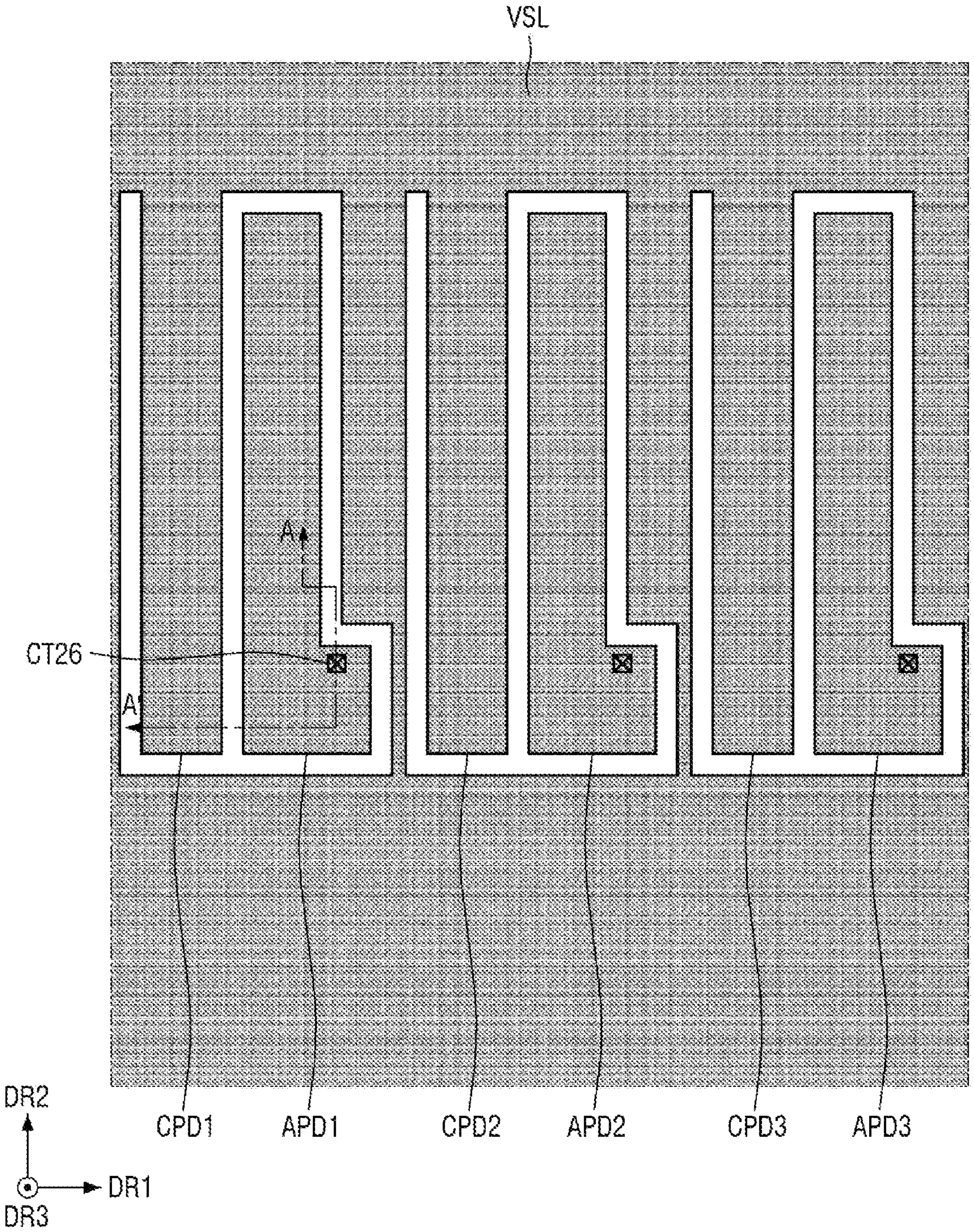
Figure 12:
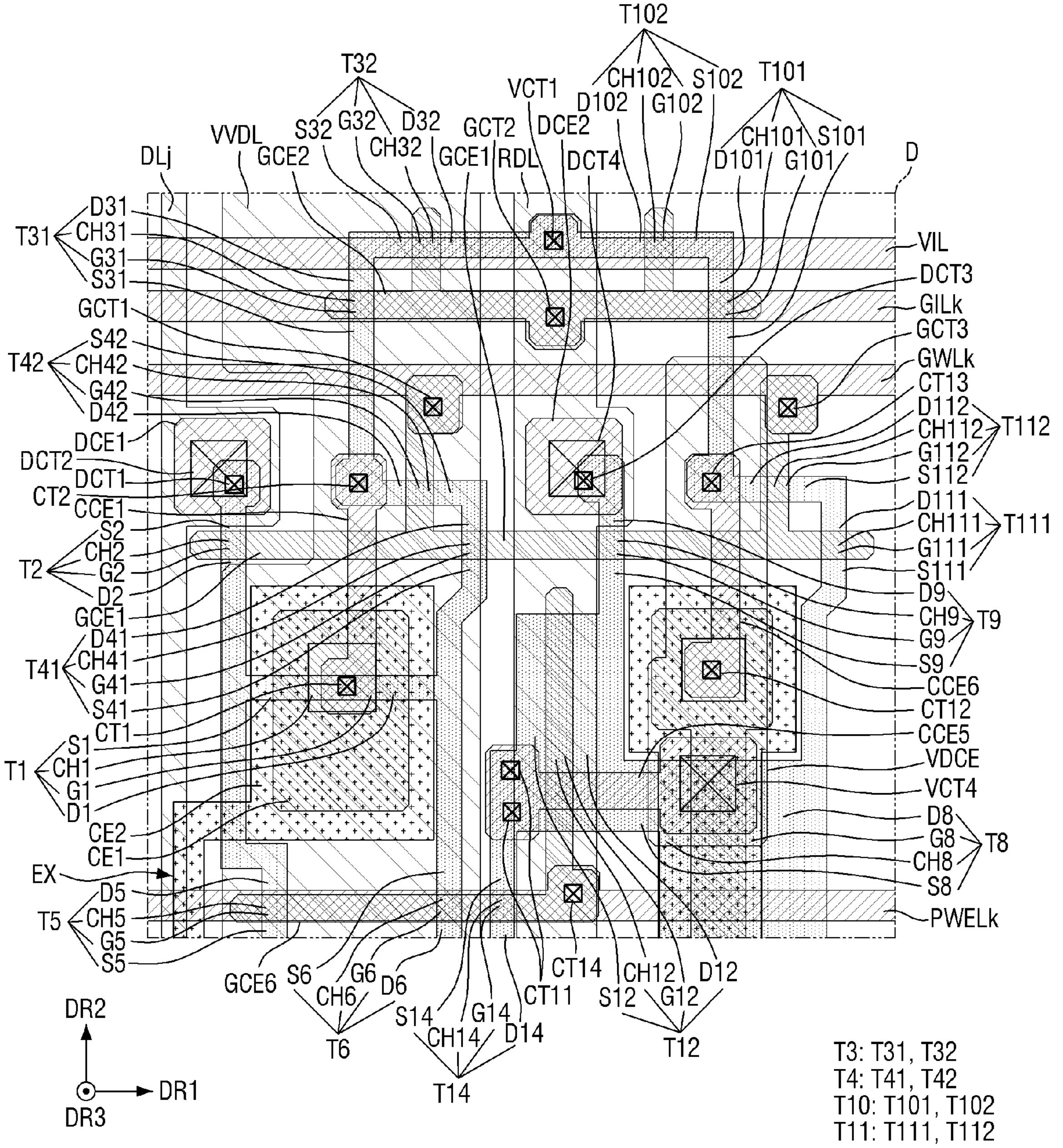
FIGS. 12 to 14 are enlarged layout views illustrating an example of an area D, an area E, and an area F of FIG. 8.
Figure 13:
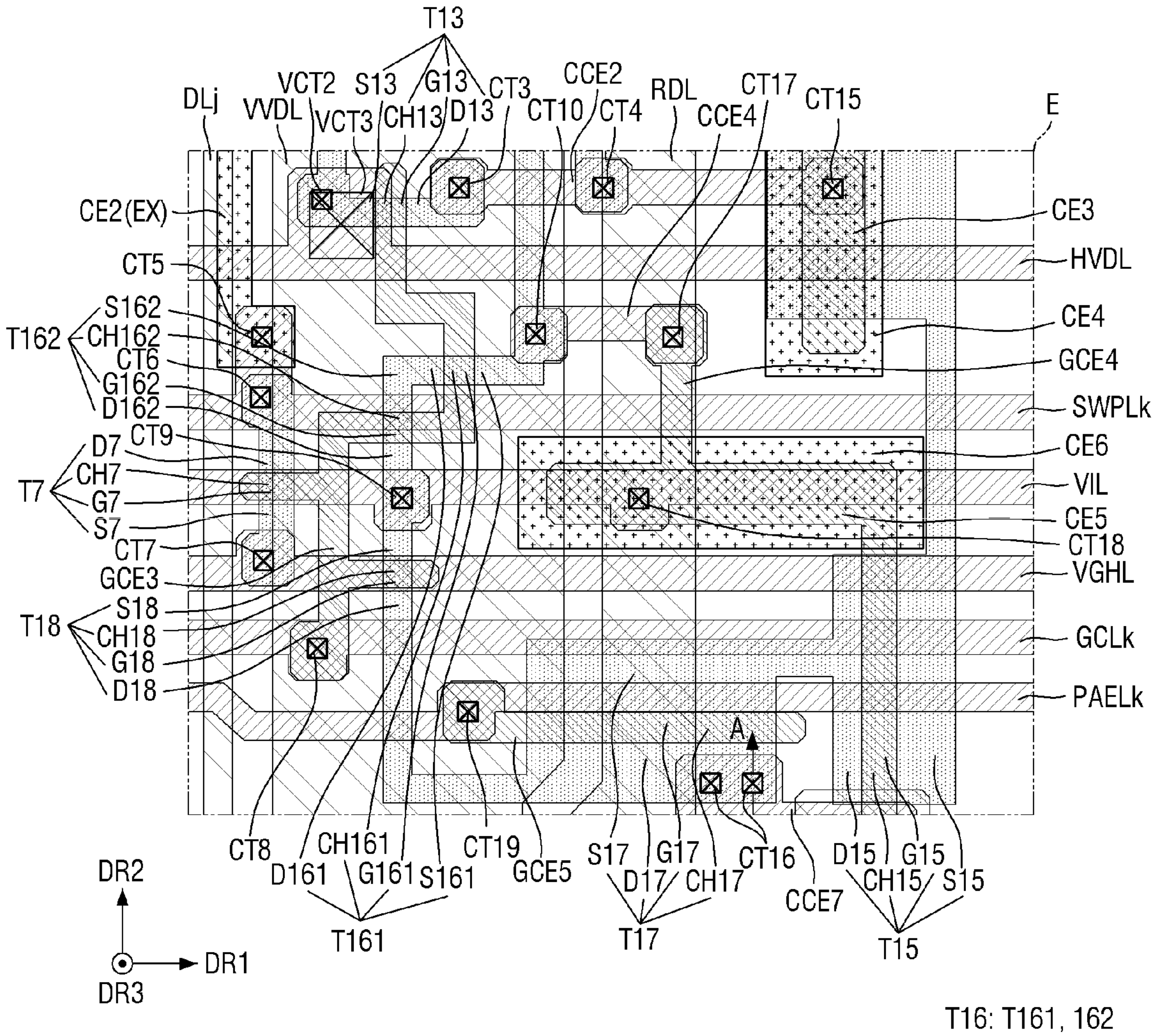
Figure 14:
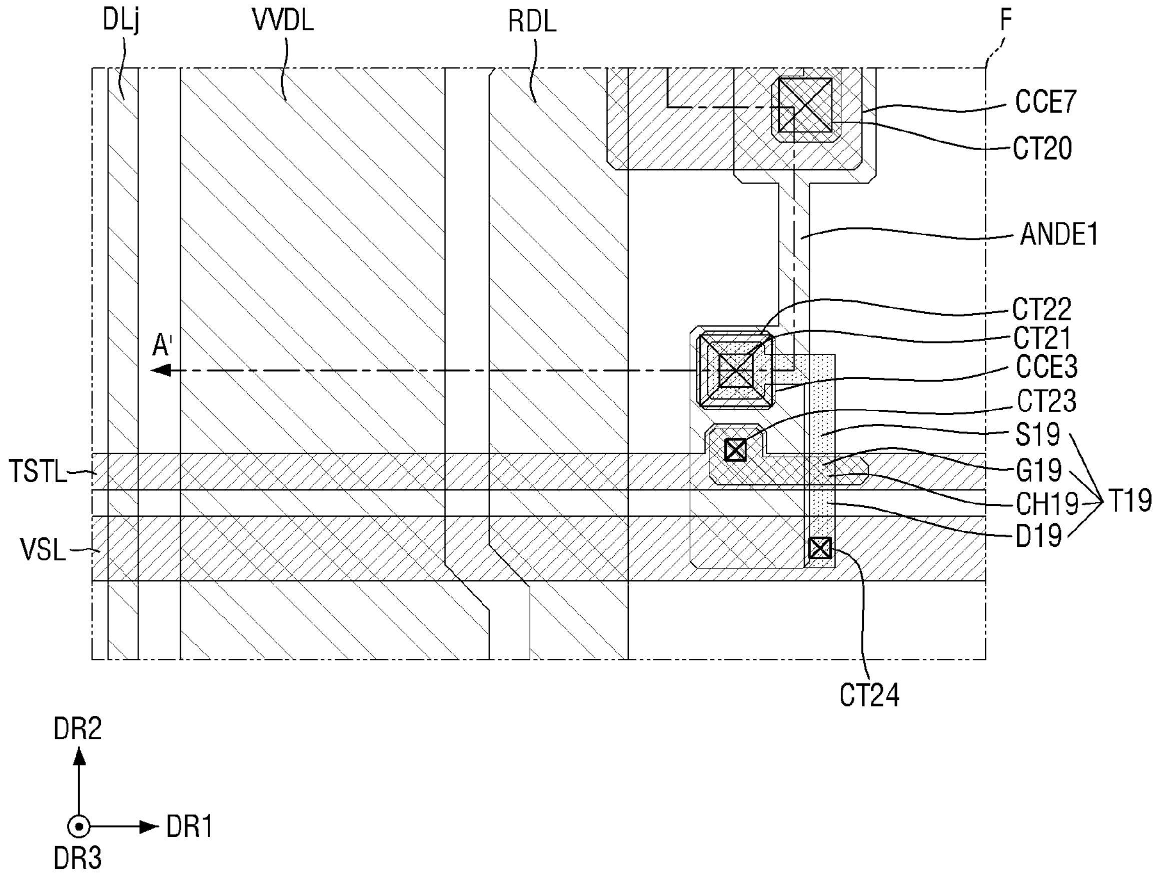

FIGS. 8 to 11 are enlarged layout views illustrating an example of an area C of FIG. 4. FIGS. 12 to 14 are enlarged layout views illustrating an example of an area D, an area E, and an area F of FIG. 8.

Figure 8:
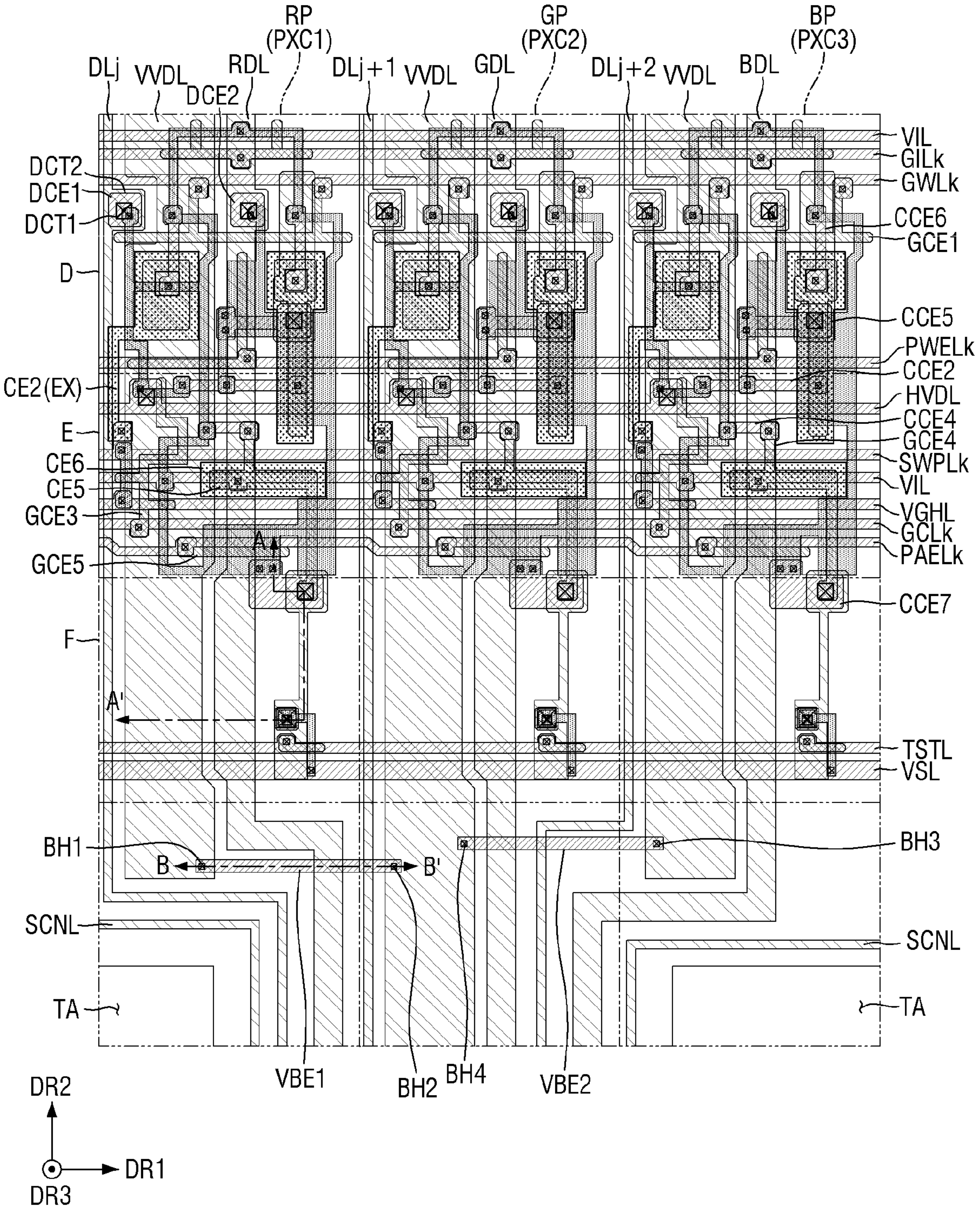
FIGS. 8 to 11 are enlarged layout views illustrating an example of an area C of FIG. 4.
Figure 9:
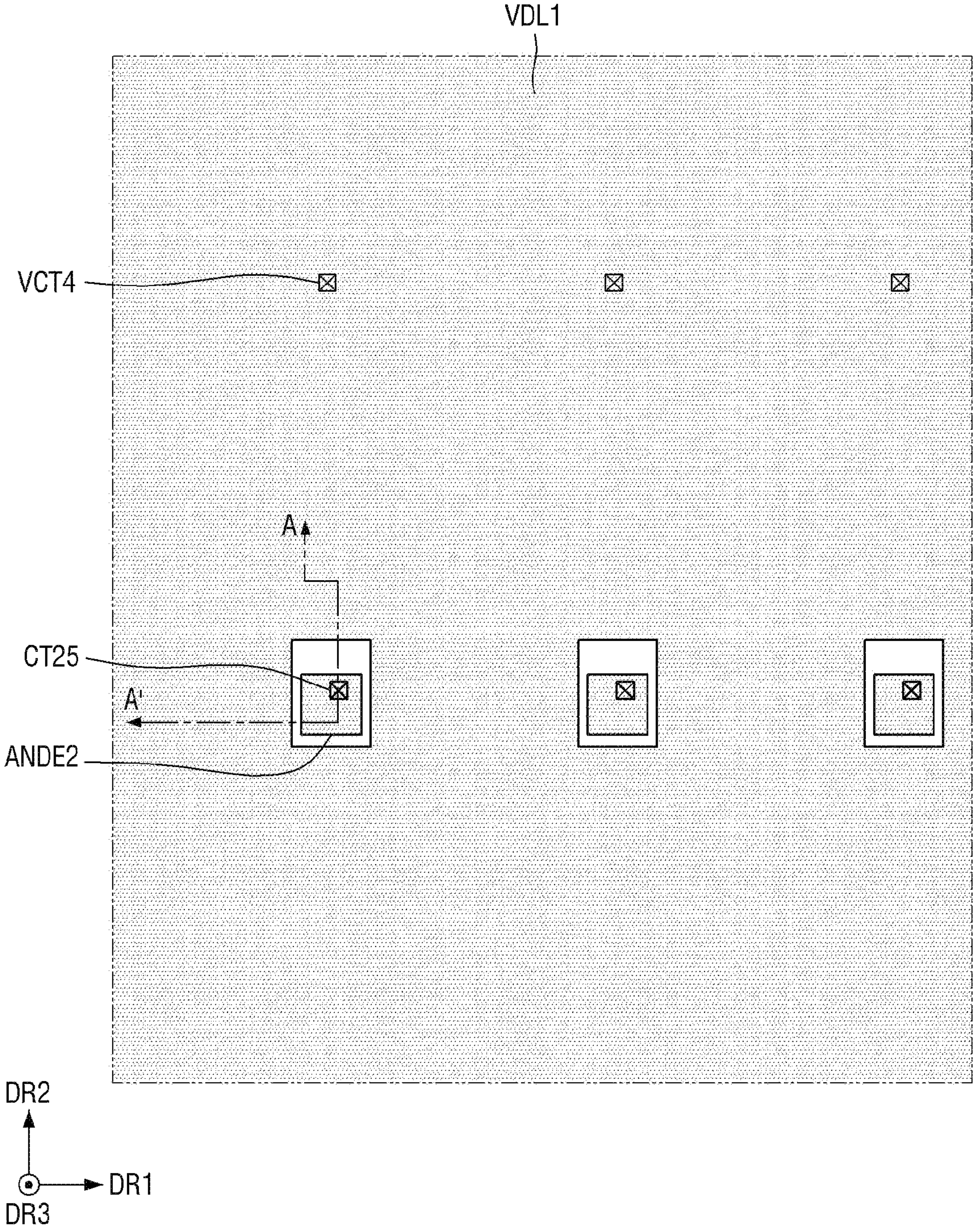

FIGS. 8 and 12 to 14 show layouts of a first gate metal layer, a second gate metal layer, a first source metal layer, and a second source metal layer. FIG. 9 shows a layout of a third source metal layer in addition to the layout of FIG. 8, and FIG. 10 shows a layout of a fourth source metal layer in addition to the layout of FIG. 9. FIG. 11 shows a layout of a fifth source metal layer in addition to the layout of FIG. 10.

Referring to FIGS. 8 to 14, the initialization voltage line VIL, the $k^{th}$ initialization scan line GILk, the $k^{th}$ write scan line GWLk, the $k^{th}$ PWM light emitting line PWELk, the first horizontal power supply line HVDL, the gate-off voltage line VGHL, the $k^{th}$ sweep signal line SWPLk, the $k^{th}$ control scan line GCLk, the $k^{th}$ PAM light emitting line PAELk, the test signal line TSTL, and the second power supply line VSL may be extended in the first direction DR1. The initialization voltage line VIL, the $k^{th}$ initialization scan line GILk, the $k^{th}$ write scan line GWLk, the $k^{th}$ PWM light emitting line PWELk, the first horizontal power supply line HVDL, the gate-off voltage line VGHL, the $k^{th}$ sweep signal line SWPLk, the $k^{th}$ control scan line GCLk, the $k^{th}$ PAM light emitting line PAELk, the test signal line TSTL, and the second power supply line VSL may be spaced from each other in the second direction DR2.

The $j^{th}$ data line DLj, a $j+1^{th}$ data line DLj+1, a $j+2^{th}$ data line DLj+2, a first vertical power supply line VVDL, the first PAM data line RDL, a second PAM data line GDL, and a third PAM data line BDL may be extended in the second direction DR2. The $j^{th}$ data line DLj, the $j+1^{th}$ data line DLj+1, the $j+2^{th}$ data line DLj+2, the first vertical power supply line VVDL, the first PAM data line RDL, the second PAM data line GDL, and the third PAM data line BDL may be disposed to be spaced from each other in the first direction DR1.

The third power supply line VDL2 may include a first horizontal power supply line HVDL and the first vertical power supply line VVDL. Therefore, the third power voltage VDD2 may be applied to the first horizontal power supply line HVDL and the first vertical power supply line VVDL.

In order to increase the transmittance of each of the plurality of transmission areas TA, a length in the first direction DR1 of the wiring area LA disposed between the adjacent transmission areas TA in the first direction DR1 may be smaller than a length of each of the pixels PX in the first direction DR1. Especially, as the length in the first direction DR1 of the wiring area LA disposed between the adjacent transmission areas TA in the first direction DR1 reduces, the area of the transmission area TA increases. Therefore, a gap between the $j^{th}$ data line DLj and the $j+1^{th}$ data line DLj+1 adjacent to each other in the wiring area LA and a gap between the $j+1^{th}$ data line DLj+1 and the $j+2^{th}$ data line DLj+2 adjacent to each other may be smaller than that of the pixel PX. Also, a gap between the first PAM data line RDL and the second PAM data line GDL and a gap between the second PAM data line GDL and the third PAM data line BDL adjacent to each other in the wiring area LA may be smaller than that of the pixel PX.

Furthermore, the first vertical power supply line VVDL overlapping the first pixel driver PXC1 may be connected to the first vertical power supply line VVDL overlapping the second pixel driver PXC2 through a first power bridge VBE1. The first power bridge VBE1 may be connected to the first vertical power supply line VVDL overlapping the first pixel circuit unit PXC1 through the first bridge hole BH1 and the first vertical power supply line VVDL overlapping the second pixel circuit unit PXC2 through the second bridge hole BH2. The first power bridge VBE1 may overlap the first PAM data line RDL.

In addition, the first vertical power supply line VVDL overlapping the third pixel circuit unit PXC3 may be connected to the first vertical power supply line VVDL overlapping the second pixel circuit unit PXC2 through the second power bridge VBE2. The second power bridge VBE2 may be connected to the first vertical power supply line VVDL overlapping the third pixel circuit unit PXC3 through the third bridge hole BH3 and the first vertical power supply line VVDL overlapping the second pixel circuit unit PXC2 through a fourth bridge hole BH4. The second power bridge VBE2 may overlap the $j+2^{th}$ data line DLj+2.

The first sub-pixel RP includes the first to nineteenth transistors T1 to T19, the first to sixth capacitor electrodes CE1 to CE6, the first to fifth gate connection electrodes GCE1 to GCE5, the first and second data connection electrodes DCE1 and DCE2, the first to seventh connection electrodes CCE1 to CCE7, a first pad connection electrode ANDE1, and a light emitting element EL.

The first transistor T1 includes a first channel CH1, a first gate electrode G1, a first source electrode S1, and a first drain electrode D1. The first channel CH1 may overlap the first gate electrode G1 in a third direction DR3 (e.g., a thickness direction). The first gate electrode G1 may be connected to a first connection electrode CCE1 through a first contact hole CT1. The first gate electrode G1 may be integrally formed with a first capacitor electrode CE1. The first gate electrode G1 may overlap a second capacitor electrode CE2 in the third direction DR3. The first source electrode S1 may be connected to a second drain electrode D2 and a fifth drain electrode D5. The first drain electrode D1 may be connected to a third sub-source electrode S41 and a sixth source electrode S6. The first source electrode S1 and the first drain electrode D1 may overlap the second capacitor electrode CE2 in the third direction DR3.

The second transistor T2 includes a second channel CH2, a second gate electrode G2, a second source electrode S2, and a second drain electrode D2. The second channel CH2 may overlap the second gate electrode G2 in the third direction DR3. The second gate electrode G2 may be integrally formed with a first gate connection electrode GCE1. The second source electrode S2 may be connected to a first data connection electrode DCE1 through a first data contact hole DCT1. The second drain electrode D2 may be connected to the first source electrode S1.

The first sub-transistor T31 of the third transistor T3 includes a first sub-channel CH31, a first sub-gate electrode G31, a first sub-source electrode S31, and a first sub-drain electrode D31. The first sub-channel CH31 may overlap the first sub-gate electrode G31 in the third direction DR3. The first sub-gate electrode G31 may be integrally formed with a second gate connection electrode GCE2. The first sub-source electrode S31 may be connected to a fourth sub-drain electrode D42, and the first sub-drain electrode D31 may be connected to a second sub-source electrode S32. The first sub-source electrode S31 may overlap the $k^{th}$ write scan line GWLk in the third direction DR3. A first sub-drain electrode D31 may overlap the initialization voltage line VIL in the third direction DR3.

The second sub-transistor T32 of the third transistor T3 includes a second sub-channel CH32, a second sub-gate electrode G32, a second sub-source electrode S32, and a second sub-drain electrode D32. The second sub-channel CH32 may overlap the second sub-gate electrode G32 in the third direction DR3. The second sub-gate electrode G32 may be integrally formed with a second gate connection electrode GCE2. The second sub-source electrode S32 may be connected to the first sub-drain electrode D31, and the second sub-drain electrode D32 may be connected to the initialization voltage line VIL through a first power contact hole VCT1. The second sub-source electrode S32 and the second sub-drain electrode D32 may overlap the initialization voltage line VIL in the third direction DR3.

The third sub-transistor T41 of the fourth transistor T4 includes a third sub-channel CH41, a third sub-gate electrode G41, a third sub-source electrode S41, and a third sub-drain electrode D41. The third sub-channel CH41 may overlap a third sub-gate electrode G41 in the third direction DR3. The third sub-gate electrode G41 may be integrally formed with the first gate connection electrode GCE1. The third sub-source electrode S41 may be connected to the first drain electrode D1, and the third sub-drain electrode D41 may be connected to a fourth sub-source electrode S42.

The fourth sub-transistor T42 of the fourth transistor T4 includes a fourth sub-channel CH42, a fourth sub-gate electrode G42, the fourth sub-source electrode S42, and the fourth sub-drain electrode D42. The fourth sub-channel CH42 may overlap the fourth sub-gate electrode G42 in the third direction DR3. The fourth sub-gate electrode G42 may be integrally formed with the first gate connection electrode GCE1. The fourth sub-source electrode S42 may be connected to the third sub-drain electrode D41, and the fourth sub-drain electrode D42 may be connected to the first sub-source electrode S31.

The fifth transistor T5 includes a fifth channel CH5, a fifth gate electrode G5, a fifth source electrode S5, and a fifth drain electrode D5. The fifth channel CH5 may overlap the fifth gate electrode G5 in the third direction DR3. The fifth gate electrode G5 may be integrally formed with a sixth gate connection electrode GCE6. The fifth source electrode S5 may be connected to the first horizontal power supply line HVDL through a second power contact hole VCT2. The fifth drain electrode D5 may be connected to the first source electrode S1. The fifth drain electrode D5 may overlap an extension portion EX of the second capacitor electrode CE2 in the third direction DR3.

The sixth transistor T6 includes a sixth channel CH6, a sixth gate electrode G6, a sixth source electrode S6, and a sixth drain electrode D6. The sixth channel CH6 may overlap the sixth gate electrode G6 in the third direction DR3. The sixth gate electrode G6 may be integrally formed with the sixth gate connection electrode GCE6. The sixth source electrode S6 may be connected to the first drain electrode D1. The sixth drain electrode D6 may be connected to a fourth connection electrode CCE4 through a tenth contact hole CT10. The sixth drain electrode D6 may overlap a second connection electrode CCE2 and the first horizontal power supply line HVDL in the third direction DR3.

The seventh transistor T7 includes a seventh channel CH7, a seventh gate electrode G7, a seventh source electrode S7, and a seventh drain electrode D7. The seventh channel CH7 may overlap the seventh gate electrode G7 in the third direction DR3. The seventh gate electrode G7 may be integrally formed with a third gate connection electrode GCE3. The seventh gate electrode G7 may overlap the initialization voltage line VIL in the third direction DR3. The seventh source electrode S7 may be connected to the gate-off voltage line VGHL through a seventh contact hole CT7. The seventh drain electrode D7 may be connected to the $k^{th}$ sweep signal line SWPLk through a sixth contact hole CT6.

The eighth transistor T8 includes an eighth channel CH8, an eighth gate electrode G8, an eighth source electrode S8, and an eighth drain electrode D8. The eighth channel CH8 may overlap the eighth gate electrode G8 in the third direction DR3. The eighth gate electrode G8 may be extended in the second direction DR2. The eighth gate electrode G8 may be integrally formed with a third capacitor electrode CE3. The eighth source electrode S8 may be connected to a ninth drain electrode D9 and a twelfth drain electrode D12. The eighth drain electrode D8 may be connected to a seventh sub-source electrode S111.

The ninth transistor T9 includes a ninth channel CH9, a ninth gate electrode G9, a ninth source electrode S9, and a ninth drain electrode D9. The ninth channel CH9 may overlap the ninth gate electrode G9 in the third direction DR3. The ninth gate electrode G9 may be extended in the second direction DR2. The ninth gate electrode G9 may be integrally formed with the first gate connection electrode GCE1. The ninth source electrode S9 may be connected to a second data connection electrode DCE2 through a third data contact hole DCT3. The ninth drain electrode D9 may be connected to an eighth source electrode D8.

The fifth sub-transistor T101 of the tenth transistor T10 includes a fifth sub-channel CH101, a fifth sub-gate electrode G101, a fifth sub-source electrode S101, and a fifth sub-drain electrode D101. The fifth sub-channel CH101 may overlap the fifth sub-gate electrode G101 in the third direction DR3. The fifth sub-gate electrode G101 may be integrally formed with the second gate connection electrode GCE2. The fifth sub-source electrode S101 may be connected to an eighth sub-drain electrode D112, and the fifth sub-drain electrode D101 may be connected to a sixth sub-source electrode S102. The fifth sub-source electrode S101 may overlap the $k^{th}$ write scan line GWLk in the third direction DR3. The fifth sub-drain electrode D102 may overlap the initialization voltage line VIL in the third direction DR3.

The sixth sub-transistor T102 of the tenth transistor T10 includes a sixth sub-channel CH102, a sixth sub-gate electrode G102, the sixth sub-source electrode S102, and a sixth sub-drain electrode D102. The sixth sub-channel CH102 may overlap the sixth sub-gate electrode G102 in the third direction DR3. The sixth sub-gate electrode G102 may be integrally formed with the second gate connection electrode GCE2. The sixth sub-source electrode S102 may be connected to the fifth sub-drain electrode D101, and the sixth sub-drain electrode D102 may be connected to the initialization voltage line VIL through the first power contact hole VCT1. The sixth sub-source electrode S102 and the sixth sub-drain electrode D102 may overlap the initialization voltage line VIL in the third direction DR3.

The seventh sub-transistor T111 of the eleventh transistor T11 includes a seventh sub-channel CH111, a seventh sub-gate electrode G111, a seventh sub-source electrode S111, and a seventh sub-drain electrode D111. The seventh sub-channel CH111 may overlap the seventh sub-gate electrode G111 in the third direction DR3. The seventh sub-gate electrode G111 may be integrally formed with the first gate connection electrode GCE1. The seventh sub-source electrode S111 may be connected to the eighth drain electrode D8, and the seventh sub-drain electrode D111 may be connected to an eighth sub-source electrode S112.

The eighth sub-transistor T112 of the eleventh transistor T11 includes an eighth sub-channel CH112, an eighth sub-gate electrode G112, the eighth sub-source electrode S112, and the eighth sub-drain electrode D112. The eighth sub-channel CH112 may overlap the eighth sub-gate electrode G112 in the third direction DR3. The eighth sub-gate electrode G112 may be integrally formed with the first gate connection electrode GCE1. The eighth sub-source electrode S112 may be connected to the seventh sub-drain electrode D111, and the eighth sub-drain electrode D112 may be connected to the fifth sub-source electrode S101.

The twelfth transistor T12 includes a twelfth channel CH12, a twelfth gate electrode G12, a twelfth source electrode S12, and the twelfth drain electrode D12. The twelfth channel CH12 may overlap the twelfth gate electrode G12 in the third direction DR3. The twelfth gate electrode G12 may be integrally formed with the sixth gate connection electrode GCE6. The twelfth source electrode S12 may be connected to a fifth connection electrode CCE5 through an eleventh contact holes CT11.

The thirteenth transistor T13 includes a thirteenth channel CH13, a thirteenth gate electrode G13, a thirteenth source electrode S13, and a thirteenth drain electrode D13. The thirteenth channel CH13 may overlap the thirteenth gate electrode G13 in the third direction DR3. The thirteenth gate electrode G13 may be integrally formed with the third gate connection electrode GCE3. The thirteenth source electrode S13 may be connected to the first horizontal power supply line HVDL through the second power contact hole VCT2. The thirteenth drain electrode D13 may be connected to the second connection electrode CCE2 through a third contact hole CT3.

The fourteenth transistor T14 includes a fourteenth channel CH14, a fourteenth gate electrode G14, a fourteenth source electrode S14, and a fourteenth drain electrode D14. The fourteenth channel CH14 may overlap the fourteenth gate electrode G14 in the third direction DR3. The fourteenth gate electrode G14 may be integrally formed with the sixth gate connection electrode GCE6. The fourteenth source electrode S14 may be connected to the fifth connection electrode CCE5 through the eleventh contact holes CT11. The fourteenth drain electrode D14 may be connected to the second connection electrode CCE2 through a fourth contact hole CT4.

The fifteenth transistor T15 includes a fifteenth channel CH15, a fifteenth gate electrode G15, a fifteenth source electrode S15, and a fifteenth drain electrode D15. The fifteenth channel CH15 may overlap the fifteenth gate electrode G15 in the third direction DR3. The fifteenth gate electrode G15 may be integrally formed with a fifth capacitor electrode CE5. The fifteenth source electrode S15 may be connected to a ninth drain electrode D9. The fifteenth drain electrode D15 may be connected to a seventeenth source electrode S17.

The ninth sub-transistor T161 of the sixteenth transistor T16 includes a ninth sub-channel CH161, a ninth sub-gate electrode G161, a ninth sub-source electrode S161, and a ninth sub-drain electrode D161. The ninth sub-channel CH161 may overlap the ninth sub-gate electrode G161 in the third direction DR3. The ninth sub-gate electrode G161 may be integrally formed with the third gate connection electrode GCE3. The ninth sub-source electrode S161 may be connected to the fourth connection electrode CCE4 through the tenth contact hole CT10, and the ninth sub-drain electrode D161 may be connected to a tenth sub-source electrode S162.

The tenth sub-transistor T162 of the sixteenth transistor T16 includes a tenth sub-channel CH162, a tenth sub-gate electrode G162, a tenth sub-source electrode S162, and a tenth sub-drain electrode D162. The tenth sub-channel CH162 may overlap the tenth sub-gate electrode G162 in the third direction DR3. The tenth sub-gate electrode G162 may be integrally formed with the third gate connection electrode GCE3. The tenth sub-source electrode S162 may be connected to the ninth sub-drain electrode D161, and the tenth sub-drain electrode D162 may be connected to the initialization voltage line VIL through a ninth contact hole CT9.

The seventeenth transistor T17 includes a seventeenth channel CH17, a seventeenth gate electrode G17, a seventeenth source electrode S17, and a seventeenth drain electrode D17. The seventeenth channel CH17 may overlap the seventeenth gate electrode G17 in the third direction DR3. The seventeenth gate electrode G17 may be integrally formed with a fifth gate connection electrode GCE5. The seventeenth source electrode S17 may be connected to the fifteenth drain electrode D15. The seventeenth drain electrode D17 may be connected to a seventh connection electrode CCE7 through a sixteenth contact holes CT16.

The eighteenth transistor T18 includes an eighteenth channel CH18, an eighteenth gate electrode G18, an eighteenth source electrode S18, and an eighteenth drain electrode D18. The eighteenth channel CH18 may overlap the eighteenth gate electrode G18 in the third direction DR3. The eighteenth gate electrode G18 may be integrally formed with the third gate connection electrode GCE3. The eighteenth source electrode S18 may be connected to the initialization voltage line VIL through the ninth contact hole CT9. The eighteenth drain electrode D18 may be connected to the seventh connection electrode CCE7 through the sixteenth contact holes CT16.

The nineteenth transistor T19 includes a nineteenth channel CH19, a nineteenth gate electrode G19, a nineteenth source electrode S19, and a nineteenth drain electrode D19. The nineteenth channel CH19 may overlap the nineteenth gate electrode G19 in the third direction DR3. The nineteenth gate electrode G19 may be connected to the test signal line TSTL through a twenty-third contact hole CT23. The nineteenth source electrode S19 may be connected to a third connection electrode CCE3 through a twenty-first contact hole CT21. The nineteenth drain electrode D19 may be connected to the second power supply line VSL through a twenty-fourth contact hole CT24.

The first capacitor electrode CE1 may be integrally formed with the first gate electrode G1. The second capacitor electrode CE2 may overlap the first capacitor electrode CE1 in the third direction DR3. The first capacitor electrode CE1 may be one electrode of the first capacitor C1, and the second capacitor electrode CE2 may be the other electrode of the first capacitor C1.

The second capacitor electrode CE2 includes a hole exposing the first gate electrode G1 and the first connection electrode CCE1 may be connected to the first gate electrode G1 through the first contact hole CT1 in the hole.

The second capacitor electrode CE2 may include an extension EX extending in the second direction DR2. The extension EX of the second capacitor electrode CE2 may cross the $k^{th}$ PWM light emitting line PWELk and a first horizontal voltage line HVDL. The extension EX of the second capacitor CE2 may be connected to the $k^{th}$ sweep signal line SWPLk through a fifth contact hole CT5.

The third capacitor electrode CE3 may be formed integrally with the eighth gate electrode G8. A fourth capacitor electrode CE4 may overlap the third capacitor electrode CE3 in the third direction DR3. The third capacitor electrode CE3 may be one electrode of the second capacitor C2 and the fourth capacitor electrode CE4 may be the other electrode of the second capacitor C2.

The fourth capacitor electrode CE4 includes the hole exposing the eighth gate electrode G8 and a sixth connection electrode CCE6 may be connected to the eighth gate electrode G8 through a twelfth contact hole CT12 in the hole.

The fifth capacitor electrode CE5 may be integrally formed with a fourth gate connection electrode GCE4 and the fifteenth gate electrode G15. A sixth capacitor electrode CE6 may overlap the fifth capacitor electrode CE5 in the third direction DR3. The fifth capacitor electrode CE5 may be one electrode of the third capacitor C3 and the sixth capacitor electrode CE6 may be the other electrode of the third capacitor C3. The sixth capacitor electrode CE6 may be connected to the initialization voltage line VIL through an eighteenth contact hole CT18.

The first gate connection electrode GCE1 may be connected to the $k^{th}$ write scan line GWLk through a first gate contact hole GCT1 and a third gate contact hole GCT3. The second gate connection electrode GCE2 may be connected to the $k^{th}$ initialization scan line GILk through a second gate contact hole GCT2. The third gate connection electrode GCE3 may be connected to the $k^{th}$ control scan line GCLk through an eighth contact hole CT8. The fourth gate connection electrode GCE4 may be connected to the fourth connection electrode CCE4 through a seventeenth contact hole CT17. The fifth gate connection electrode GCE5 may be connected to the $k^{th}$ PAM light emitting line PAELk through a nineteenth contact hole CT19. The sixth gate connection electrode GCE6 may be connected to the $k^{th}$ PWM light emitting line PWELk through a fourteenth contact hole CT14.

The first data connection electrode DCE1 may be connected to the second source electrode S2 through the first data contact hole DCT1 and may be connected to the $j^{th}$ data line DLj through a second data contact hole DCT2. The second data connection electrode DCE2 may be connected to the ninth source electrode S9 through the third data contact hole DCT3 and may be connected to the first PAM data line RDL through a fourth data contact hole DCT4.

The first connection electrode CCE1 may be extended in the second direction DR2. The first connection electrode CCE1 may be connected to the first gate electrode G1 through the first contact hole CT1 and may be connected to the first sub-source electrode S31 and the fourth sub-drain electrode D42 through a second contact hole CT2.

The second connection electrode CCE2 may be extended in the first direction DR1. The second connection electrode CCE2 may be connected to the twelfth drain electrode D12 through the third contact hole CT3, may be connected to the fourteenth drain electrode D14 through a fourteenth contact hole CT4, and may be connected to the fourth capacitor electrode CE4 through a fifteenth contact hole CT15.

The third connection electrode CCE3 may be connected to the nineteenth source electrode S19 through the twenty-first contact hole CT21 and may be connected to the first pad connection electrode ANDE1 through a twenty-second contact hole CT22.

The fourth connection electrode CCE4 may be extended in the first direction DR1. The fourth connection electrode CCE4 may be connected to the sixth drain electrode D6 and the ninth sub-source electrode S161 through the tenth contact hole CT10 and may be connected to the fourth gate connection electrode GCE4 through the seventeenth contact hole CT17.

The fifth connection electrode CCE5 may be extended in the first direction DR1. The fifth connection electrode CCE5 may be connected to the twelfth source electrode S12 and the fourteenth source electrode S14 through the eleventh contact holes CT11 and may be connected the fourth capacitor electrode CE4 through a fourth power contact hole VDCT4.

The sixth connection electrode CCE6 may be extended in the second direction DR2. The sixth connection electrode CCE6 may be connected to the third capacitor electrode CE3 through the twelfth contact hole CT12 and may be connected to the fifth sub-source electrode S101 and the eighth sub-drain electrode through a thirteenth contact hole CT13.

The seventh connection electrode CCE7 may be connected to the seventeenth drain electrode D17 and the eighteenth drain electrode D18 through the sixteenth contact holes CT16. The seventh connection electrode CCE7 may be connected to the first pad connection electrode ANDE1 through a twentieth contact hole CT20.

The first pad connection electrode ANDE1 may be extended in the second direction DR2. The first pad connection electrode ANDE1 may be connected to the seventh connection electrode CCE7 through the twentieth contact hole CT20 and may be connected to the third connection electrode CCE3 through the twenty-second contact hole CT22.

A second pad connection electrode ANDE2 may be connected to the first pad connection electrode ANDE1 through a twenty-fifth contact hole CT25.

The first anode pad electrode APD1 may be connected to the second pad connection electrode ANDE2 through a twenty-sixth contact hole CT26.

A first supplement electrode SPE1 may overlap the first anode pad electrode APD1 in the third direction DR3 and the second supplement electrode SPE2 may overlap the first cathode pad electrode CPD1 in the third direction DR3.

A power connection electrode VDCE may be extended in the second direction DR2. The power connection electrode VDCE may be connected to the fifth connection electrode CCE5 through a fourth power contact hole VCT4.

According to one or more embodiments, a layout of the second sub-pixel GP and a layout of the third sub-pixel BP may be substantially the same as the first sub-pixel RP described with reference to FIGS. 12 to 14. Therefore, the description of the layout of the second sub-pixel GP and the layout of the third sub-pixel BP according to one or more embodiments will be omitted.

Figure 15:
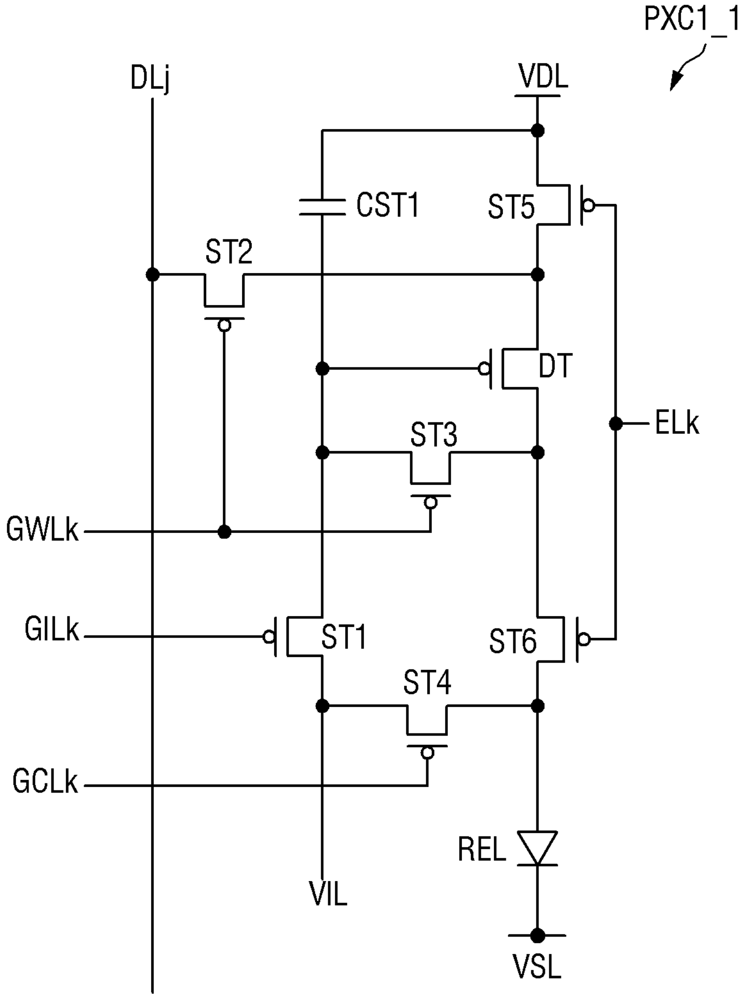
FIG. 15 is a circuit diagram illustrating a first pixel circuit unit and a first light emitting element according to one or more embodiments.

FIG. 15 is a circuit diagram illustrating the first pixel circuit unit and the first light emitting element according to one or more embodiments.

Referring to FIG. 15, a first pixel circuit unit PXC1_1 according to one or more embodiments may be connected to the $k^{th}$ initialization scan line GILk, the $k^{th}$ write scan line GWLk, and the $k^{th}$ control scan line GCLk. Further, the first pixel circuit unit PXC1_1 may be connected to the $j^{th}$ data line DLj, the first power supply line VDL to which the first power voltage is applied, the second power supply line VSL to which the second power voltage is applied, and the initialization voltage line VIL to which the initialization voltage is supplied.

The first pixel circuit unit PXC1_1 may include a driving transistor DT, switch elements, and a capacitor CST1. The switch elements include the first to sixth transistors ST1, ST2, ST3, ST4, ST5, and ST6.

The first light emitting element REL emits light in response to the driving current of the driving transistor DT. As the driving current increases, the amount of light emission from the first light emitting element REL may increase. The first electrode of the first light emitting element REL may be connected to the first electrode of the fourth transistor ST4 and the second electrode of the sixth transistor ST6, and the second electrode may be connected to the second power supply line VSL.

The driving transistor DT controls a driving current flowing between the first electrode and the second electrode in response to the voltage (e.g., data voltage) applied to the gate electrode.

A first transistor ST1 is turned-on by the initialization scan signal of the $k^{th}$ initialization scan line GILk to connect the gate electrode of the driving transistor DT to the initialization voltage line VIL. Accordingly, the initialization voltage of the initialization voltage line VIL may be applied to the gate electrode of the driving transistor DT.

A second transistor ST2 is turned-on by the write scan signal of the $k^{th}$ write scan line GWLk to connect the first electrode of the driving transistor DT to a $j^{th}$ data line DLj. Accordingly, the data voltage of the $j^{th}$ data line DLj may be applied to the first electrode of the driving transistor DT.

A third transistor ST3 is turned-on by the write scan signal of the $k^{th}$ write scan line GWLk to connect the gate electrode and the second electrode of the driving transistor DT. When the gate electrode and the second electrode of the driving transistor DT are connected, the driving transistor DT is driven as a diode.

A fourth transistor ST4 is turned-on by the control scan signal of the $k^{th}$ control scan line GCLk to connect the first electrode of the first light emitting element REL to the initialization voltage line VIL. The initialization voltage of the initialization voltage line VIL may be applied to the first electrode of the first light emitting element REL.

A fifth transistor ST5 is turned-on by the light emission signal of the $k^{th}$ light emitting line ELk to connect the first electrode of the driving transistor DT to the first power supply line VDL. The gate electrode of the fifth transistor ST5 is connected to the $k^{th}$ light emitting line ELk, the first electrode is connected to the first power supply line VDL, and the second electrode is connected to the first electrode of the driving transistor DT.

A sixth transistor ST6 is disposed between the second electrode of the driving transistor DT and the first electrode of the first light emitting element REL. The sixth transistor ST6 is turned-on by the emission control signal of the $k^{th}$ light emitting line ELk to connect the second electrode of the driving transistor DT to the first electrode of the first light emitting element REL.

When both the fifth transistor ST5 and the sixth transistor ST6 are turned-on, the driving current of the driving transistor DT in response to the data voltage applied to the gate electrode of the driving transistor DT may flow to the first light emitting element REL.

The capacitor CST1 is formed between the gate electrode of the driving transistor DT and the first power supply line VDL. The first capacitor electrode of the capacitor CST1 may be connected to the gate electrode of the driving transistor DT and the second capacitor electrode may be connected to the first power supply line VDL.

When the first electrode of each of the first to sixth transistors ST1, ST2, ST3, ST4, ST5, and ST6 and the driving transistor DT is a source electrode, the second electrode may be a drain electrode. Alternatively, when the first electrode of each of the first to sixth transistors ST1, ST2, ST3, ST4, ST5, and ST6 and the driving transistor DT is a drain electrode, the second electrode may be a source electrode.

The active layer of each of the first to sixth transistors ST1, ST2, ST3, ST4, ST5, and ST6 and the driving transistor DT may be formed of any one of polysilicon, amorphous silicon, and an oxide semiconductor. In FIG. 15, the first to sixth transistors ST1, ST2, ST3, ST4, ST5, and ST6 and the driving transistor DT have been mainly described as being formed of a P-type MOSFET, but the present disclosure is not limited thereto. For example, the first to sixth transistors ST1, ST2, ST3, ST4, ST5, and ST6 and the driving transistor DT may be formed of an N-type MOSFET. Alternatively, at least one of the first to sixth transistors ST1, ST2, ST3, ST4, ST5, and ST6 and the driving transistor DT may be formed of an N-type MOSFET.

In one or more embodiments, the second pixel circuit unit PXC2 and the third pixel circuit unit PXC3 according to one or more embodiments may be substantially the same as the first pixel circuit unit PXC1_1 described with reference to FIG. 15. Therefore, a description of the second pixel circuit unit PXC2 and the third pixel circuit unit PXC3 according to one or more embodiments will be omitted.

As shown in FIG. 15, when the first pixel circuit unit PXC1_1, the second pixel circuit unit PXC2, and the third pixel circuit unit PXC3 include seven transistors DT and ST1 to ST6 and one capacitor CST1, the area of the first pixel circuit unit PXC1_1, the area of the second pixel circuit unit PXC2 and the area of the third pixel circuit unit PXC3 may decrease and the area of the transmission area TA may increase than the case including nineteen transistors T1 to T19 and three capacitors C1 to C3 as shown in FIG. 6. Therefore, the ratio of the area of the transmission area TA to the area of the display device 10 may be increased, so that the background or object on the rear surface of the display device 10 may be seen more clearly.

Figure 16:
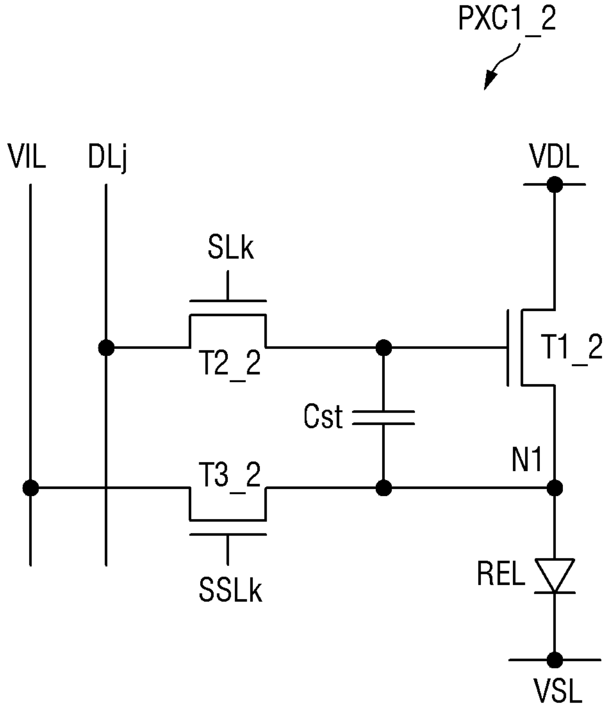
FIG. 16 is a circuit diagram illustrating a first pixel circuit unit and a first light emitting element according to one or more embodiments.

FIG. 16 is a circuit diagram illustrating a first pixel circuit unit and a first light emitting element according to one or more embodiments.

Referring to FIG. 16, a first pixel circuit unit PXC1_2 according to one or more embodiments may be connected to a $k^{th}$ scan line SLk and a $k^{th}$ sensing scan line SSLk. Further, the first pixel circuit unit PXC1_2 may be connected to the $j^{th}$ data line DLj, the first power supply line VDL to which the first power voltage is applied, the second power supply line VSL to which the second power voltage is applied, and the initialization voltage line VIL to which an initialization voltage is supplied.

The first pixel circuit unit PXC1_2 may include the first to third transistors T1_2, T2_2, and T2_3 and a capacitor Cst.

A first transistor T1_2 may be a driving transistor that adjusts a driving current flowing from the first power supply line VDL to the second power supply line VSL through the first light emitting element REL according to a voltage difference between the gate electrode and the source electrode of the first transistor T1_2. A second transistor T2_2 supplies the data voltage of the $j^{th}$ data line DLj to the gate electrode of the first transistor T1 according to the scan signal of the $k^{th}$ scan line SLk. A third transistor T3_2 controls the connection between the initialization voltage line VIL and the first electrode of the first light emitting element REL according to the sensing scan signal of the $k^{th}$ sensing scan line SSLk.

The first electrode of each of the first to third transistors T1_2, T2_2, and T3_2 may be a source electrode and the second electrode may be a drain electrode, but embodiments of the present disclosure are not limited thereto. That is, the first electrode of each of the first to third transistors T1_2, T2_2, and T3_2 may be a drain electrode, and the second electrode may be a source electrode.

The capacitor Cst is disposed between the gate electrode and the first electrode of the first transistor T1_1. The capacitor Cst stores the difference voltage between the gate electrode and the first electrode of the first transistor T1.

The first to third transistors T1_2, T2_2, and T3_2 may be formed of thin film transistors (TFTs). Also, in FIG. 16, the first to third transistors T1_2, T2_2, and T3_2 are mainly described as being formed of an N-type MOSFET (Metal Oxide Semiconductor Field Effect Transistor), but it should be noted that the present disclosure is not limited thereto. The first to third transistors T1_2, T2_2, and T3_2 may be formed of a P-type MOSFET.

As shown in FIG. 16, when the first pixel circuit unit PXC1_2, the second pixel circuit unit PXC2, and the third pixel circuit unit PXC3 include three transistors T1_2 to T3_2 and one capacitor Cst, the area of the first pixel circuit unit PXC1_2, the area of the second pixel circuit unit PXC2, and the area of the third pixel circuit unit PXC3 may be decreased and the area of the transmission area TA may be increased than the case including nineteen transistors T1 to T19 and three capacitors C1 to C3 as shown in FIG. 6. Therefore, the ratio of the area of the transmission area TA to the area of the display device 10 may be increased, so that the background or object on the rear surface of the display device 10 may be seen more clearly.

Figure 17:
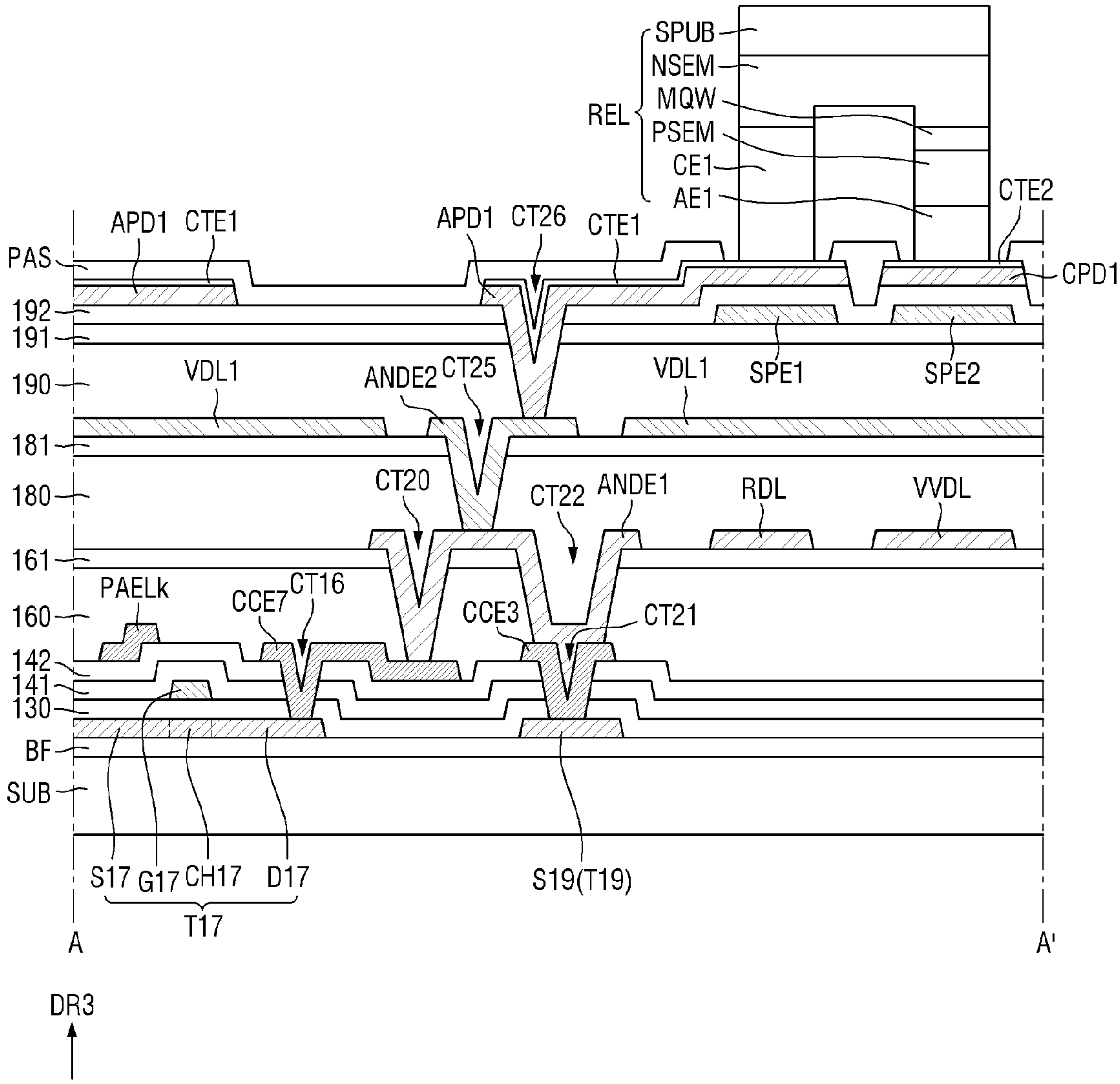
FIGS. 17 and 18 are cross-sectional views illustrating an example of a display panel taken along the line A-A' of FIG. 8.
Figure 18:
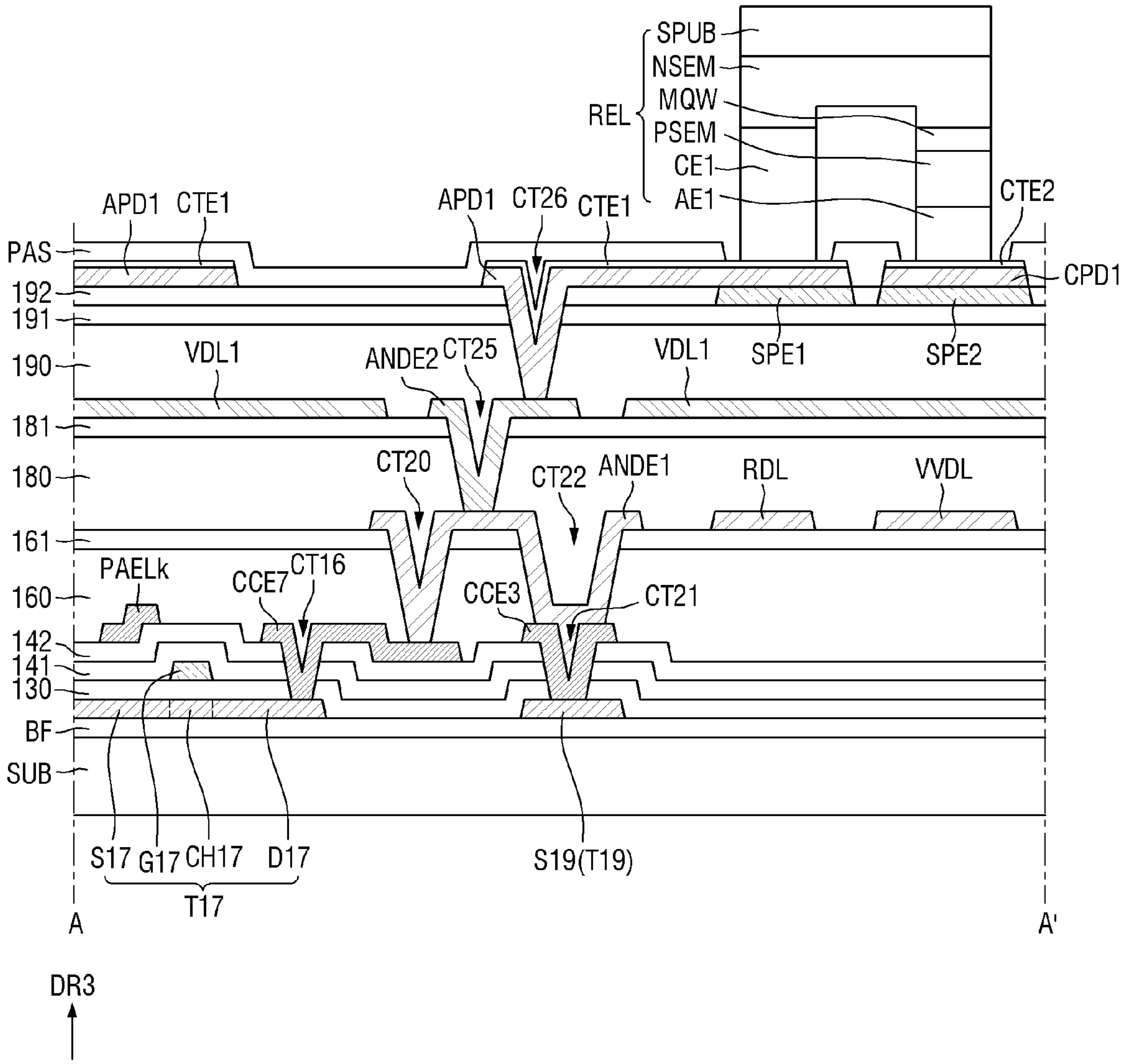
Figure 19:
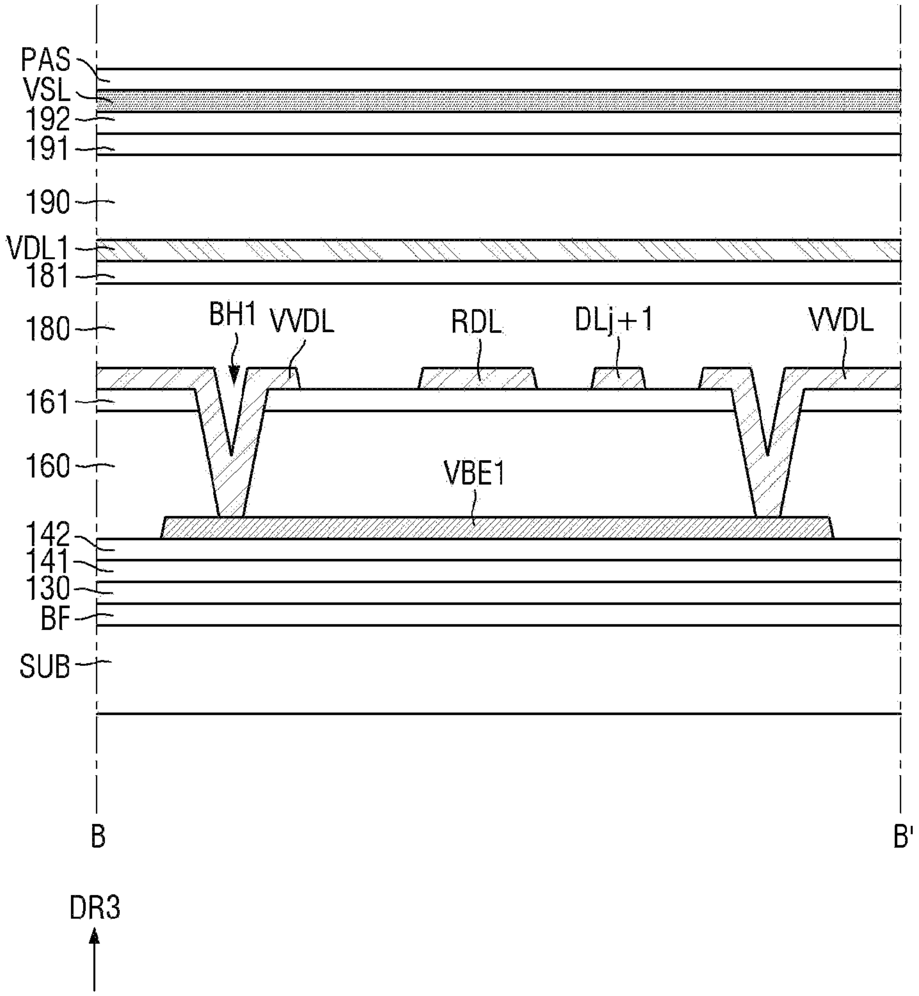
FIG. 19 is a cross-sectional view illustrating an example of a display panel taken along the line B-B' of FIG. 8.

FIGS. 17 and 18 are cross-sectional views illustrating an example of the display panel taken along the line A-A' of FIG. 8. FIG. 19 is a cross-sectional view illustrating an example of the display panel taken along the line B-B' of FIG. 8.

Referring to FIGS. 17 to 19, the display panel 100 may include a substrate SUB, a thin film transistor layer TFTL, and a light emitting element layer EML.

A buffer layer BF may be disposed on the substrate SUB. The substrate SUB may be made of an insulating material such as glass or polymer resin. For example, when the substrate SUB is made of a polymer resin, it may include polyimide. The substrate SUB may be a flexible substrate capable of bending, folding, rolling, or the like.

The buffer layer BF is a layer for protecting the transistors of the thin film transistor layer TFTL and a light emitting element REL of the light emitting element layer EML from moisture penetrating through the substrate SUB, which is vulnerable to moisture permeation. The buffer layer BF may be formed of a plurality of inorganic layers alternately stacked. For example, the buffer layer BF may be formed as a multilayer in which one or more inorganic layers of a silicon nitride layer, a silicon oxynitride layer, a silicon oxide layer, a titanium oxide layer, and an aluminum oxide layer are alternately stacked.

The active layer may be disposed on the buffer layer BF. The active layer includes channels, source electrodes, and drain electrodes of the first to nineteenth transistors T1 to T19. The active layer may include polycrystalline silicon, single crystal silicon, low-temperature polycrystalline silicon, amorphous silicon, or an oxide semiconductor.

The channels of the first to nineteenth transistors T1 to T19 may respectively overlap the gate electrodes in the third direction DR3. The source electrodes and drain electrodes of the first to nineteenth transistors T1 to T19 may not overlap the gate electrodes in the third direction DR3. The source electrodes and drain electrodes of the first to nineteenth transistors T1 to T19 may be conductive areas obtained by doping a silicon semiconductor or an oxide semiconductor with ions.

A gate insulating layer 130 may be disposed on the active layer. The gate insulating layer 130 may be formed of an inorganic layer, for example, a silicon nitride layer, a silicon oxynitride layer, a silicon oxide layer, a titanium oxide layer, or an aluminum oxide layer.

The first gate metal layer may be disposed on the gate insulating layer 130. The first gate metal layer includes the first to nineteenth gate electrodes G1 to G19 of the first to nineteenth transistors T1 to T19, the first capacitor electrode CE1, the third capacitor electrode CE3, the fifth capacitor electrode CE5 and first to sixth gate connection electrodes GCE1 to GCE6. The first to nineteenth gate electrodes G1 to G19, the first capacitor electrode CE1, the third capacitor electrode CE3, the fifth capacitor electrode CE5, and the first to sixth gate connection electrodes GCE1 to GCE6 may be formed as a single layer or multiple layers made of any one of molybdenum (Mo), aluminum (Al), chromium (Cr), gold (Au), titanium (Ti), nickel (Ni), neodymium (Nd), and copper (Cu) or an alloy thereof.

A first interlayer insulating layer 141 may be disposed on the first gate metal layer. The first interlayer insulating layer 141 may be formed of an inorganic layer, for example, a silicon nitride layer, a silicon oxynitride layer, a silicon oxide layer, a titanium oxide layer, or an aluminum oxide layer.

The second gate metal layer may be disposed on the first interlayer insulating layer 141. The second gate metal layer may include the second capacitor electrode CE2, the fourth capacitor electrode CE4, and the sixth capacitor electrode CE6. The second gate metal layer may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

The second capacitor electrode CE2 may overlap the first capacitor electrode CE1 in the third direction DR3, the fourth capacitor electrode CE4 may overlap the third capacitor electrode CE3 in the third direction DR3, and the sixth capacitor electrode CE6 may overlap the fifth capacitor electrode CE5 in the third direction DR3. Because the first interlayer insulating layer 141 has a dielectric constant (e.g. a predetermined dielectric constant), the first capacitor C1 may be formed by the first capacitor electrode CE1, the second capacitor electrode CE2, and the first interlayer insulating layer 141 disposed therebetween. Further, the second capacitor C2 may be formed by the third capacitor electrode CE3, the fourth capacitor electrode CE4, and the first interlayer insulating layer 141 disposed therebetween.

A second interlayer insulating layer 142 may be disposed on the second gate metal layer. The second interlayer insulating layer 142 may be formed of an inorganic layer, for example, a silicon nitride layer, a silicon oxynitride layer, a silicon oxide layer, a titanium oxide layer, or an aluminum oxide layer.

The first source metal layer may be disposed on a second interlayer insulating layer 142. The first source metal layer may include an initialization voltage lines VIL, a $k^{th}$ scan initialization line GILk, a $k^{th}$ scan write line GWLk, the $k^{th}$ PWM emission line PWELk, the first horizontal power supply line HVDL, the gate-off voltage line VGHL, the $k^{th}$ sweep signal line SWPLk, the $k^{th}$ scan control line GCLk, the $k^{th}$ PAM emission line PAELk, the test signal line TSTL, and a third power supply line VSL. Further, the first source metal layer may include the first and second data connection electrodes DCE1 and DCE2 and the first to seventh connection electrodes CCE1 to CCE7. The first source metal layer may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

In one or more embodiments, the $k^{th}$ scan write line GWLk may be connected to the fourth sub-gate electrode G42 and the eighth sub-gate electrode G112 through the first gate contact hole GCT1 and the third gate contact hole GCT3, respectively, penetrating the first interlayer insulating layer 141 and the second interlayer insulating layer 142. The $k^{th}$ scan initialization line GILk may be connected to the second gate connection electrode GCE2 through the second gate contact hole GCT2 penetrating the first interlayer insulating layer 141 and the second interlayer insulating layer 142. The $k^{th}$ scan control line GCLk may be connected to the third gate connection electrode GCE3 through the eighth contact hole CT8 penetrating the first interlayer insulating layer 141 and the second interlayer insulating layer 142. The $k^{th}$ PAM emission line PAELk may be connected to the fifth gate connection electrode GCE5 through the nineteenth contact hole CT19 penetrating the first interlayer insulating layer 141 and the second interlayer insulating layer 142.

In one or more embodiments, the initialization voltage line VIL may be connected to the second sub-drain electrode D32 and the sixth sub-drain electrode D102 through the first power contact hole VCT1 penetrating the gate insulating layer 130, the first interlayer insulating layer 141, and the second interlayer insulating layer 142. The initialization voltage line VIL may be connected to the tenth sub-drain electrode D162 and the eighteenth drain electrode D18 through the ninth contact hole CT9 penetrating the gate insulating layer 130, the first interlayer insulating layer 141, and the second interlayer insulating layer 142. The initialization voltage line VIL may be connected to the sixth capacitor electrode CE6 through the eighteenth contact hole CT18 penetrating the second interlayer insulating layer 142. The first horizontal power supply line HVDL may be connected to the fifth source electrode S5 and the thirteenth source electrode S13 through the second power contact hole VCT2 penetrating the gate insulating layer 130, the first interlayer insulating layer 141, and the second interlayer insulating layer 142. The gate-off voltage line VGHL may be connected to the eighth source electrode S8 through the seventh contact hole CT7 penetrating the gate insulating layer 130, the first interlayer insulating layer 141, and the second interlayer insulating layer 142. The test signal line TSTL may be connected to the nineteenth gate electrode G19 through the twenty-third contact hole CT23 penetrating the first interlayer insulating layer 141 and the second interlayer insulating layer 142. The third power supply line VSL may be connected to the nineteenth drain electrode D19 through the twenty-fourth contact hole CT24 penetrating the gate insulating layer 130, the first interlayer insulating layer 141, and the second interlayer insulating layer 142.

In one or more embodiments, the first data connection electrode DCE1 may be connected to the second source electrode S2 through the first data contact hole DCT1 penetrating the gate insulating layer 130, the first interlayer insulating layer 141, and the second interlayer insulating layer 142. The second data connection electrode DCE2 may be connected to the ninth source electrode S9 through the third data contact hole DCT3 penetrating the gate insulating layer 130, the first interlayer insulating layer 141, and the second interlayer insulating layer 142.

In one or more embodiments, the first connection electrode CCE1 may be connected to the first gate electrode G1 through the first contact hole CT1 penetrating the first interlayer insulating layer 141 and the second interlayer insulating layer 142, and may be connected to the first sub-source electrode S31 and the fourth sub-drain electrode D42 through the second contact hole CT2 penetrating the gate insulating layer 130, the first interlayer insulating layer 141, and the second interlayer insulating layer 142.

In one or more embodiments, the second connection electrode CCE2 may be connected to the seventeenth drain electrode D17 through the third contact hole CT3 penetrating the gate insulating layer 130, the first interlayer insulating layer 141, and the second interlayer insulating layer 142, may be connected to the fourteenth drain electrode D14 through the fourth contact hole CT4 penetrating the gate insulating layer 130, the first interlayer insulating layer 141, and the second interlayer insulating layer 142, and may be connected to the fourth capacitor electrode CE4 through the fifteenth contact hole CT15 penetrating the second interlayer insulating layer 142.

In one or more embodiments, the third connection electrode CCE3 may be connected to the nineteenth source electrode S19 through the twenty-first contact hole CT21 penetrating the gate insulating layer 130, the first interlayer insulating layer 141, and the second interlayer insulating layer 142 (e.g., see FIG. 18).

In one or more embodiments, the fourth connection electrode CCE4 may be connected to the ninth sub-source electrode S161 through the tenth contact hole CT10 penetrating the gate insulating layer 130, the first interlayer insulating layer 141, and the second interlayer insulating layer 142, and may be connected to the fourth gate connection electrode GCE4 through the seventeenth contact hole CT17 penetrating the first interlayer insulating layer 141 and the second interlayer insulating layer 142.

In one or more embodiments, the fifth connection electrode CCE5 may be connected to the twelfth source electrode S12 and the fourteenth source electrode S14 through the eleventh contact holes CT11 penetrating the gate insulating layer 130, the first interlayer insulating layer 141, and the second interlayer insulating layer 142.

In one or more embodiments, the sixth connection electrode CCE6 may be connected to the eighth gate electrode G8 through the twelfth contact hole CT12 penetrating the first interlayer insulating layer 141 and the second interlayer insulating layer 142, and may be connected to the fifth sub-source electrode S101 and the eighth sub-drain electrode D112 through the thirteenth contact hole CT13 penetrating the gate insulating layer 130, the first interlayer insulating layer 141, and the second interlayer insulating layer 142.

In one or more embodiments, the seventh connection electrode CCE7 may be connected to the seventeenth drain electrode D17 and the eighteenth drain electrode D18 through the sixteenth contact holes CT16 penetrating the gate insulating layer 130, the first interlayer insulating layer 141, and the second interlayer insulating layer 142 (e.g., see FIG. 18).

A first planarization layer 160 may be disposed on the first source metal layer. The first planarization layer 160 may be formed of an organic layer such as acryl resin, epoxy resin, phenolic resin, polyamide resin, polyimide resin and the like. The first planarization layer 160 may be referred to as a fourth insulating layer.

A first inorganic insulating layer 161 may be disposed on the first planarization layer 160. The first inorganic insulating layer 161 may be formed of an inorganic layer, for example, a silicon nitride layer, a silicon oxynitride layer, a silicon oxide layer, a titanium oxide layer, or an aluminum oxide layer. The second interlayer insulating layer 142 may be referred to as a third insulating layer.

In one or more embodiments, the second source metal layer may be disposed on the first inorganic insulating layer 161. The second source metal layer may include the $j^{th}$ data line DLj, the first vertical power supply line VVDL, and the first PAM data line RDL. Further, the second source metal layer may include the first pad connection electrode ANDE1 and the power connection electrode VDCE. The second source metal layer may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

In one or more embodiments, the $j^{th}$ data line DLj may be connected to the first data connection electrode DCE1 through the second data contact hole DCT2 penetrating the first planarization layer 160 and the first inorganic insulating layer 161. The first PAM data line RDL may be connected to the second data connection electrode DCE2 through the fourth data contact hole DCT4 penetrating the first planarization layer 160 and the first inorganic insulating layer 161. The first vertical power supply line VVDL may be connected to the first horizontal power supply line HVDL through a third power contact hole VCT3 passing through the first planarization layer 160 and the first inorganic insulating layer 161. The third power contact hole VCT3 may overlap the second power contact hole VCT2 in the third direction DR3. The area of the third power contact hole VCT3 may be larger than the area of the second power contact hole VCT2.

In one or more embodiments, the first pad connection electrode ANDE1 is connected to the seventh connection electrode CCE7 through the twentieth contact hole CT20 penetrating the first planarization layer 160 and the first inorganic insulating layer 161, and may be connected to the third connection electrode CCE3 through the twenty-second contact hole CT22 penetrating the first planarization layer 160 and the first inorganic insulating layer 161 (e.g., see FIG. 18). The power connection electrode VDCE may be connected to the fifth connection electrode CCE5 through the fourth power contact hole VCT4 penetrating the first planarization layer 160 and the first inorganic insulating layer 161.

A second planarization layer 180 may be disposed on the second source metal layer. The second planarization layer 180 may be formed of an organic layer such as acryl resin, epoxy resin, phenolic resin, polyamide resin, polyimide resin and the like. The second planarization layer 180 may be referred to as a fifth insulating layer.

A second inorganic insulating layer 181 may be disposed on the second planarization layer 180. The second inorganic insulating layer 181 may be formed of an inorganic layer, for example, a silicon nitride layer, a silicon oxynitride layer, a silicon oxide layer, a titanium oxide layer, or an aluminum oxide layer. The second interlayer insulating layer 141 may be referred to as the third insulating layer.

A third source metal layer may be disposed on the second inorganic insulating layer 181. The third source metal layer may include the first power supply line VDL1 and the second pad connection electrode ANDE2. The first power supply line VDL1 may be disposed to cover most of the area of the first sub-pixel RP. The first power supply line VDL1 may be connected to the power connection electrode VDCE through a fifth power contact hole VCT5 penetrating the second planarization layer 180 and the second inorganic insulating layer 181. The second pad connection electrode ANDE2 may be connected to the first pad connection electrode ANDE1 through the twenty-fifth contact hole CT25 penetrating the second planarization layer 180 and the second inorganic insulating layer 181. The third source metal layer may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

A third planarization layer 190 may be disposed on the third source metal layer. The third planarization layer 190 may be formed of an organic layer such as acryl resin, epoxy resin, phenolic resin, polyamide resin, polyimide resin and the like. The third planarization layer 190 may be referred to as a sixth insulating layer.

A third inorganic insulating layer 191 may be disposed on the third planarization layer 190. The third inorganic insulating layer 191 may be formed of an inorganic layer, for example, a silicon nitride layer, a silicon oxynitride layer, a silicon oxide layer, a titanium oxide layer, or an aluminum oxide layer. The second interlayer insulating layer 142 may be referred to as the third insulating layer.

The fourth source metal layer may be disposed on the third inorganic insulating layer 191. The first supplement electrode SPE1 and a second supplement electrode SPE2 may be disposed in the fourth source metal layer. The first supplement electrode SPE1 may overlap the first anode pad electrode APD1 in the third direction DR3, and the second supplement electrode SPE2 may overlap the first cathode pad electrode CPD1 in the third direction DR3.

Conductive bonding between a first electrode AE1 and a second contact electrode CTE2 of the first light emitting element REL and between the second electrode CE1 and a first contact electrode CTE1 of the first light emitting element the first light emitting element REL is disposed, and the first light emitting element REL may be attached to the first contact electrode CTE1 and the second contact electrode CTE2 by pressing the first light emitting element REL. In this case, the first anode pad electrode APD1 and the first cathode pad electrode CPD1 may overlap the plurality of transistors of the first pixel circuit unit PXC1 in order to maximize the area of the transmission area TA. In this case, the third planarization layer 190 and the inorganic insulating layers 191 and 192 supporting the first anode pad electrode APD1 and the first cathode pad electrode CPD1 may collapse due to the pressurization of the first light emitting element REL, and thus at least one of the first anode pad electrode APD1 and the first cathode pad electrode CPD1 may be short-circuited with the first power supply line VDL1. In this case, the first light emitting element REL may not emit light as intended.

The first supplement electrode SPE1 and the second supplement electrode SPE2 serve to support the first anode pad electrode APD1 and the first cathode pad electrode CPD1 when the first light emitting element REL is pressed. Further, the first supplement electrode SPE1 and the second supplement electrode SPE2 are electrically floated. Accordingly, as shown in FIG. 18, even if the first anode pad electrode APD1 is short-circuited with the first supplement electrode SPE1 and the first cathode pad electrode CPD1 is short-circuited with the second supplement electrode SPE2 due to the pressurization of the first light emitting element REL, light emission of the first light emitting element REL may not affected.

In order to increase the force of the first supplement electrode SPE1 and the second supplement electrode SPE2 to support the first anode pad electrode APD1 and the first cathode pad electrode CPD1, the thickness of the first supplement electrode SPE1 and the second supplement electrode SPE2 may be thicker than the thickness of the first anode pad electrode APD1 and the thickness of the first cathode pad electrode CPD1. Also, the thickness of the first supplement electrode SPE1 and the thickness of the second supplement electrode SPE2 may be greater than the thickness of the first anode connection electrode ANDE1 and the thickness of the second anode connection electrode ANDE2.

The fourth source metal layer may be formed as a single layer or multiple layers made of any one of molybdenum (Mo), aluminum (Al), chromium (Cr), gold (Au), titanium (Ti), nickel (Ni), neodymium (Nd), and copper (Cu) or an alloy thereof.

A fourth inorganic insulating layer 192 may be disposed on the fourth source metal layer. The fourth inorganic insulating layer 192 may be formed of an inorganic layer, for example, a silicon nitride layer, a silicon oxynitride layer, a silicon oxide layer, a titanium oxide layer, or an aluminum oxide layer. However, the embodiment of the present specification is not limited thereto, and the fourth inorganic insulating film 192 may be formed of an organic film such as an acrylic resin, an epoxy resin, a phenolic resin, a polyamide resin, and a polyimide resin.

The fifth source metal layer may be disposed on the fourth inorganic insulating layer 192. The fifth source metal layer may include the second power supply line VSL, the first anode pad electrode APD1, and the first cathode pad electrode CPD1. The second power supply line VSL may be connected to the first cathode pad electrode CPD1. That is, the second power supply line VSL and the first cathode pad electrode CPD1 may be integrally formed. The first anode pad electrode APD1 may be connected to the second pad connection electrode ANDE2 through the twenty-sixth contact hole CT26 penetrating the third planarization layer 190, the third inorganic insulating layer 191, and the fourth inorganic insulating layer 192. The fifth source metal layer may be formed as a single layer or multiple layers made of any one of molybdenum (Mo), aluminum (Al), chromium (Cr), gold (Au), titanium (Ti), nickel (Ni), neodymium (Nd), and copper (Cu) or an alloy thereof.

The transparent metal layer may be disposed on the fifth source metal layer. The transparent metal layer may include the first contact electrode CTE1 and the second contact electrode CTE2. The thickness of the first contact electrode CTE1 and the thickness of the second contact electrode CTE2 may be smaller than the thickness of the first anode pad electrode APD1 and the thickness of the first cathode pad electrode CPD1.

The first contact electrode CTE1 may be disposed on the first anode pad electrode APD1, and the second contact electrode CTE2 may be disposed on the first cathode pad electrode CPD1. The first contact electrode CTE1 may be connected to the first electrode of the first light emitting element REL, and the second contact electrode CTE2 may be connected to a second electrode of the first light emitting element REL. The transparent metal layer may be made of a transparent metal material (TCO, Transparent Conductive Material) such as ITO or IZO.

A first passivation layer PAS may be disposed on the transparent metal layer. The first passivation layer PAS may be formed of a silicon nitride layer, a silicon oxynitride layer, a silicon oxide layer, a titanium oxide layer, or an aluminum oxide layer. The first passivation layer PAS may not cover a portion of the upper surface of the transparent metal layer.

In FIG. 18, it was exemplified that a flip-chip type micro LED is that the first electrode AE1 of the first light emitting element RLE faces the second contact electrode CTE2, and the second electrode CE1 of the first light emitting element RLE faces the first contact electrode CTE1. The first light emitting element RLE may be formed of an inorganic material such as GaN. The length of the first light emitting element RLE in the first direction DR1, the second direction DR2, and the third direction DR3 may be each several to several hundred μm. For example, the length of the first light emitting element RLE in the first direction DR1, the second direction DR2, and the third direction DR3 may each have a length of about 100 μm or less.

The first light emitting elements RLE as well as the second light emitting elements GLE, and the third light emitting elements BLE may be grown and formed on a semiconductor substrate such as a silicon wafer. The light emitting elements RLE, GLE, and BLE may be directly transferred from the silicon wafer onto the anode pad electrodes APD1/APD2/APD3 and the cathode pad electrodes CPD1, CPD2, and CPD3 of the substrate SUB. Alternatively, the light emitting elements RLE, GLE, and BLE may be transferred onto the anode pad electrodes APD1/APD2/APD3 and the cathode pad electrodes CPD1, CPD2, and CPD3 of the substrate SUB through an electrostatic method using an electrostatic head or a stamp method using an elastic polymer material such as PDMS or silicon as a transfer substrate.

The first light emitting element RLE may be a light emitting structure including a base substrate SPUB, an n-type semiconductor NSEM, an active layer MQW, a p-type semiconductor PSEM, the first electrode AE1, and a second electrode CE1.

The base substrate SPUB may be a sapphire substrate, but the embodiment of the present specification is not limited thereto.

The n-type semiconductor NSEM may be disposed on one surface of the base substrate SSUB. For example, the n-type semiconductor NSEM may be disposed on the lower surface of the base substrate SPUB. The n-type semiconductor NSEM may be made of GaN doped with an n-type conductivity-type dopant such as Si, Ge, or Sn.

The active layer MQW may be disposed on a portion of one surface of the n-type semiconductor NSEM. The active layer may include a material having a single or multiple quantum well structure. When the active layer contains a material having a multiple quantum well structure, the active layer may have the structure in which a plurality of well layers and barrier layers are alternately laminated. In this case, the well layer may be formed of InGaN, and the barrier layer may be formed of GaN or AlGaN, but is not limited thereto. Alternatively, the active layer may have a structure in which semiconductor materials having large band gap energy and semiconductor materials having small band gap energy are alternately stacked, and may include other Group III to Group V semiconductor materials according to the wavelength band of the emitted light.

The p-type semiconductor PSEM may be disposed on one surface of the active layer MQW. The p-type semiconductor PSEM may be made of GaN doped with a p-type conductivity-type dopant such as Mg, Zn, Ca, Se, or Ba.

The first electrode AE1 may be disposed on the p-type semiconductor PSEM, and the second electrode CE1 may be disposed on another portion of one surface of the n-type semiconductor NSEM. Another portion of one surface of the n-type semiconductor NSEM on which the second electrode CE1 is disposed may be disposed spaced from a portion of one surface of the n-type semiconductor NSEM on which the active layer MQW is disposed.

The first electrode AE1 may be adhered to the second contact electrode CTE1 through a conductive adhesive member such as an anisotropic conductive film ACF or an anisotropic conductive paste ACP. Alternatively, the first electrode AE1 may be adhered to the second contact electrode CTE2 through a soldering process.

The second electrode CE1 may be adhered to the second contact electrode CTE2 through a conductive adhesive member such as an anisotropic conductive film ACF or an anisotropic conductive paste ACP. Alternatively, the second electrode CE2 may be adhered to the second contact electrode CTE2 through a soldering process.

A cross-section of the second sub-pixel GP and a cross-section of the third sub-pixel BP according to one or more embodiments may be substantially the same as a cross-section of the first sub-pixel RP described with reference to FIGS. 17 to 19. Accordingly, a description of the cross-section of the second sub-pixel GP and the cross-section of the third sub-pixel BP according to one or more embodiments will be omitted.

Figure 20:
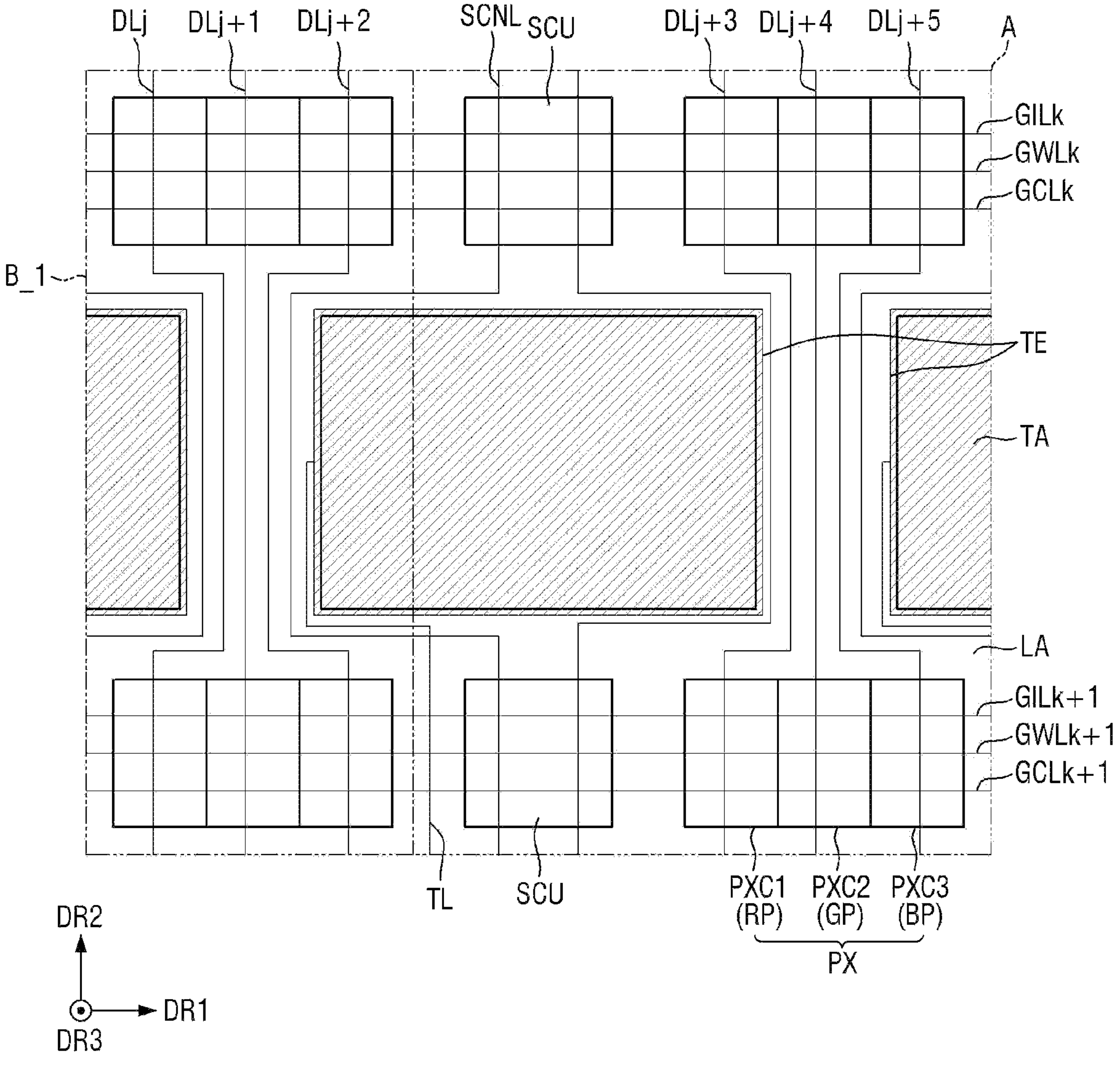
FIG. 20 is an enlarged layout view illustrating an example of the area A of FIG. 1.
Figure 21:
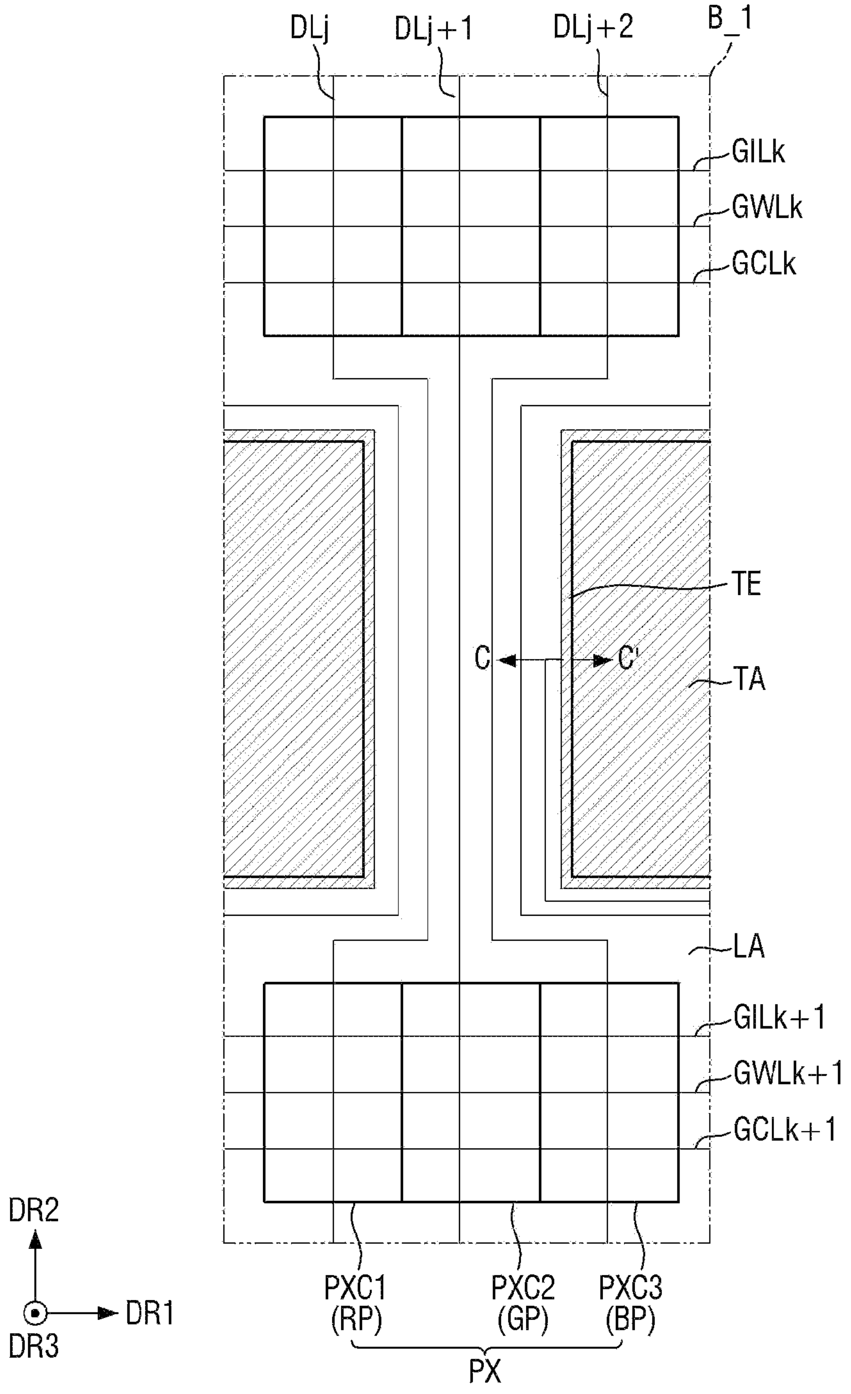
FIG. 21 is an enlarged layout diagram illustrating an example of an area B_1 of FIG. 20.

FIG. 20 is an enlarged layout view illustrating an example of area A of FIG. 1. FIG. 21 is an enlarged layout diagram illustrating an example of an area B_1 of FIG. 20.

The embodiments of FIGS. 20 and 21 are different from the embodiments of FIGS. 2 and 5 in that a touch electrode TE is disposed in the transmission area TA. In FIGS. 20 and 21, descriptions overlapping those of the embodiments of FIGS. 2 and 5 will be omitted.

Referring to 20 and 21, the touch electrode TE may be disposed in the transmission area TA. The touch electrode TE may be made of a transparent metal material such as ITO or IZO in order to reduce or minimize a decrease in light transmittance of the transmission area TA.

The area of the touch electrode TE may be larger than the area of the transmission area TA, but the embodiment of the present specification is not limited thereto. The area of the touch electrode TE may be smaller than the area of the transmission area TA. The touch electrode TE may be connected to a touch line TL in the wiring area LA. In this case, after the self-capacitance of the touch electrode TE is charged through the touch driving signal applied to the touch line TL, the self-capacitance may be driven in a self-capacitance method that detects the amount of change in self-capacitance.

As shown FIGS. 20 and 21, a user's touch may be sensed without using a separate touch panel by forming the touch electrode TE of the transparent metal material in the transmission area TA.

Figure 22:
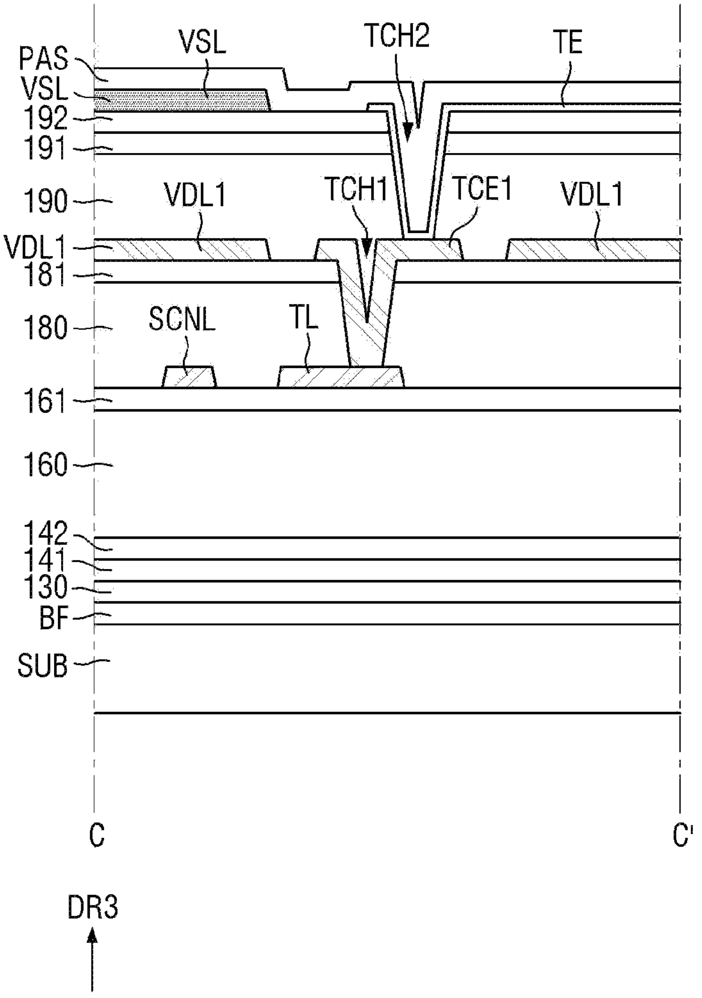
FIG. 22 is a cross-sectional view illustrating an example of a display panel taken along the line C-C' of FIG. 21.

FIG. 22 is a cross-sectional view illustrating an example of the display panel taken along the line C-C' of FIG. 21.

Referring to FIG. 22, the second source metal layer may further include a touch line TL. The touch line TL may be disposed on the first inorganic insulating layer 161. The touch line TL may be made of the same material as the $j^{th}$ data line DLj, the first vertical power supply line VVDL, the first PAM data line RDL, and the scan connection line SCNL.

The third source metal layer may further include a touch connection electrode TCE1. The touch connection electrode TCE1 may be disposed on a second inorganic insulating layer 181. The touch connection electrode TCE1 may be made of the same material as the first power supply line VDL1 and the second pad connection electrode ANDE2. The touch connection electrode TCE1 may be connected to the touch line TL through a first touch contact hole TCH1 penetrating the second planarization layer 180 and the second inorganic insulating layer 181.

The transparent metal layer may further include a touch electrode TE. The touch electrode TE may be disposed on the fourth inorganic insulating layer 192. The touch electrode TE may be formed of the same material as the first and second contact electrodes CTE1 and CTE2. A thickness of the touch electrode TE may be smaller than a thickness of the second power supply line VSL. The touch electrode TE may be connected to the touch connection electrode TCE1 through the second touch contact hole TCH2 penetrating the third planarization layer 190, the third inorganic insulating layer 191, and the fourth inorganic insulating layer 192.

Figure 23:
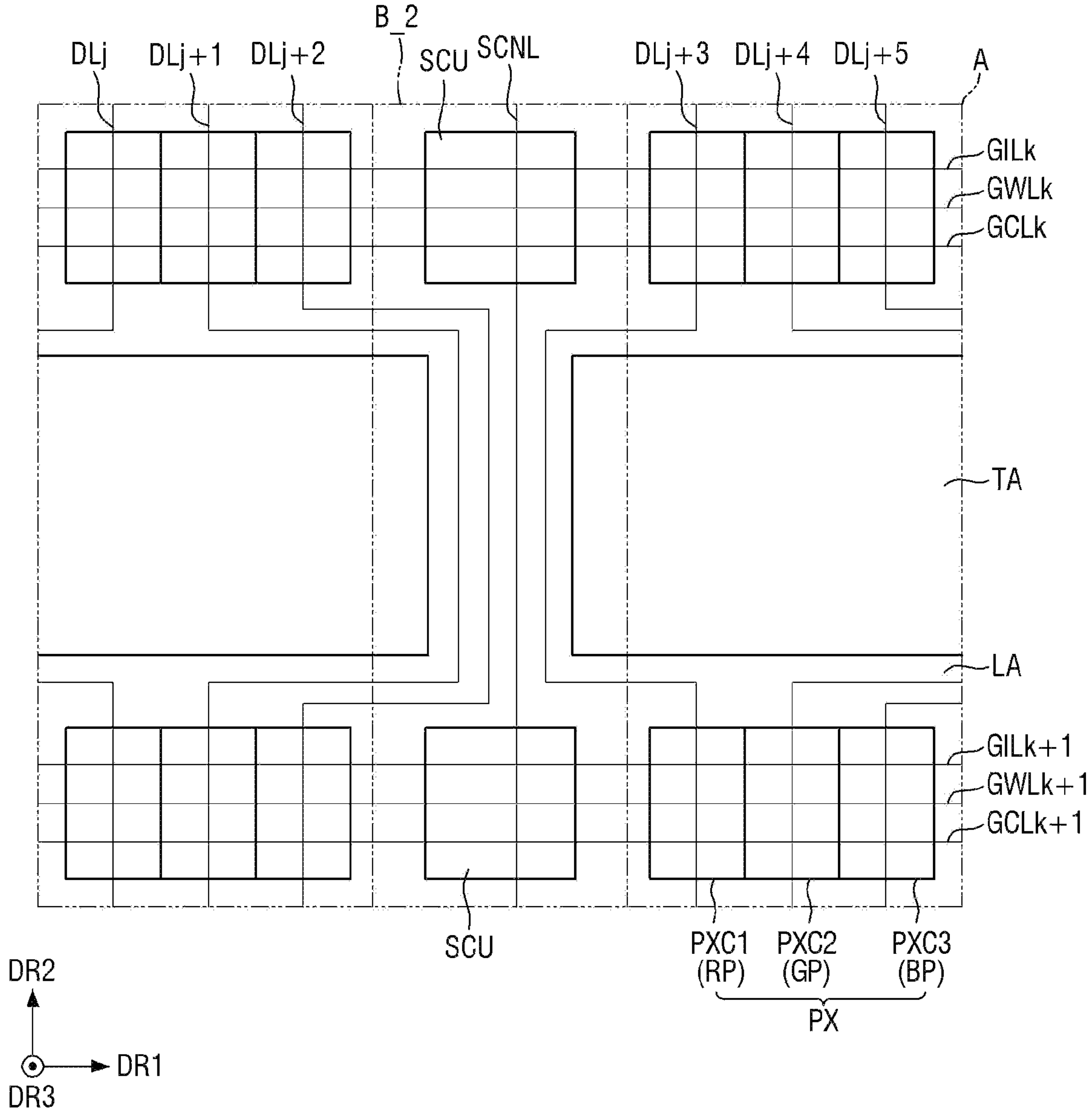
FIG. 23 is an enlarged layout view illustrating an example of the area A of FIG. 1.

FIG. 23 is an enlarged layout view illustrating an example of the area A of FIG. 1.

The embodiment of FIG. 23 is different from the embodiment of FIG. 2 in that the wiring area LA disposed between the transmission areas TA adjacent in the first direction DR1 overlap the scan circuit unit SCU and not the pixels PX in the second direction DR2. Therefore, a description of the embodiment of FIG. 23 will be omitted.

Figure 24:
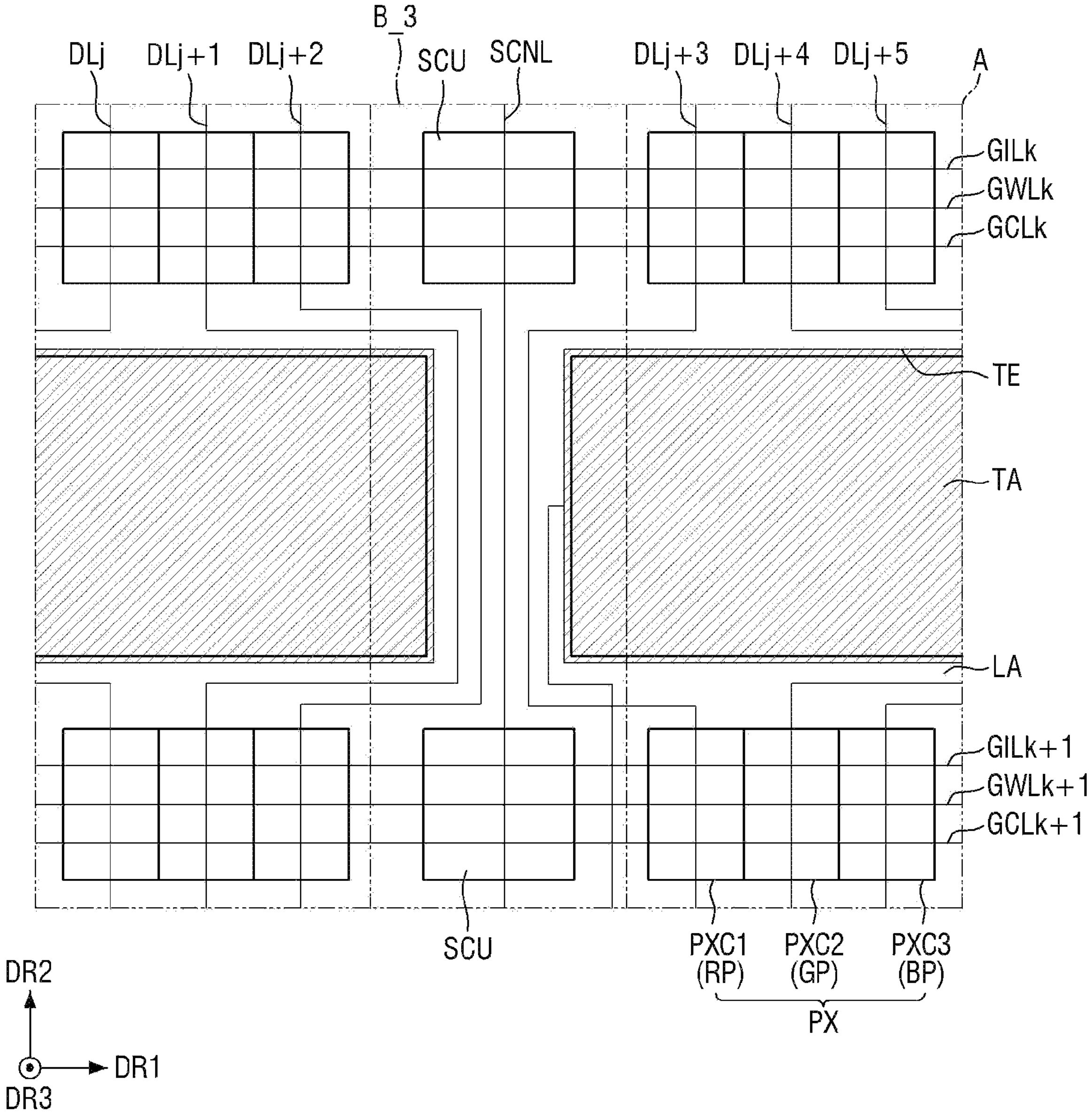
FIG. 24 is an enlarged layout view illustrating an example of the area A of FIG. 1.

FIG. 24 is an enlarged layout view illustrating an example of the area A of FIG. 1.

The embodiment of FIG. 24 is different from the embodiment of FIG. 23 in that the touch electrode TE is disposed in the transmission area TA. Since the touch electrode TE in the embodiment of FIG. 24 is substantially the same as that described with reference to FIGS. 20 to 22, a description of the embodiment of FIG. 24 is omitted.

Figure 25:
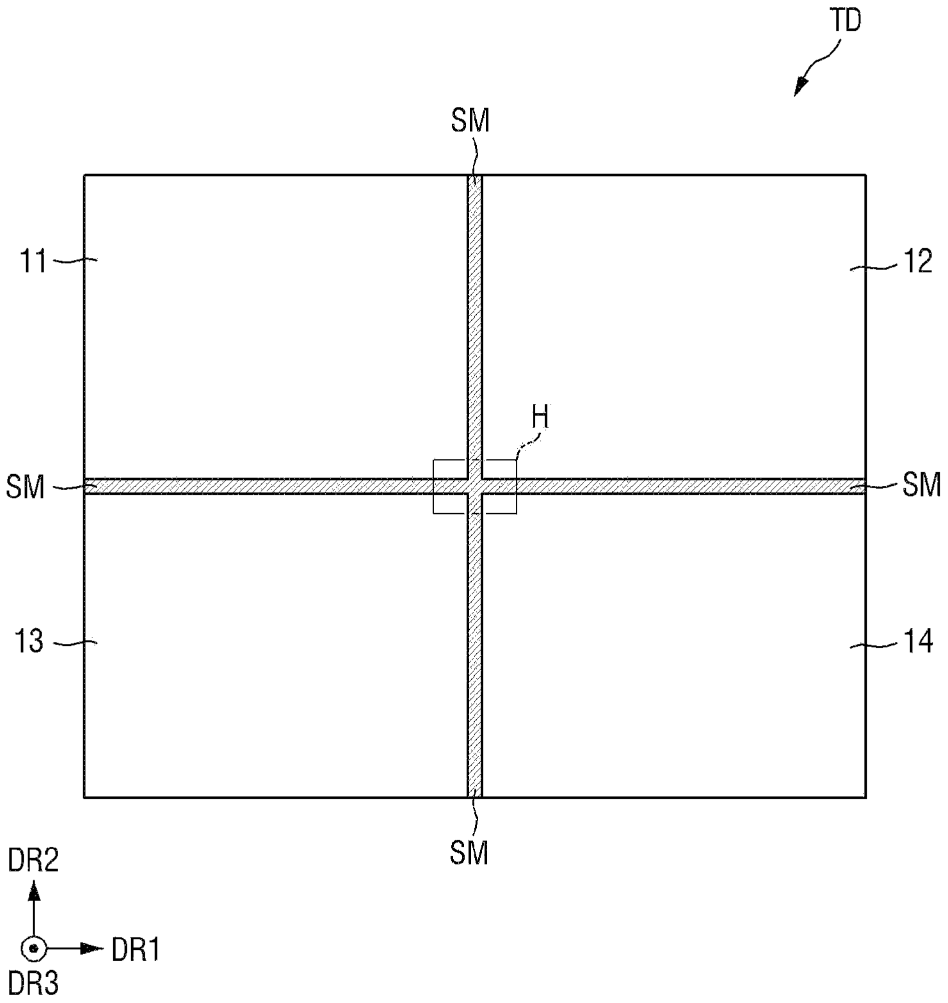
FIG. 25 is a view illustrating a front surface of a tiled display device including a plurality of display devices according to one or more embodiments.

FIG. 25 is an exemplary view illustrating a front surface of a tiled display device including a plurality of display devices according to one or more embodiments.

Referring to FIG. 25, a tiled display device TD may include a plurality of display devices 11, 12, 13, and 14, and a seam SM. For example, the tiled display device TD may include a first display device 11, a second display device 12, a third display device 13, and a fourth display device 14.

The plurality of display devices 11, 12, 13, and 14 may be arranged in a matrix form in M (M is a positive integer) number of rows and N (N is a positive integer) number of columns. For example, the first display device 11 and the second display device 12 may be adjacent to each other in the first direction DR1. The first display device 11 and the third display device 13 may be adjacent to each other in the second direction DR2. The third display device 13 and the fourth display device 14 may be adjacent to each other in the first direction DR1. The second display device 12 and the fourth display device 14 may be adjacent to each other in the second direction DR2.

However, the number and arrangement of the plurality of display devices 11, 12, 13, and 14 in the tiled display device TD are not limited to those illustrated in FIG. 25. The number and arrangement of the display devices 11, 12, 13, and 14 in the tiled display device TD may be determined in response to the size of the display device 10 and the tiled display device TD, and the shape of the tiled display device TD.

The plurality of display devices 11, 12, 13, and 14 may have the same size as each other, but embodiments of the present disclosure are not limited thereto. For example, the plurality of display devices 11, 12, 13, and 14 may have different sizes.

Each of the plurality of display devices 11, 12, 13, and 14 may have a rectangular shape including long sides and short sides. The plurality of display devices 11, 12, 13, and 14 may be disposed such that the long sides or the short sides thereof are connected to each other. Some or all of the plurality of display devices 11, 12, 13, and 14 may be disposed at the edge of the tiled display device TD, and may be disposed one side of the tiled display device TD. At least one of the plurality of display devices 11, 12, 13, and 14 may be disposed at least one corner of the tiled display device TD, and may be formed two adjacent sides of the tiled display device TD. At least one of the plurality of display devices 11, 12, 13, and 14 may be surrounded by other display devices.

Each of the plurality of display devices 11, 12, 13, and 14 may be substantially the same as the display device 100 described with reference to FIG. 1. Therefore, a description of each of the plurality of display devices 11, 12, 13, and 14 will be omitted.

The seam SM may include a coupling member or an adhesive member. In this case, the plurality of display devices 11, 12, 13, and 14 may be connected to each other by the coupling member or the adhesive member of the seam SM. The seam SM may be disposed between the first display device 11 and the second display device 12, between the first display device 11 and the third display device 13, between the second display device 12 and the fourth display device 14, and between the third display device 13 and the fourth display device 14.

Figure 26:
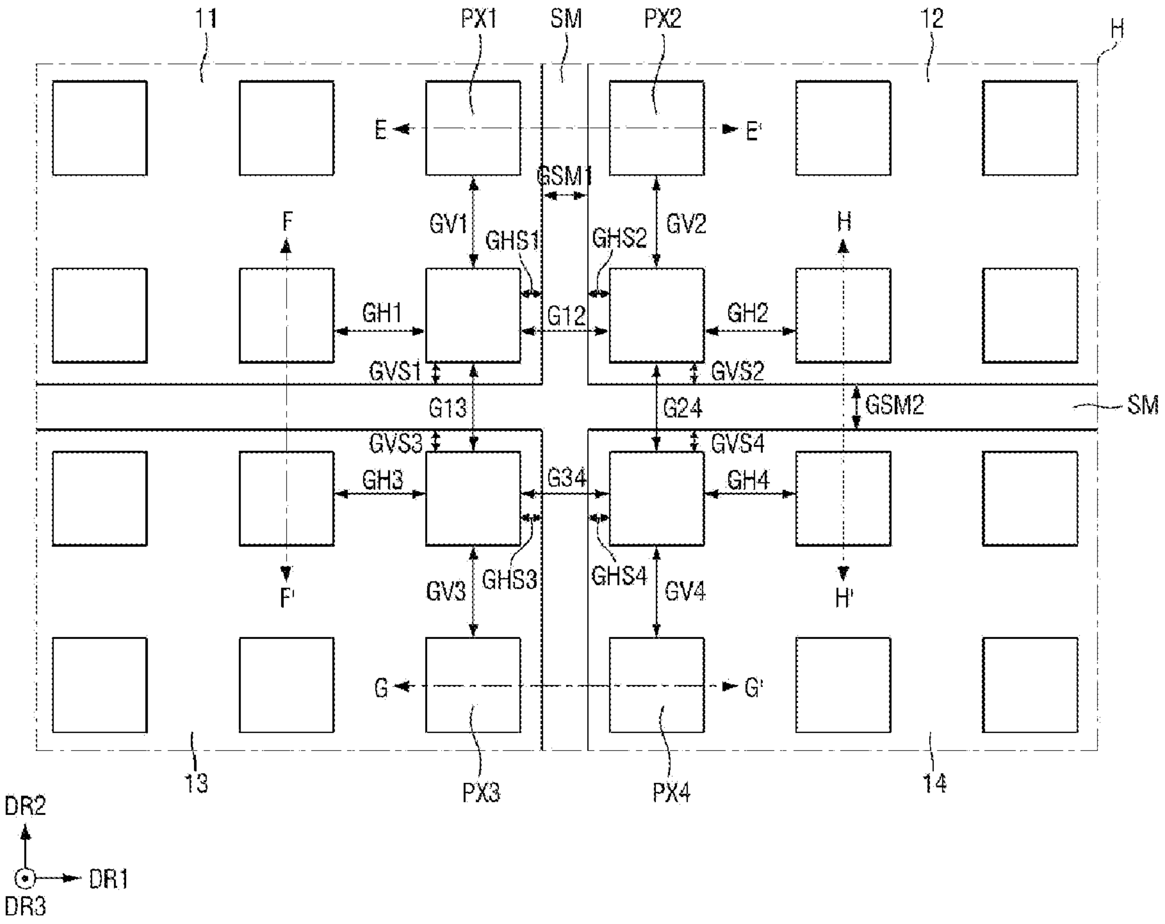
FIG. 26 is an enlarged layout view showing an area H of FIG. 25 in detail.

FIG. 26 is an enlarged layout view showing an area H of FIG. 25 in detail.

Referring to FIG. 26, the seam SM may have a planar shape of a cross, or a plus sign in a central area of the device TD in which the first display device 11, the second display device 12, the third display device 13, and the fourth display device 14 are adjacent to each other. The seam SM may be disposed between the first display device 11 and the second display device 12, between the first display device 11 and the third display device 13, between the second display device 12 and the fourth display device 14, and between the third display device 13 and the fourth display device 14.

The first display device 11 may include first pixels PX1 arranged in a matrix form along the first direction DR1 and the second direction DR2 to display an image. The second display device 12 may include second pixels PX2 arranged in a matrix along the first direction DR1 and the second direction DR2 to display an image. The third display device 13 may include third pixels PX3 arranged in a matrix along the first direction DR1 and the second direction DR2 to display an image. The fourth display device 14 may include fourth pixels PX4 arranged in a matrix along the first direction DR1 and the second direction DR2 to display an image.

A minimum distance between the first pixels PX1 adjacent in the first direction DR1 may be defined as a first horizontal separation distance GH1, and a minimum distance between the second pixels PX2 adjacent in the first direction DR1 may be defined as a second horizontal separation distance GH2. The first horizontal separation distance GH1 and the second horizontal separation distance GH2 may be substantially the same.

The seam SM may be disposed between the first pixel PX1 and the second pixel PX2 adjacent in the first direction DR1. A minimum distance G12 between the first pixels PX1 and the second pixels PX2 adjacent in the first direction DR1 may be the sum of the minimum distance GHS1 between the first pixel PX1 and the seam SM in the first direction DR1, the minimum distance GHS2 between the second pixel PX2 and the seam SM in the first direction DR1 and a width GSM1 of the seam SM in the first direction DR1.

The minimum distance G12 between the first pixel PX1 and the second pixel PX2 adjacent in the first direction DR1, the first horizontal separation distance GH1, and the second horizontal separation distance GH2 may be substantially the same. To this end, the minimum distance GHS1 between the first pixel PX1 and the seam SM in the first direction DR1 may be smaller than the first horizontal separation distance GH1, and the minimum distance GHS2 between the second pixel PX2 and the seam SM in the first direction DR1 may be smaller than the second horizontal separation distance GH2. Further, the width GSM1 of the seam SM in the first direction DR1 may be smaller than the first horizontal separation distance GH1 or the second horizontal separation distance GH2.

A minimum distance between the third pixels PX3 adjacent in the first direction DR1 may be defined as a third horizontal separation distance GH3, and a minimum distance between the fourth pixels PX4 adjacent in the first direction DR1 may be defined as a fourth horizontal separation distance GH4. The third horizontal separation distance GH3 and the fourth horizontal separation distance GH4 may be substantially the same.

The seam SM may be disposed between the third pixel PX3 and the fourth pixel PX4 adjacent in the first direction DR1. A minimum distance G34 between the third pixel PX3 and the fourth pixel PX4 adjacent in the first direction DR1 may be the sum of a minimum distance GHS3 between the third pixel PX3 and the seam SM in the first direction DR1, a minimum distance GHS4 between the fourth pixel PX4 and the seam SM in the second direction DR1, and the width GSM1 of the seam SM in the second direction DR1.

The minimum distance G34 between the third pixel PX3 and the fourth pixel PX4 adjacent in the first direction DR1, the third horizontal separation distance GH3, and the fourth horizontal separation distance GH4 may be substantially the same. To this end, the minimum distance GHS3 between the third pixel PX3 and the seam SM in the first direction DR1 may be smaller than the third horizontal separation distance GH3, and the minimum distance GHS4 between the fourth pixel PX4 and the seam SM in the first direction DR1 may be smaller than the fourth horizontal separation distance GH4. Further, in the first direction DR1, the width GSM1 of the seam SM may be smaller than the third horizontal separation distance GH3 or the fourth horizontal separation distance GH4.

The minimum distance between the first pixels PX1 adjacent in the second direction DR2 may be defined as a first vertical separation distance GV1, and the minimum distance between the third pixels PX3 adjacent in the first direction DR2 may be defined as a third vertical separation distance GV3. The first vertical separation distance GV1 and the third vertical separation distance GV3 may be substantially the same.

The seam SM may be disposed between the first pixel PX1 and the third pixel PX3 adjacent in the first direction DR2. A minimum distance G13 between the first pixel PX1 and the third pixel PX3 adjacent in the first direction DR2 may be the sum of a minimum distance GVS1 between the first pixel PX1 and the seam SM in the second direction DR2, the minimum distance GVS3 between the third pixel PX3 and the seam SM in the second direction DR2, and a width GSM2 of the seam SM in the second direction DR2.

The minimum distance G13 between the first pixel PX1 and the third pixel PX3 adjacent in the second direction DR2, the first vertical separation distance GV1, and the third vertical separation distance GV3 may be substantially the same. To this end, the minimum distance GVS1 between the first pixel PX1 and the seam SM in the second direction DR2 may be smaller than the first vertical separation distance GV1, and the minimum distance GVS3 between the third pixel PX3 and the seam SM in the second direction DR2 may be smaller than the third vertical separation distance GV3. Further, in the second direction DR2, the width GSM2 of the seam SM may be smaller than the first vertical separation distance GV1 or the third vertical separation distance GV3.

The minimum distance between the adjacent second pixels PX2 in the second direction DR2 may be defined as a second vertical separation distance GV2, and the minimum distance between the fourth pixels PX4 adjacent in the second direction DR2 may be defined as a fourth vertical separation distance GV4. The second vertical separation distance GV2 and the fourth vertical separation distance GV4 may be substantially the same.

The seam SM may be disposed between the second pixel PX2 and the fourth pixel PX4 adjacent in the second direction DR2. The minimum distance G24 between the second pixel PX2 and the fourth pixel PX4 adjacent in the second direction DR2 may be the sum of the minimum distance GVS2 between the second pixel PX2 and the seam SM in the second direction DR2, the minimum distance GVS4 between the fourth pixel PX4 and the joint SM in the second direction DR2, and the distance GSM2 of the seam SM in the second direction DR2.

A minimum distance G24 between the second pixel PX2 and the fourth pixel PX4 adjacent in the second direction DR2, a second vertical separation distance GV2, and a fourth vertical separation distance GV4 may be substantially the same. To this end, a minimum distance GVS2 between the second pixel PX2 and the seam SM in the second direction DR2 may be smaller than the second vertical separation distance GV2, and a minimum distance GVS4 between the fourth pixel PX4 and the seam SM in the second direction DR2 may be smaller than the fourth vertical separation distance GV4. Further, in the first direction DR2, the width GSM2 of the seam SM may be smaller than the second vertical separation distance GV2 or the fourth vertical separation distance GV4.

As shown FIGS. 26, in order to prevent the seam SM from being recognized between images displayed by the plurality of display devices 11, 12, 13, and 14, the minimum distance between pixels of adjacent display devices may be substantially equal to the minimum distance between each of the pixels.

Figure 27:
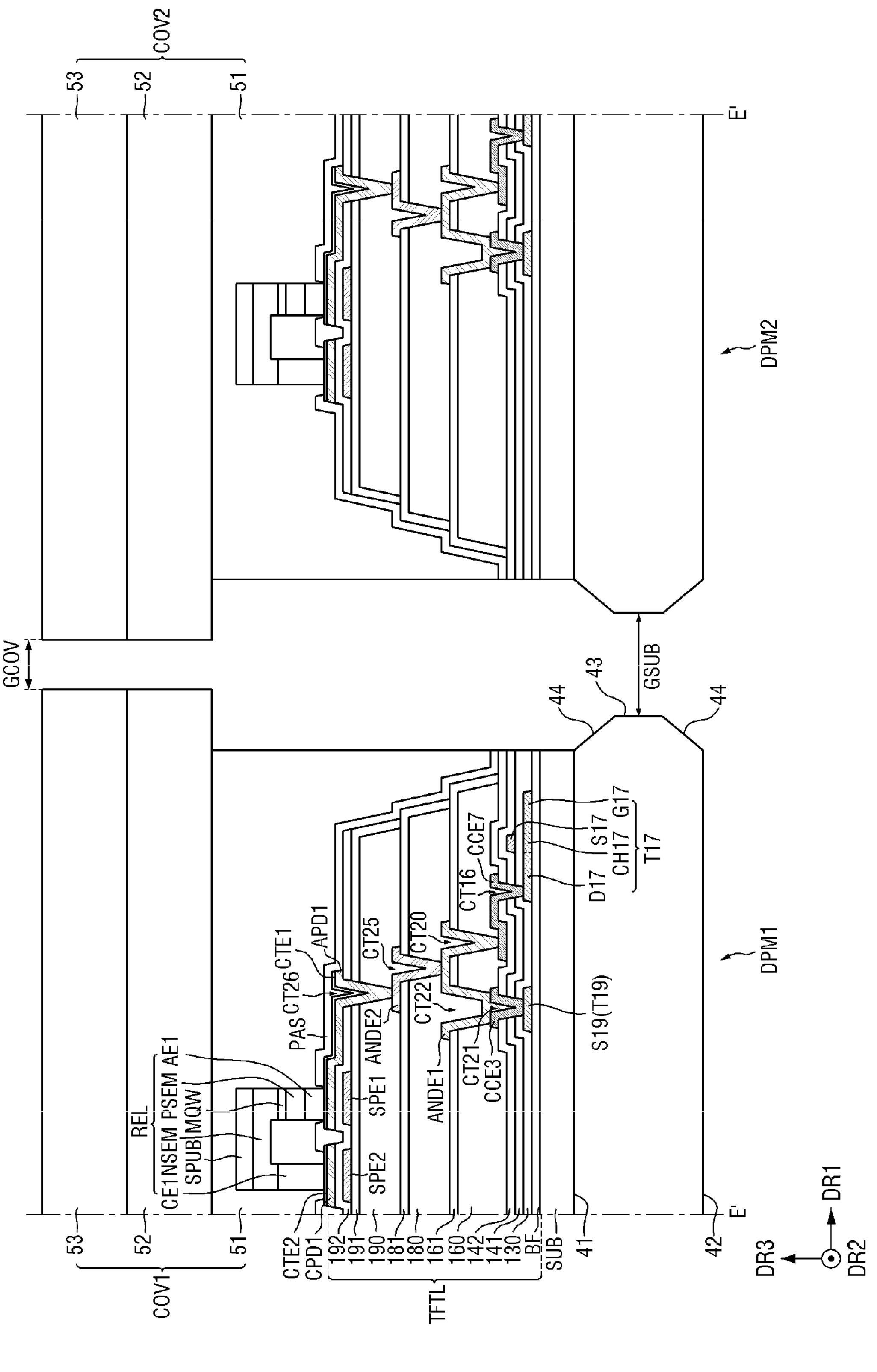
FIG. 27 is a cross-sectional view illustrating an example of a tiled display device taken along the line E-E' of FIG. 26.

FIG. 27 is a cross-sectional view illustrating an example of a tiled display device taken along the line E-E' of FIG. 26.

Referring to FIG. 27, the first display device 11 includes a first display module DPM1 and a first front cover COV1. The second display device 12 includes a second display module DPM2 and a second front cover COV2.

Each of the first display module DPM1 and the second display module DPM2 includes the substrate SUB, a thin film transistor layer TFTL, and the light emitting element layer EML. The thin film transistor layer TFTL and the light emitting element layer EML have already been described in detail with reference to FIGS. 17 to 19. In FIG. 27, a description overlapping with the embodiment of FIGS. 17 to 19 will be omitted.

The substrate SUB may include a first surface 41 on which the thin film transistor layer TFTL is disposed, a second surface 42 opposite the first surface 41, and a first side surface 43 disposed between the first surface 41 and the second surface 42. The first surface 41 may be a front surface or an upper surface of the substrate SUB, and the second surface 42 may be a rear surface or a lower surface of the substrate SUB.

In addition, the substrate SUB may further include a chamfer surface 44 disposed between the first surface 41 and the first side surface 43 and between the second surface 42 and the first side surface 43. The thin film transistor layer TFTL and the light emitting element layer EML may not be disposed on the chamfer surface 44. Due to the chamfer surface 44, it is possible to prevent damage from the collision of the substrate SUB of the first display device 10 and the substrate of the second display device 10.

The chamfer surface 44 may be disposed between each of the other side surfaces except the first surface 41 and the first side surface 43 and each of the other side surfaces except the second surface 42 and the first side surface 43. For example, when the first display device 11 and the second display device 12 have a rectangular planar shape as shown in FIG. 25, the substrate SUB may be disposed between the first surface 41 and each of a second side surface, a third side surface, and a fourth side surface of the substrate SUB and between the second surface 42 and each of the second side surface, the third side surface, and the fourth side surface.

The first front cover COV1 may be disposed on the chamfer surface 44 of the substrate SUB. That is, the first front cover COV1 may protrude more than the substrate SUB in the first direction DR1 and the second direction DR2. Therefore, a distance GSUB between the substrate SUB of the first display device 11 and the substrate SUB of the second display device 12 may be greater than a distance GCOV between the first front cover COV1 and the second front cover COV2.

Each of the first front cover COV1 and the second front cover COV2 may include an adhesive member 51, a light transmittance control layer 52 disposed on the adhesive member 51, and an anti-glare layer 53 disposed on the light transmittance control layer 52.

The adhesive member 51 of the first front cover COV1 serves to attach the light emitting element layer EML (REL) of the first display module DPM1 to the first front cover COV1. The adhesive member 51 of the second front cover COV2 serves to attach a light emitting element layer EML of the second display module DPM2 to the second front cover COV2. The adhesive member 51 may be a transparent adhesive member capable of transmitting light. For example, the adhesive member 51 may be an optically clear adhesive film or an optically clear resin.

The anti-glare layer 53 may be designed to diffusely reflect external light to prevent deterioration of image visibility by reflecting external light as it is. Accordingly, the contrast ratio of images displayed by the first display device 10 and the second display device 20 may be increased due to the anti-glare layer 53.

The light transmittance control layer 52 may be designed to reduce transmittance of external light or light reflected from the first display module DPM1 and the second display module DPM2. Accordingly, a gap GSUB between the substrate SUB of the first display module DPM1 and the substrate SUB of the second display module DPM2 may be prevented from being visually recognized from the outside.

The anti-glare layer 53 may be implemented as a polarizing plate, and the light transmittance adjusting layer 52 may be implemented as a phase delay layer, but the embodiment of the present specification is not limited thereto.

Because an example of a tiled display device cut along the lines F-F', G-G', and H-H' of FIG. 26 is substantially the same as an example of a tiled display device cut along E-E' described in connection with FIG. 27, a description thereof will be omitted.

Figure 28:
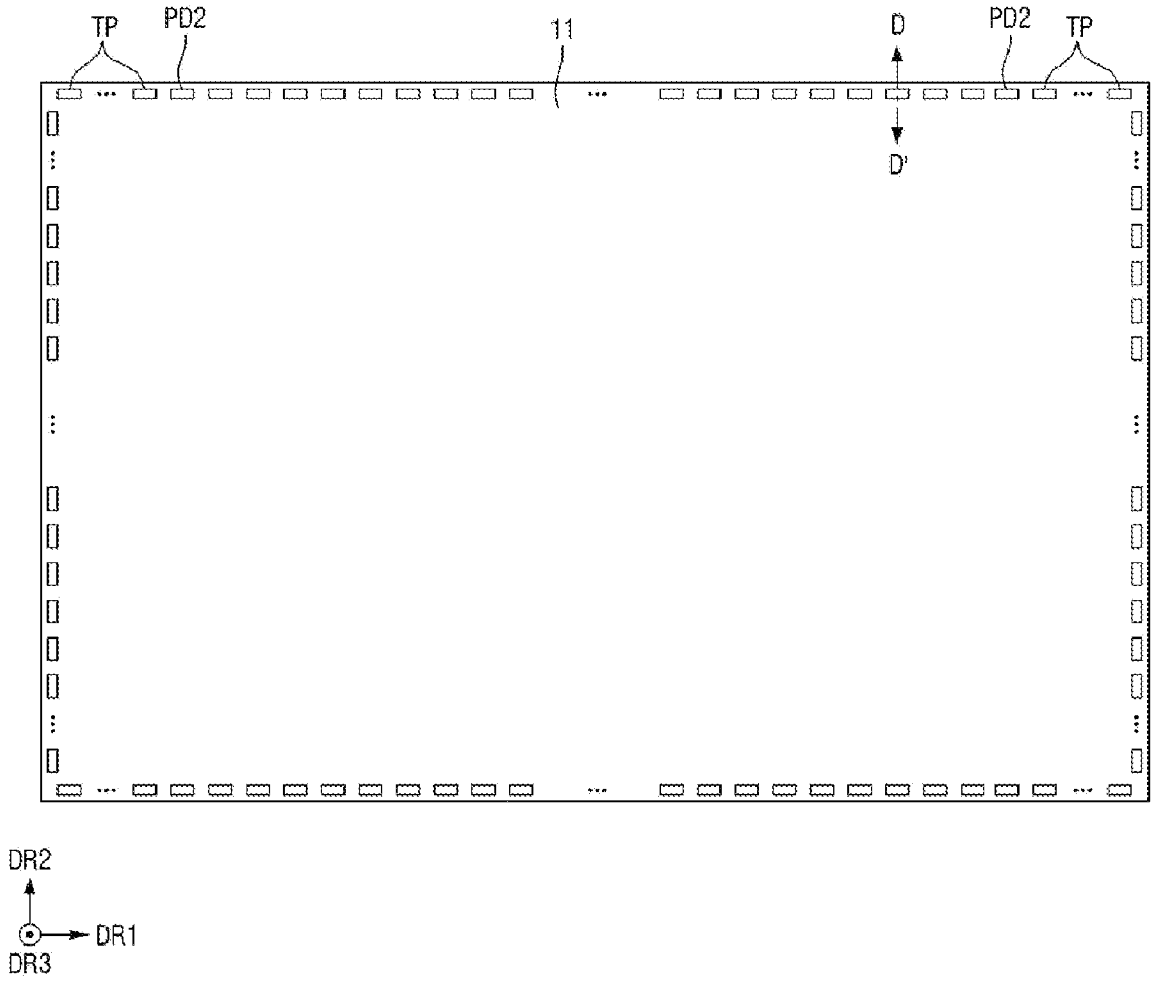
FIG. 28 is a view illustrating a rear surface of a first display device according to one or more embodiments.
Figure 29:
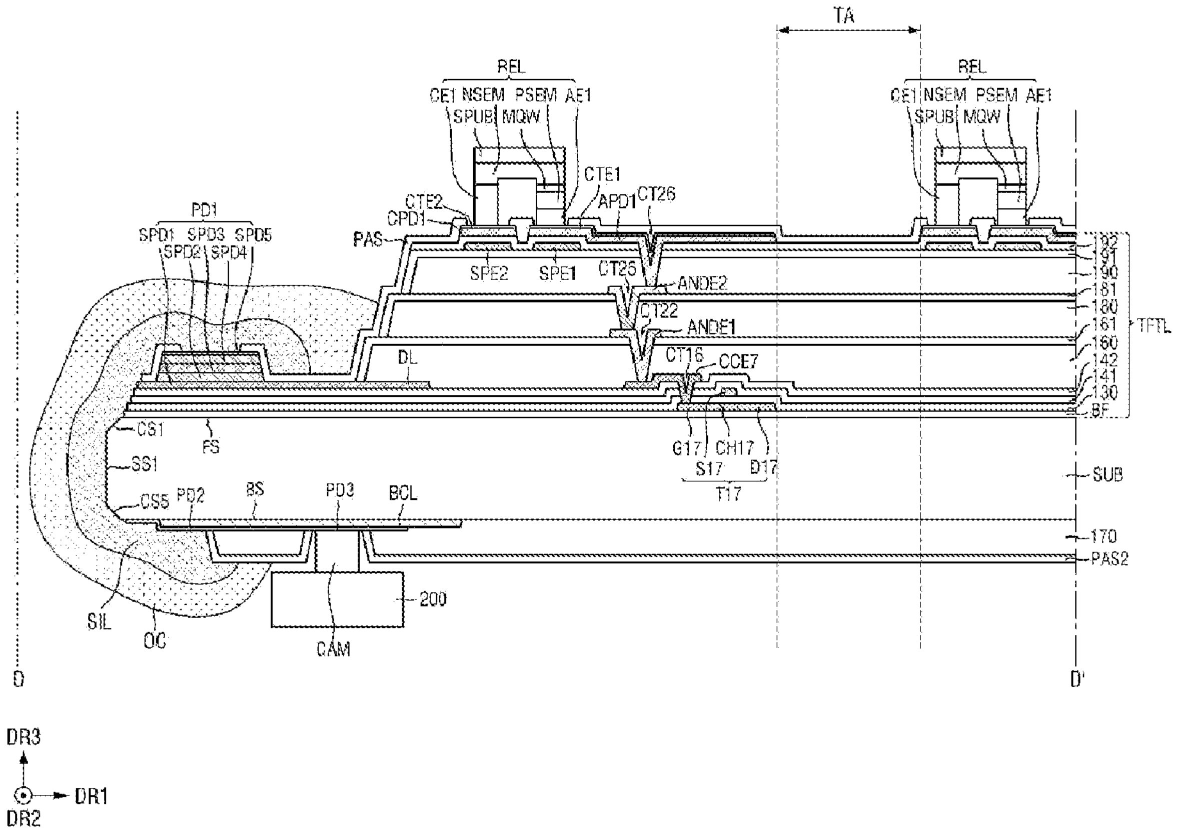
FIG. 29 is a cross-sectional view illustrating an example of a tiled display device taken along the line D-D' of FIG. 28.

FIG. 28 is a view illustrating a rear surface of a first display device according to one or more embodiments. FIG. 29 is a cross-sectional view illustrating an example of a tiled display device taken along the line D-D' of FIG. 28.

In FIG. 28, second pads PD2 and a touch pads TP are disposed on the rear surface of the first display device for convenience of description.

Referring to FIGS. 28 and 29, the first pads PD1 may be front pads disposed on a first surface FS corresponding to the front surface of the substrate SUB. The first pads PD1 may be disposed at an edge of the first surface FS of the substrate SUB.

The second pads PD2, the third pads PD3, and the touch pads TP may be rear pads disposed on a second surface BS corresponding to the rear surface of the substrate SUB. The second pads PD2 may be disposed at an edge of the second surface BS of the substrate SUB. The touch pads TP may be disposed closer to the edge of the substrate SUB than the second pads PD2.

The first pad PD1 may include the first to fifth sub pads SPD1, SPD2, SPD3, SPD4, and SPD5. The first source metal layer may further include a first sub pad SPD1, the second source metal layer may further include a second sub pad SPD2, the third source metal layer may further include a third sub pad SPD3, the fifth source metal layer may further include a fourth sub pad SPD4, and the transparent metal layer may further include a fifth sub pad SPD5.

The second sub pad SPD2 may be disposed on the first sub pad SPD1, and the third sub pad SPD3 may be disposed on the second sub pad SPD2. The fourth sub pad SPD4 may be disposed on the third sub pad SPD3, and the fifth sub pad SPD5 may be disposed on the fourth sub pad SPD4. An upper surface of the first sub pad SPD1 may contact a lower surface of the second sub pad SPD2, and an upper surface of the second sub pad SPD2 may contact a lower surface of the third sub pad SPD3. An upper surface of the third sub pad SPD3 may contact a lower surface of the fourth sub pad SPD4, and an upper surface of the fourth sub pad SPD4 may contact a lower surface of the fifth sub pad SPD5.

The bottom connection line BCL may be disposed on the rear surface of the substrate SUB. The bottom connection line BCL may be formed as a single layer or multiple layers made of any one of molybdenum (Mo), aluminum (Al), chromium (Cr), gold (Au), titanium (Ti), nickel (Ni), neodymium (Nd), and copper (Cu) or an alloy thereof.

The second pad PD2 may be disposed at one end of the bottom connection line BCL, and the third pad PD3 may be disposed at the other end of the bottom connection line BCL. The second pad PD2 and the third pad PD3 may be formed of a transparent conductive oxide such as indium tin oxide ITO and indium zinc oxide IZO.

The fourth planarization layer 170 may be disposed on the back surface of the connection line BCL and the substrate SUB. The fourth planarization film 170 is formed of an organic film such as acrylic resin, epoxy resin, phenolic resin, polyamide resin, polyimide resin, etc. The fourth planarization layer 170 may be referred to as an organic insulating layer.

The second passivation layer PAS2 may be disposed on the fourth planarization layer 170. The second passivation layer PAS2 may be formed of an inorganic layer, for example, a silicon nitride layer, a silicon oxynitride layer, a silicon oxide layer, a titanium oxide layer, or an aluminum oxide layer.

A side line SIL may be disposed on the first surface FS, a first chamfered surface CS1, a first side SS1, a fifth chamfered surface CS5, and the second surface BS of the substrate SUB. The side line SIL may be connected to the first pad PD1 disposed on the first pad PD1 disposed on the edge of the first surface FS of the substrate SUB. The side line SIL may be connected to the second pad PD2 disposed on the second pad PD2 disposed on the edge of the second surface BS of the substrate SUB. The side line SIL may contact the first chamfered surface CS1, the first side SS1, and the fifth chamfered surface CS5 of the substrate SUB.

The overcoat layer OC may be disposed on the first surface FS, the first chamfered surface CS1, the first side surface SS1, the fifth chamfered surface CS5, and the second surface BS of the substrate SUB. The overcoat layer OC may be formed to cover the side line SIL. The overcoat layer (OC) may be formed of an organic film such as acryl resin, epoxy resin, phenolic resin, polyamide resin, polyimide resin, etc.

The circuit board 200 may be disposed on the rear surface of the substrate SUB. The circuit board 200 may be connected to the exposed third pad PD3 without being covered by the fourth planarization layer 170 and the second passivation layer PAS2 using the conductive adhesive member CAM. The circuit board 200 may be connected to the third pad PD3 through the conductive adhesive member CAM. The conductive adhesive member CAM may be an anisotropic conductive film or an anisotropic conductive paste.

The circuit board 200 may not be disposed so as not to cover the transmission areas TA. Accordingly, when the display panel 100 does not display an image, the background or object of the rear surface of the display panel 100 may be viewed through the light transmissive areas TA. That is, the display device 10 may be implemented as a transparent display device.

Figure 30:
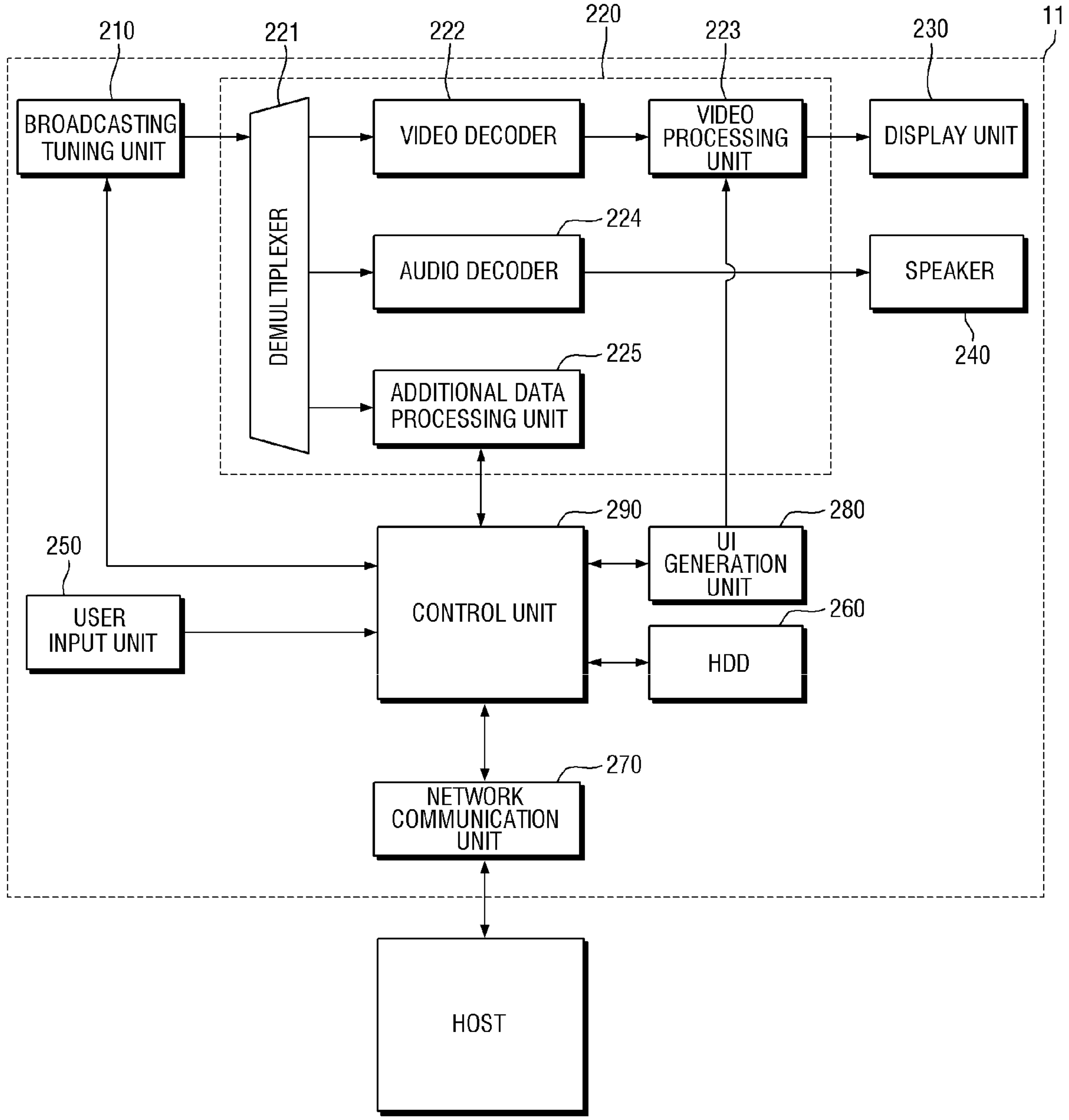
FIG. 30 is a block diagram illustrating a tiled display device according to one or more embodiments.

FIG. 30 is a block diagram illustrating a tiled display device according to one or more embodiments.

In FIG. 30, the first display device 11 and a host system HOST are illustrated for convenience of description.

Referring to FIG. 30, the tiled display device TD according to one or more embodiments may include the host system HOST, a broadcast tuning unit 210, a signal processing unit 220, a display unit 230, a speaker 240, and a user input unit 250, an HDD 260, a network communication unit 270, a UI generating unit 280, and a control unit 290.

The host system HOST may be implemented as any one of a television system, a home theater system, a set-top box, a navigation system, a DVD player, a Blu-ray player, a personal computer PC, a mobile phone system, and a tablet.

A user's command may be input to the host system HOST in various formats. For example, the host system HOST may receive a command by a user's touch input. Alternatively, a user's command may be input to the host system HOST by a keyboard input or a button input of a remote controller.

The host system HOST may receive an original video data corresponding to the original image from the outside. The host system HOST may divide the original video data by the number of display devices. For example, the host system HOST corresponds to the first display device 11, the second display device 12, the third display device 13, and the fourth display device 14, so that the original video data may be divided into the first video data corresponding to the first image, the second video data corresponding to the second image, the third video data corresponding to the third image, and the fourth video data corresponding to the fourth image. The host system HOST may transmit the first video data to the first display device 11, the second video data to the second display device 12, the third video data to the third display device 13, and the fourth video data to the fourth display device 14.

The first display device 11 may display the first image according to the first video data, and the second display device 12 may display the second image according to the second video data. Also, the third display device 13 may display the third image according to the third video data, and the fourth display device 14 may display the fourth image according to the fourth video data. Accordingly, a user may view the original image in which the first to the fourth images displayed on the first to fourth display devices 11, 12, 13 and 14 are combined.

The first display device 11 may include a broadcast tuning unit 210, a signal processing unit 220, a display unit 230, a speaker 240, a user input unit 250, an HDD 260, a network communication unit 270, a UI, a generator 280, and a controller 290.

The broadcast tuning unit 210 may receive a broadcast signal of the corresponding channel through an antenna by tuning a predetermined channel frequency under the control of the controller 290. The broadcast tuning unit 210 may include a channel detection module and an RF demodulation module.

The broadcast signal demodulated by the broadcast tuning unit 210 is processed by the signal processing unit 220 and output to the display unit 230 and the speaker 240 via the signal processing unit 220. Here, the signal processing unit 220 may include a demultiplexer 221, a video decoder 222, a video processing unit 223, an audio decoder 224, and an additional data processing unit 225.

The demultiplexer 221 separates the demodulated broadcast signal into a video signal, an audio signal, and additional data. The separated video signal, audio signal, and additional data are restored by the video decoder 222, the audio decoder 224, and the additional data processing unit 225, respectively. In this case, the video decoder 222, the audio decoder 224, and the additional data processing unit 225 restore a decoding format corresponding to the encoding format when the broadcast signal is transmitted.

In one or more embodiments, the decoded video signal is converted by the video processing unit 223 into vertical frequency, resolution, aspect ratio, etc. that meet the output standard of the display unit 230, and the decoded audio signal is output to the speaker 240.

The display unit 230 includes a display panel 100 on which an image is displayed and a panel driver controlling driving of the display panel 100.

The user input unit 250 may receive a signal transmitted by the host system HOST. The user input unit 250 allows the user to select not only data related to channel selection and User Interface (UI) menu selection and manipulation of a channel transmitted by the host system HOST, but also commands related to communication with other display devices 12 to 14. Also, the user input unit 250 allows data for input to be entered.

The storage unit 260 stores various software programs including OS programs, recorded broadcast programs, moving pictures, photos, and other data, and may be made of a storage medium such as a hard disk or non-volatile memory.

The network communication unit 270 is for short-distance communication with the host system HOST and other display devices 12 to 14. The network communication unit 270 may be implemented a communication module including an antenna pattern that may implement mobile communication, data communication, Bluetooth, RF, Ethernet, etc.

The network communication unit 270 may transmit and receive a radio signal with at least one of a base station, an external terminal, and a server on a mobile communication network constructed according to technical standards or communication methods (e.g., Global System for Mobile communication (GSM), Code Division Multi Access (CDMA), Code Division Multi Access 2000 (CDMA2000), Enhanced Voice-Data Optimized or Enhanced Voice-Data Only (EV-DO), Wideband CDMA (WCDMA), High Speed Downlink Packet Access (HSDPA), High Speed Uplink Packet Access (HSUPA), Long Term Evolution (LTE), Long Term Evolution-Advanced (LTE-A), 5G, etc.) for mobile communication through an antenna pattern to be described later.

The network communication unit 270 may transmit and receive a wireless signal in a communication network according to wireless Internet technologies through an antenna pattern to be described later. As wireless Internet technology, for example, WLAN (Wireless LAN), Wi-Fi (Wireless-Fidelity), Wi-Fi (Wireless Fidelity) Direct, DLNA (Digital Living Network Alliance), WiBro (Wireless Broadband), WiMAX (World Interoperability for Microwave Access), High Speed Downlink Packet Access (HSDPA), High Speed Uplink Packet Access (HSUPA), Long Term Evolution (LTE), Long Term Evolution-Advanced (LTE-A), etc., and the antenna pattern transmits and receives data according to at least one wireless Internet technology within a range including Internet technologies not listed above.

The user interface (UI) generator 280 generates a UI menu for communication with the host system (HOST) and other display devices 12 to 14, and may be implemented by an algorithm code and an OSD IC. The UI menu for communication with the host system HOST and other display devices 12 to 14 may be a menu for designating a counterpart digital TV for communication and selecting a desired function.

The control unit 290 is responsible for overall control of the first display device 11 and responsible for communication control of the host system HOST and the second through fourth display devices 12 through 14. In the control unit 290, a corresponding algorithm code stores for control and the corresponding algorithm code may be implemented by a Micro Controller Unit (MCU).

According to the input and selection of the user input unit 250, the control unit 290 controls to transmit the corresponding control command and data to the host system HOST and the second to fourth display devices 12, 13, and 14 through the network communication unit 270. When a predetermined control command and data are received from the host system HOST and the second to fourth display devices 12, 13, and 14, the control unit 290 performs an operation according to the control command.

What is claimed is:

1. A display device comprising:

a wiring area at which a plurality of scan lines extending in a first direction and a plurality of data lines extending in a second direction crossing the first direction are located;

a transmissive area surrounded by the wiring area and configured to transmit light;

a plurality of pixel drivers respectively connected to one of the plurality of scan lines and one of the plurality of data lines;

a first pad electrode and a second pad electrode overlapping a first pixel driver from among the plurality of pixel drivers;

a light emitting element on the first pad electrode and the second pad electrode;

a first supplement electrode overlapping the first pad electrode; and a second supplement electrode overlapping the second pad electrode, wherein each of the first supplement electrode and the second supplement electrode is electrically floated.

2. The display device of claim 1, further comprising an insulating layer located between the first pad electrode and the first supplement electrode and between the second pad electrode and the second supplement electrode.

3. The display device of claim 1, wherein a thickness of the first supplement electrode is greater than a thickness of the first pad electrode, and a thickness of the second supplement electrode is greater than a thickness of the second pad electrode.

4. The display device of claim 1, further comprising a touch electrode in the transmission area and configured to transmit the light.

5. The display device of claim 4, further comprising:

a first contact electrode between the first pad electrode and a first electrode of the light emitting element; and a second contact electrode between the second pad electrode and a second electrode of the light emitting element, wherein the touch electrode comprises a same material as that of the first and second contact electrodes.

6. The display device of claim 1, wherein a first power supply line configured to receive a first power voltage overlaps the plurality of pixel drivers and the wiring area.

7. The display device of claim 6, wherein a second power supply line configured to receive a second power voltage different from the first power voltage overlaps the plurality of pixel drivers and the wiring area.

8. The display device of claim 7, wherein the first power supply line and the second power supply line surround the transmissive area.

9. The display device of claim 1, further comprising:

third power supply lines extending in the second direction and configured to receive a third power voltage; and a power bridge connecting a third power supply line overlapping the first pixel driver from among the third power supply lines and a third power supply line overlapping a second pixel driver of the plurality of pixel drivers from among the third power supply lines.

10. The display device of claim 9, wherein the power bridge overlaps a first data line connected to the first pixel driver or a second data line connected to the second pixel driver from among the plurality of data lines.

11. The display device of claim 1, wherein the light emitting element is a flip chip type micro light emitting diode element.

12. A display device comprising:

a wiring area at which a plurality of scan lines extending in a first direction and a plurality of data lines extending in a second direction crossing the first direction are located;

a transmissive area surrounded by the wiring area and configured to transmit light;

a plurality of pixel drivers respectively connected to one of the plurality of scan lines and one of the plurality of data lines;

a first pad electrode and a second pad electrode connected to a pixel driver of the plurality of pixel drivers;

a light emitting element on the first pad electrode and the second pad electrode;

a touch electrode in the transmission area and configured to transmit the light, a first contact electrode between the first pad electrode and a first electrode of the light emitting element; and a second contact electrode between the second pad electrode and a second electrode of the light emitting element, wherein the touch electrode comprises a same material as that of the first and second contact electrodes.

13. The display device of claim 12, further comprising a touch line in the wiring area and electrically connected to the touch electrode.

14. The display device of claim 13, further comprising a touch connection electrode connected to the touch line through a first touch contact hole penetrating at least one first insulating layer on the touch line, wherein the touch electrode is connected to the touch connection electrode through a second touch contact hole penetrating at least one second insulating layer on the touch connection electrode.

15. The display device of claim 12, wherein the first pad electrode and the second pad electrode overlap the pixel driver.

16. The display device of claim 15, further comprising:

a first supplement electrode overlapping the first pad electrode; and a second supplement electrode overlapping the second pad electrode.

17. The display device of claim 16, wherein a thickness of the first supplement electrode is greater than a thickness of the first pad electrode, and a thickness of the second supplement electrode is greater than a thickness of the second pad electrode.

18. The display device of claim 16, wherein each of the first supplement electrode and the second supplement electrode is electrically floated.

19. The display device of claim 12, wherein the light emitting element is a flip chip type micro light emitting diode element.

20. A tiled display device comprising:

a plurality of display devices; and a connection member located between the plurality of display devices, wherein a display device from among the plurality of display devices comprises:

a wiring area at which scan lines extending in a first direction and data lines extending in a second direction crossing the first direction are located;

a transmissive area surrounded by the wiring area and configured to transmit light;

a pixel driver connected to one of the scan lines and one of the data lines;

a first pad electrode and a second pad electrode overlapping the pixel driver;

a light emitting element on the first pad electrode and the second pad electrode;

a first supplement electrode overlapping the first pad electrode; and a second supplement electrode overlapping the second pad electrode, and wherein the display device further comprises:

a substrate;

a pad on a first surface of the substrate; and a side line on the first surface of the substrate, a second surface opposite to the first surface, and one side between the first surface and the second surface, and connected to the pad.

21. The tiled display device of claim 20, wherein the light emitting element is a flip chip type micro light emitting diode element.

22. The tiled display device of claim 20, wherein the substrate comprises glass.

23. The tiled display device of claim 20, wherein the display device further comprises:

a connection line on the second surface of the substrate; and a flexible film connected to the connection line through a conductive adhesive member, wherein the side line is connected to the connection line.

24. The tiled display device of claim 20, wherein the plurality of display devices are arranged in a matrix in M (M is a positive integer) number of rows and N (N is a positive integer) number of columns.

25. The display device of claim 20, wherein the first supplement electrode contacts the first pad electrode, and the second supplement electrode contacts the second pad electrode.

* * * * *